(12) United States Patent
Shiba et al.

(10) Patent No.: US 8,189,377 B2
(45) Date of Patent: May 29, 2012

(54) SEMICONDUCTOR DEVICE

(75) Inventors: Kazuyoshi Shiba, Tokyo (JP); Yasushi Oka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/034,698

(22) Filed: Feb. 24, 2011

(65) Prior Publication Data

US 2011/0147819 A1 Jun. 23, 2011

Related U.S. Application Data

(63) Continuation of application No. 12/603,332, filed on Oct. 21, 2009, now Pat. No. 7,940,561, which is a continuation of application No. 11/743,515, filed on May 2, 2007, now Pat. No. 7,623,371.

(30) Foreign Application Priority Data

Jun. 22, 2006 (JP) ................................ 2006-172115

(51) Int. Cl.
*G11C 11/34* (2006.01)
*G11C 16/04* (2006.01)

(52) U.S. Cl. ......... 365/185.01; 365/185.26; 365/185.28; 365/185.29; 257/316

(58) Field of Classification Search ............. 365/185.01, 365/185.26, 185.28, 185.29; 257/298, 315, 257/316

See application file for complete search history.

(56) References Cited

U.S. PATENT DOCUMENTS

| 6,423,584 | B2 * | 7/2002 | Takahashi et al. ............ 438/152 |
| 6,545,311 | B2 | 4/2003 | Shukuri et al. |
| 6,788,574 | B1 | 9/2004 | Han et al. |
| 6,815,759 | B2 | 11/2004 | Horiguchi et al. |
| 7,313,026 | B2 | 12/2007 | Shiba et al. |
| 7,326,994 | B2 | 2/2008 | Hsu et al. |
| 7,388,777 | B2 | 6/2008 | Shiba et al. |
| 7,405,971 | B2 * | 7/2008 | Shukuri et al. ........... 365/185.05 |
| 7,423,909 | B2 | 9/2008 | Shinozaki et al. |
| 7,460,396 | B2 | 12/2008 | Oka et al. |
| 7,612,402 | B2 | 11/2009 | Shiba |
| 7,678,649 | B2 | 3/2010 | Shiba |
| 2006/0050566 | A1 | 3/2006 | Shiba et al. |
| 2006/0170035 | A1 * | 8/2006 | Shiba et al. ................... 257/326 |
| 2006/0186463 | A1 | 8/2006 | Sasago et al. |

FOREIGN PATENT DOCUMENTS

| JP | 2006-80247 A | 3/2006 |
| WO | WO 2005/101519 A1 | 10/2005 |

* cited by examiner

*Primary Examiner* — Tuan T Nguyen
*Assistant Examiner* — Toan Le
(74) *Attorney, Agent, or Firm* — Miles & Stockbridge P.C.

(57) ABSTRACT p-type wells are provided within an n-type embedded well of a semiconductor substrate lying in an area for forming a flash memory, in a state of being isolated from one another. A capacitance section, a data write/erase charge injection/discharge section and a data read MIS•FET are disposed in each of the p-type wells. The capacitance section is disposed between the data write/erase charge injection/discharge section and the data read MIS•FET. In the data write/erase charge injection/discharge section, writing and erasing of data by an FN tunnel current at a channel entire surface are performed.

6 Claims, 54 Drawing Sheets

SEMICONDUCTOR DEVICE

CROSS-REFERENCE TO RELATED APPLICATIONS

This application is a continuation of application Ser. No. 12/603,332 filed Oct. 21, 2009, now U.S. Pat. No. 7,940,561, which is a continuation of application Ser. No. 11/743,515 filed May 2, 2007 (now U.S. Pat. No. 7,623,371). This application also claims priority from Japanese Patent Application No. 2006-172115 filed on Jun. 22, 2006, the disclosure of which, including the specification, drawings, and abstract is incorporated herein by reference in its entirety.

BACKGROUND OF THE INVENTION

The present invention relates to a semiconductor device technique, and particularly to a technique effective when applied to a semiconductor device having a nonvolatile memory circuit section.

Of semiconductor devices, there is known one that has thereinside a nonvolatile memory circuit section for storing relatively small-capacity information such as information used upon trimming, relief and image adjustments of an LCD (Liquid Crystal Device), information about the production number of a semiconductor device, etc.

This semiconductor device having the nonvolatile memory circuit section has been described in, for example, Japanese Unexamined Patent Publication No. 2006-80247 (refer to a patent document 1). The following configuration of nonvolatile memory cell has been disclosed in the patent document 1. A floating gate electrode for storing an electric charge that contributes to storage of information is disposed in a main surface of a semiconductor substrate. The floating gate electrode has a portion relatively broad in width and a portion relatively narrow in width. The relatively broad portion of the floating gate electrode forms an electrode for a capacitive element. Part of the relatively narrow portion of the floating gate electrode serves as a gate electrode of an information write field effect transistor. Other part of the relatively narrow portion of the floating gate electrode serves as a gate electrode of an information read field effect transistor.

Further, a configuration in which a capacitance section, a write transistor and a read transistor are isolated by n wells, has been disclosed in, for example, FIG. 7 of U.S. Pat. No. 6,788,574 (patent document 2). A configuration in which write/erase is performed by an FN tunnel current has been disclosed in FIGS. 4A through 4C and columns 6-7 in the patent document 2.

SUMMARY OF THE INVENTION

However, there has recently been a tendency that the memory capacity of the nonvolatile memory circuit section provided in the semiconductor device also increases. Therefore, an important problem is how to reduce the occupied area of the nonvolatile memory circuit section while larger memory capacity is being ensured, in such a manner that the area of laying out the nonvolatile memory circuit section does not bring pressure to bear on the area of laying out a main circuit.

Thus, an object of the present invention is to provide a technique capable of reducing the area of a nonvolatile memory circuit section provided in a semiconductor device.

The above, other objects and novel features of the present invention will become apparent from the description of the present specification and the accompanying drawings.

A summary of a typical or representative one of the inventions disclosed in the present application will briefly be explained as follows:

The present invention provides a nonvolatile memory cell having a data read transistor, a capacitive element and a data write/erase element. In the nonvolatile memory cell, the data read transistor and the data write/erase element are disposed away from each other by the capacitive element disposed therebetween. A first electrode of the capacitive element, a second electrode of the data read transistor and a third electrode of the data write/erase element are constituted of part of a common floating gate electrode extending along the direction in which the data read transistor, the capacitive element and the data write/erase element are arranged. The second electrode of the data read transistor and the third electrode of the data write/erase element are spaced away from each other by the first electrode of the capacitive element disposed therebetween.

Advantageous effects obtained by a representative one of the inventions disclosed in the present application will be described briefly as follows:

In a nonvolatile memory cell having a data read transistor, a capacitive element and a data write/erase element, the data read transistor and the data write/erase element are disposed away from each other by the capacitive element disposed therebetween. A first electrode of the capacitive element, a second electrode of the data read transistor and a third electrode of the data write/erase element are constituted of part of a common floating gate electrode extending along the direction in which the data read transistor, the capacitive element and the data write/erase element are arranged. The second electrode of the data read transistor and the third electrode of the data write/erase element are spaced away from each other by the first electrode of the capacitive element disposed therebetween. Thus, the area of a nonvolatile memory circuit section provided in a semiconductor device can be reduced.

DETAILED DESCRIPTION OF THE PREFERRED EMBODIMENTS

Figure 1:
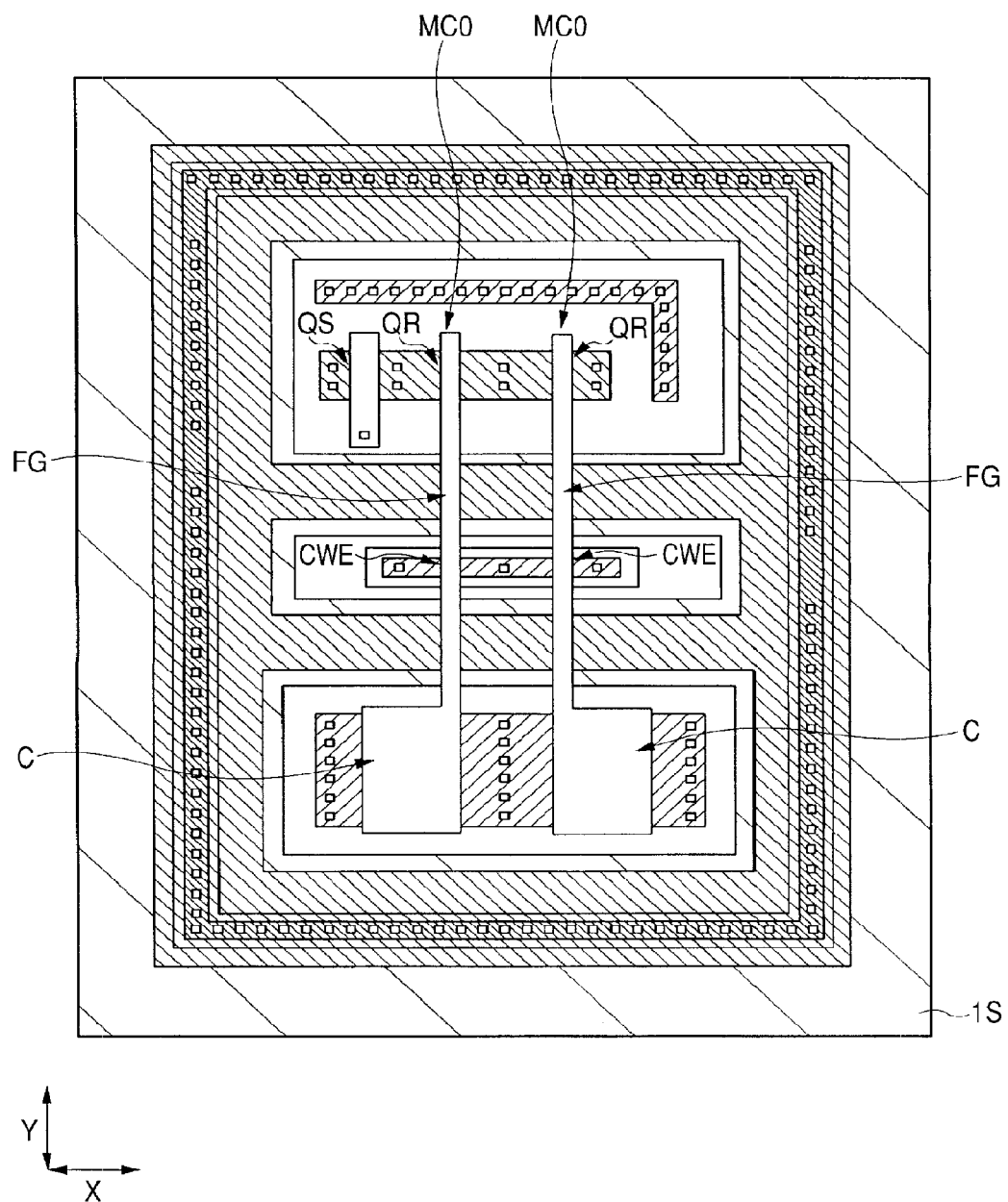
FIG. 1 is a fragmentary plan view showing memory cells corresponding to one bit of a flash memory for a semiconductor device discussed by the present inventors.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical Values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range. Constituent elements each having the same function in all the drawings for describing the present embodiments are respectively given the same reference numerals, and their repetitive explanations will therefore be omitted where possible. Preferred embodiments of the present invention will hereinafter be described in detail with reference to the accompanying drawings.

First Preferred Embodiment

FIG. 1 shows a plan view of memory cells MC0 corresponding to one bit of a flash memory suitable for a semiconductor device discussed by the present inventors. Incidentally, although FIG. 1 is a plan view, parts thereof are hatched to make it easy to see the drawing. A symbol Y is a first direction and indicates the direction in which local data lines extend. A symbol X is a second direction orthogonal to the first direction Y and indicates the direction in which word lines extend.

In the present configuration, the two memory cells MC0 are arranged for one bit (one bit/two cell configuration). One selection MIS•FET (Metal Insulator Semiconductor Field Effect Transistor) QS is arranged for one bit. Each of the memory cells MC0 has a data read MIS•FETQR that shares a floating gate electrode FG, a data write/erase charge injection/discharge part or section CWE and a capacitance part or section C. The data read MIS•FETQR, the data write/erase charge injection/discharge section CWE and the capacitance section C are arranged side by side in order from top to bottom as viewed in FIG. 1.

Figure 2:
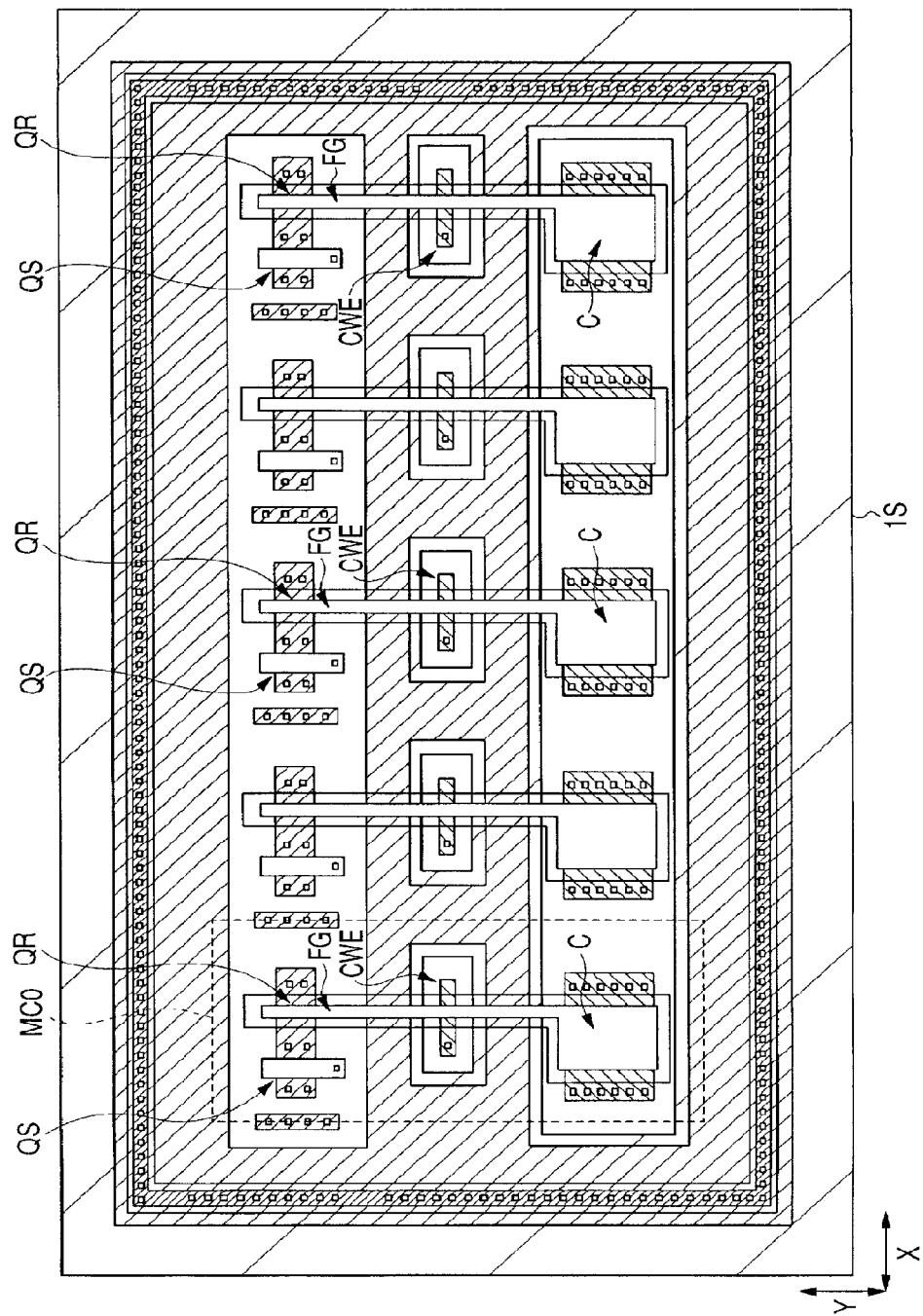
FIG. 2 is a plan view of a memory cell array where the memory cells shown in FIG. 1 are respectively brought to a one bit/one cell configuration.

FIG. 2 shows a plan view of a memory cell array where the memory cells MC0 shown in FIG. 1 are arranged in a one bit/one cell configuration. Incidentally, although FIG. 2 is a plan view, parts thereof are hatched to make it easy to see the drawing.

The memory cells MC0 are arranged side by side in plural form along the second direction X. Each memory cell MC has a data read MIS•FETQR, a data write/erase charge injection/discharge section CWE, a capacitance section C and a selection MIS•FETQS. The order of laying out the data read MIS•FETQR, data write/erase charge injection/discharge section CWE and capacitance section C is the same as FIG. 1.

Here, it is considered that a reduction in the area of the memory cell array results from the sharing of respective semiconductor regions for the data read MIS•FETQR and capacitance sections C of the memory cells MC0 adjacent to each other.

When, however, the distance between the adjacent memory cells MC0 is shortened so as to make sharing of the respective semiconductor regions for the data read MIS•FETQR and capacitance sections C of the adjoining memory cells MC0 under the configurations of the memory cells MC0 shown in FIG. 1, semiconductor regions for the charge injection/discharge sections CWE, which need isolation where the one bit/one cell configuration is formed by the memory cells MC0 shown in FIG. 1, also overlap each other.

Therefore, when the one bit/one cell configuration is formed by the memory cells MC0 shown in FIG. 1, the respective semiconductor regions for the data read MIS•FETQR and capacitance sections C of the memory cells MC0 adjacent to each other cannot be shared. Accordingly, a problem arises in that the memory cells MC0 adjacent to each other should be separated from each other and the reduction in the area of the memory cell array is impaired.

The semiconductor device according to the first embodiment will next be explained. The semiconductor device according to the present embodiment includes a main circuit and a flash memory (nonvolatile memory circuit section) that stores relatively small-capacity desired information related to the main circuit, both of which are formed in the same semiconductor chip.

As the main circuit, for example, an LCD (Liquid Crystal Device) driver circuit is formed. In this case, the desired information includes, for example, layout address information about each effective memory cell (defect-free memory cell) and each effective LCD element used upon relief of an LCD, adjustment voltage trimming tap information used upon an LCD image adjustment, digital information about each variable resistor, etc. An external source supplied from outside the semiconductor device (semiconductor chip) is used as a single power supply. A source voltage of the single power supply is 3.3V or so, for example.

However, the main circuit is not limited to the LCD driver circuit and can be changed in various ways. As the main circuit, there are known a memory circuit such as a DRAM (Dynamic Random Access Memory), an SRAM (Static RAM) or the like, a logical circuit such as a CPU (Central Processing Unit), an MPU (Micro Processing Unit) or the like, a mixed circuit of these memory circuits and logical circuits, etc.

The desired information is not limited to the above and can be changed in various ways. As the desired information, there are known, for example, layout address information about effective (used) elements used upon trimming in the semiconductor chip, information about effective memory cells (defect-free memory cells) used upon relief of the memory circuit, trimming information for setting variations of an internal frequency oscillator to within a desired range, information about a management code for each semiconductor device, information about the production number of the semiconductor device, etc.

Figure 3:
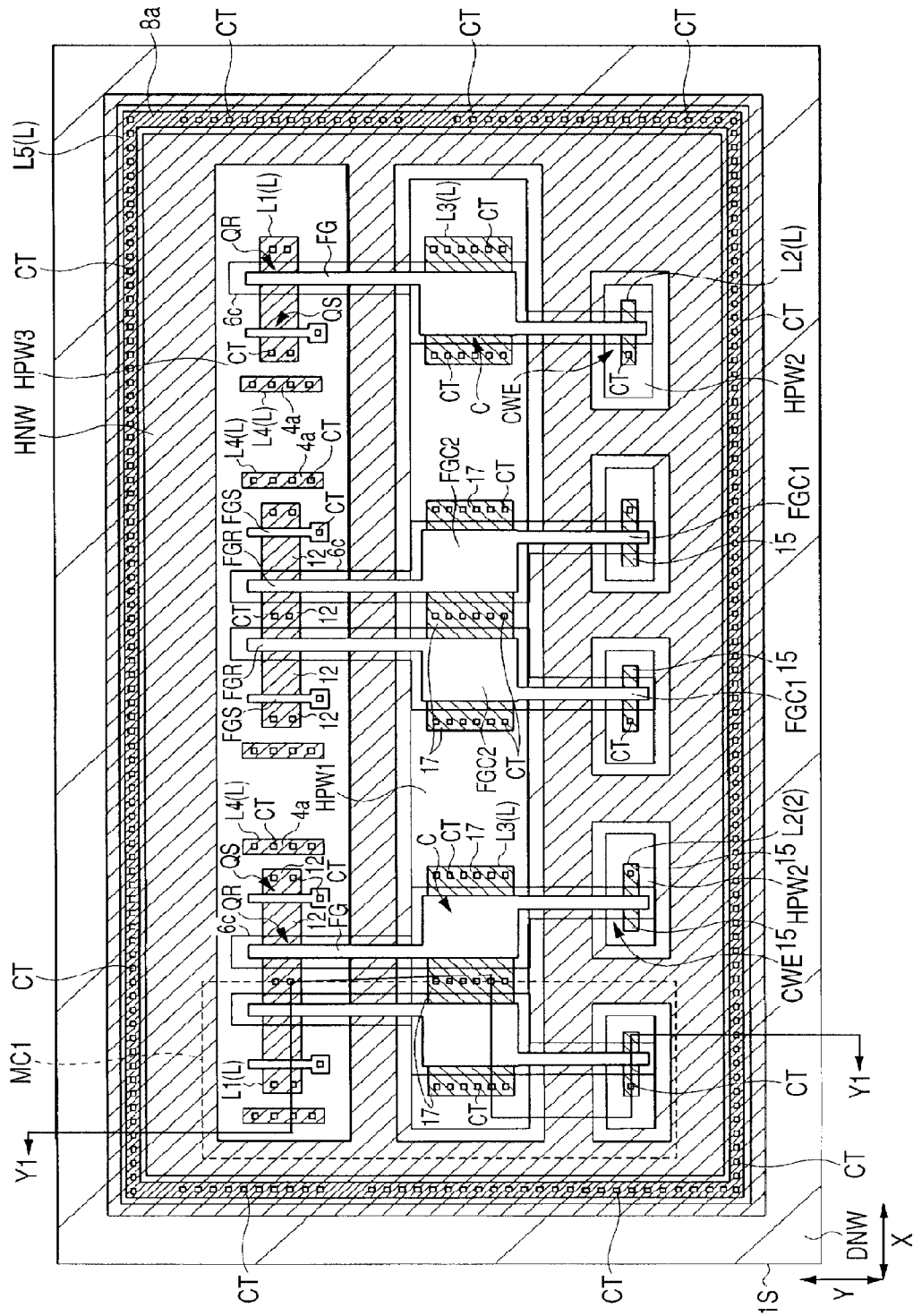
FIG. 3 is a plan view of a flash memory for a semiconductor device illustrative of a first embodiment of the present invention.
Figure 4:
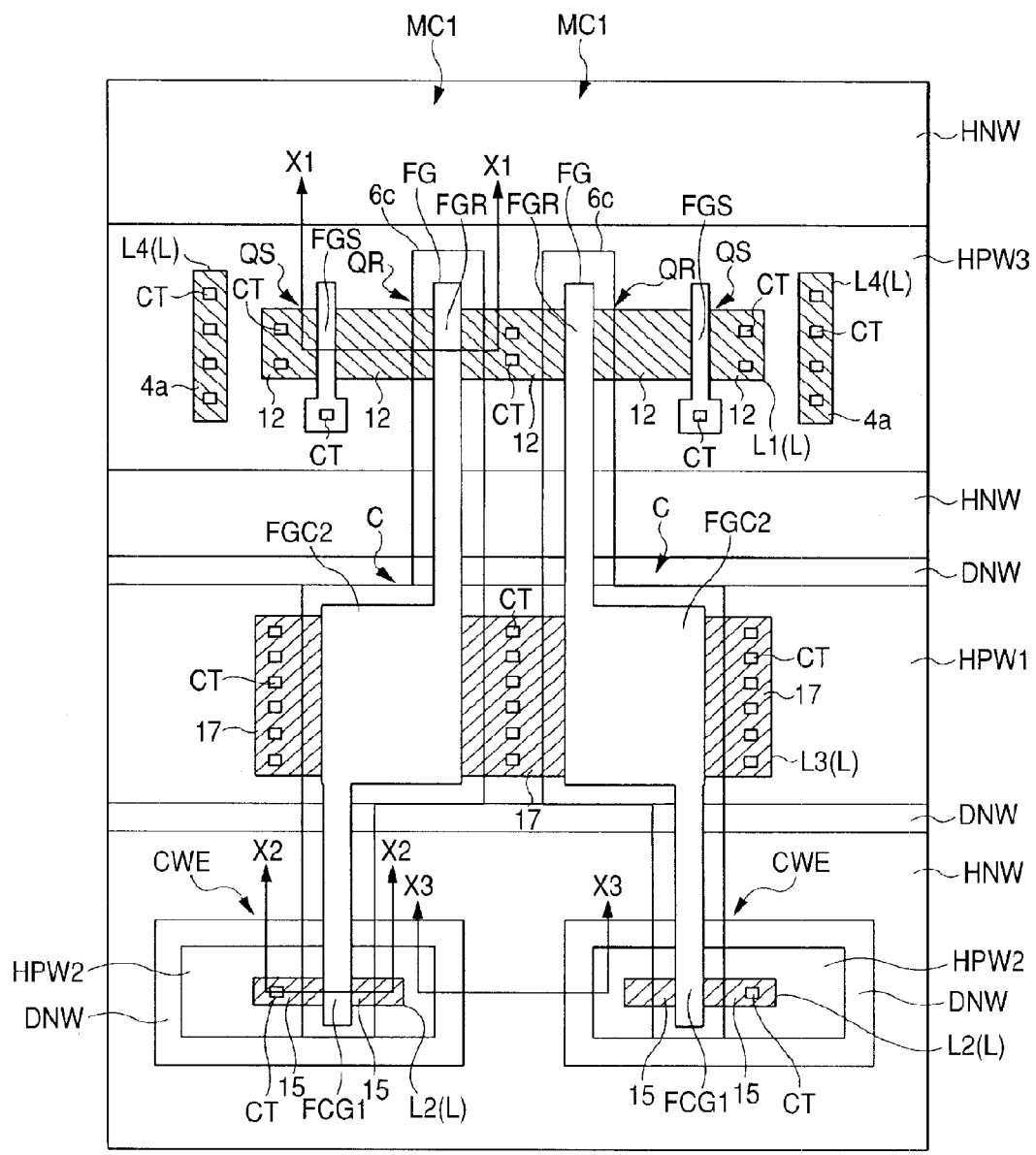
FIG. 4 is a fragmentary enlarged plan view of the flash memory shown in FIG. 3.
Figure 5:
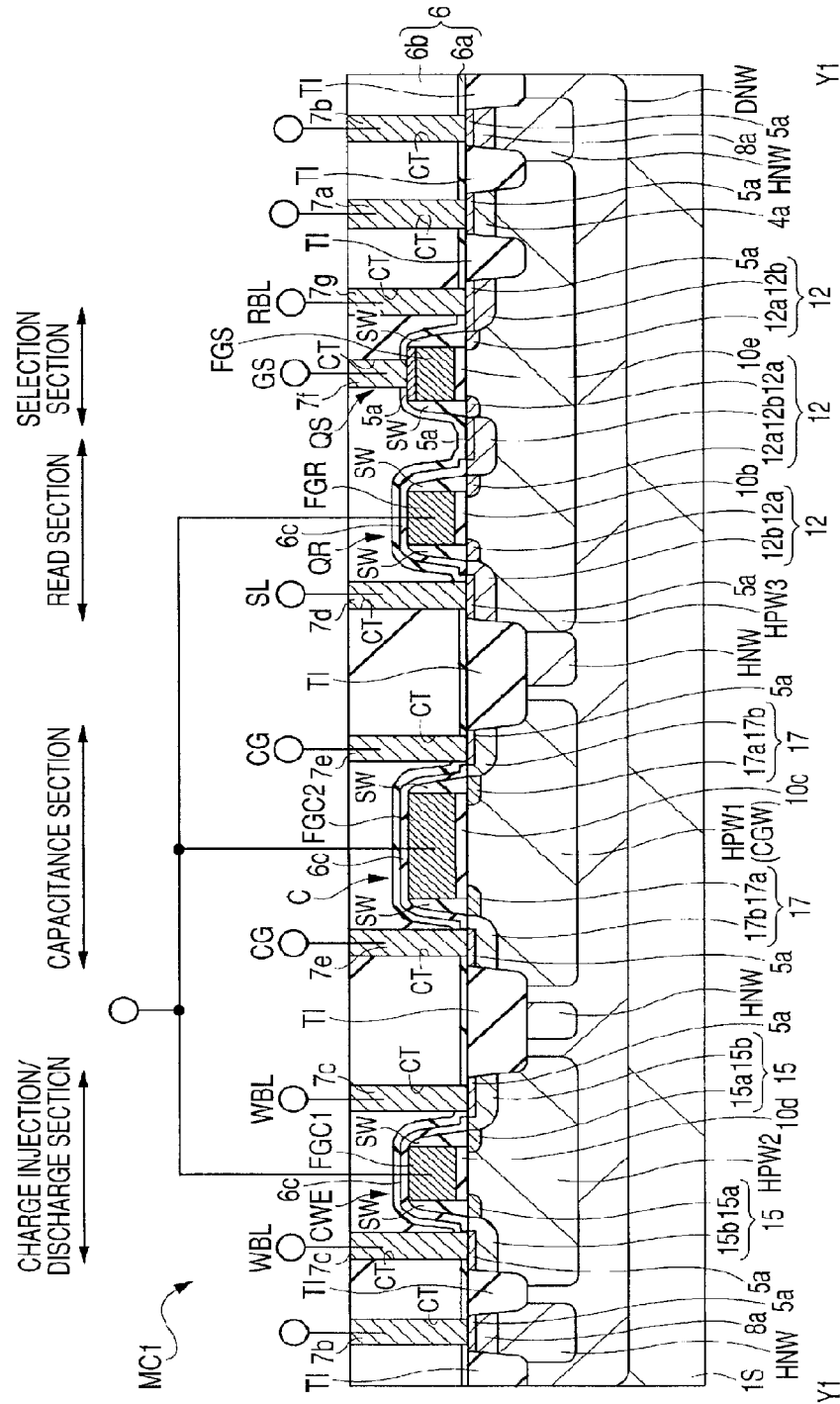
FIG. 5 is a cross-sectional view taken along line Y1-Y1 of FIG. 3.
Figure 6:
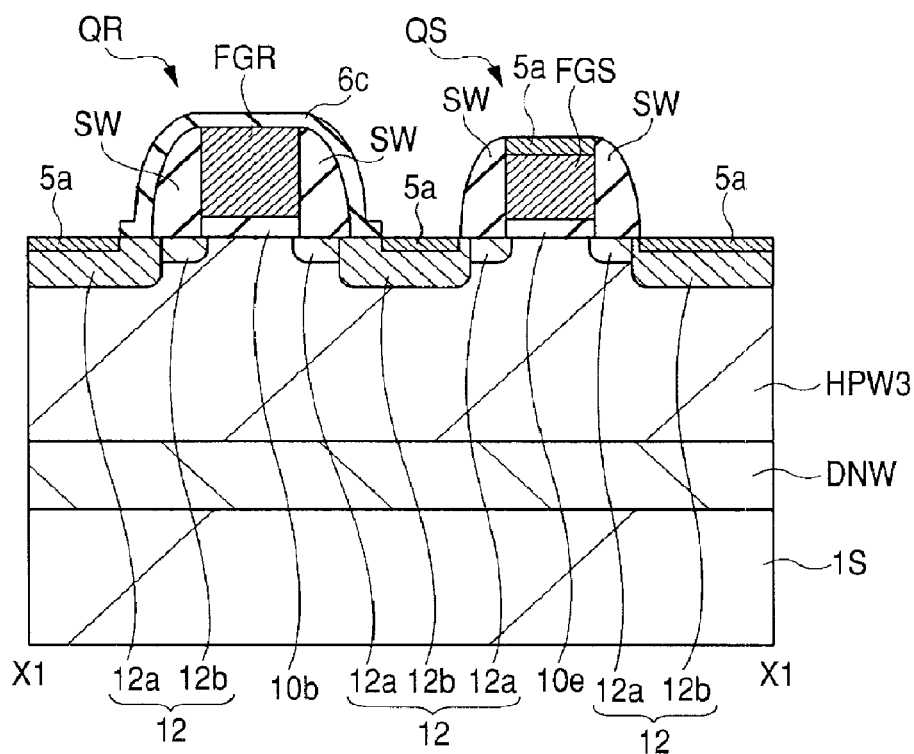
FIG. 6 is a cross-sectional view taken along line X1-X1 of FIG. 4.
Figure 7:
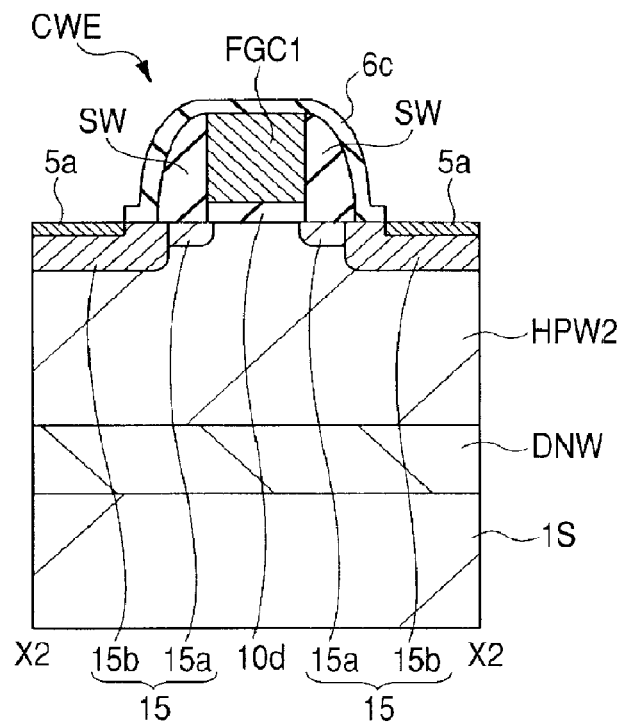
FIG. 7 is a cross-sectional view taken along line X2-X2 of FIG. 4.
Figure 8:
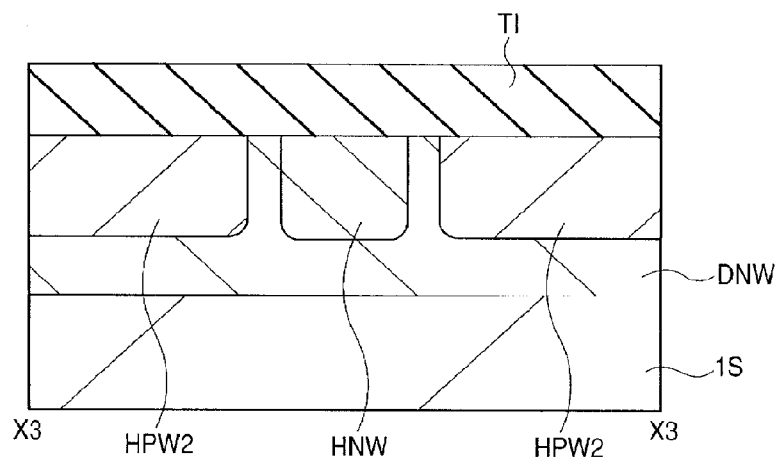
FIG. 8 is a cross-sectional view taken along line X3-X3 of FIG. 4.

The flash memory for the semiconductor device according to the first embodiment will first be explained. FIG. 3 is a plan view of the flash memory for the semiconductor device according to the first embodiment, FIG. 4 is a fragmentary enlarged plan view of the flash memory shown in FIG. 3, FIG. 5 is a cross-sectional view taken along line Y1-Y1 of FIG. 3, FIG. 6 is a cross-sectional view taken along line X1-X1 of FIG. 4, FIG. 7 is a cross-sectional view taken along line X2-X2 of FIG. 4, and FIG. 8 is a cross-sectional view taken along line X3-X3 of FIG. 4, respectively. Incidentally, although FIGS. 3 and 4 are plan views, parts thereof are hatched to make it easy to see the drawings.

In the first embodiment, a plurality of the memory cells MC1 are disposed side by side regularly along a second direction X in a flash memory area of a main surface (first main surface) of a semiconductor substrate (hereinafter called simply "substrate") 1S constituting a semiconductor chip. Here, one memory cell MC1 is arranged for one bit (one bit/one cell configuration).

The substrate 1S comprises, for example, a p-type (second conduction type) silicon (Si) single crystal and has a first main surface and a second main surface located on the sides opposite to each other along its thickness direction.

Isolation parts TI are disposed in the first main surface of the substrate 1S. The isolation parts TI are parts that define active regions L (L1, L2, L3, L4 and L5) respectively. Here, the isolation parts TI are formed as trench-type isolation parts called so-called SGI (Shallow Groove Isolation) or STI (Shallow Trench Isolation), which are formed by, for example, embedding an insulating film comprising silicon oxide or the like in shallow trenches dug in the main surface of the substrate 1S.

An n-type (first conduction type) embedded well (first well) DNW is formed over the substrate 1S over a desired depth as viewed from its main surface. And, p-type wells HPW1, HPW2, HPW3 and an n-type well HNW are respectively formed in the n-type embedded well DNW in a state in which they are being internally wrapped. The p-type wells HPW1, HPW2 and HPW3 are disposed in a state in which they are adjacent to one another along the first direction Y. The p-type well (fourth well) HPW1 is disposed between the p-type well (second well) HPW2 and the p-type well (third well) HPW3.

The p-type wells HPW1, HPW2 and HPW3 are electrically isolated from one another by the n-type well HNW and the embedded well DNW disposed between their adjacent wells. A plurality of the p-type wells HPW2 are also electrically isolated from one another by the n-type well HNW and the embedded well DNW disposed therebetween. Although the n-type well HNW is in contact with the p-type well HPW3, the n-type well HNW is not in contact with the p-type wells HPW1 and HPW2 to ensure a breakdown voltage, and the embedded well DNW is interposed between the n-type well HNW and the p-type wells HPW1 and HPW2.

An impurity indicative of a p type like, for example, boron or the like is contained in the p-type wells HPW1, HPW2 and HPW3. Further, $p^+$-type semiconductor regions $4a$ are formed in upper-layer parts of the p-type well HPW3 of these. Although the same impurity as the p-type well HPW3 is contained in each of the $p^+$-type semiconductor regions $4a$, the impurity concentration of the $p^+$-type semiconductor region $4a$ is set so as to become higher than that of the p-type well HPW3. A silicide layer $5a$ like, for example, cobalt silicide ($CoSi_x$) or the like is formed over part of a surface layer of the $p^+$-type semiconductor region $4a$. The $p^+$-type semiconductor region $4a$ is electrically coupled to a conductor part $7a$ lying in a contact hole CT formed in an insulting layer 6 provided over the main surface of the substrate 1S through the silicide layer $5a$. The insulating layer 6 has an insulating layer $6a$ and an insulating layer $6b$ deposited thereover. The lower insulating layer $6a$ comprises, for example, silicon nitride ($Si_3N_4$) and the upper insulating layer $6b$ comprises, for example, silicon oxide ($SiO_2$).

An impurity indicative of an n type like, for example, phosphor (P) or arsenic (As) is contained in the n-type well HNW. The impurity concentration thereof is formed in a concentration higher than that of the embedded well DNW. $n^+$-type semiconductor regions $8a$ are formed in an upper-layer part of the n-type well HNW. Although the same impurity as the n-type well HNW is contained in each $n^+$-type semiconductor region $8a$, the impurity concentration of the $n^+$-type semiconductor region $8a$ is set so as to become higher than that of the n-type well HNW. The $n^+$-type semiconductor region $8a$ is electrically coupled to each conductor part $7b$ lying in a contact hole CT formed in the insulting layer 6 through the silicide layer $5a$ formed in part of its surface layer.

Each of the memory cells MC1 that constitute the flash memory according to the first embodiment has a floating gate electrode FG, a data read MIS•FETQ, a capacitance section C, a data write/erase charge injection/discharge section CWE and a selection MIS•FETQS.

The floating gate electrode FG has the function of storing an electric charge that contributes to storage of information. The floating gate electrode FG comprises a conductor like, for example, low-resistance polycrystalline silicon or the like and is formed in an electrically floating state (in a state insulated from other conductor). Constituting the gate configurations of the memory cells MC1 as single layers in this way makes it possible to facilitate matching in manufacturing between the memory cells MC1 of the flash memory and the elements of the main circuit. It is therefore possible to shorten the time required to manufacture the semiconductor device and reduce its manufacturing cost.

Sidewalls SW comprising, for example, silicon oxide are formed over the side surfaces of the floating gate electrode FG. A cap insulating layer $6c$ is formed so as to cover the upper surface of the floating gate electrode FG and the surfaces of the sidewalls SW. The cap insulating layer $6c$ comprises, for, example, silicon oxide and is formed between the upper surface of the floating gate electrode FG and the insulating layer $6b$ in such a manner that the insulating layer $6a$ comprising silicon nitride does not directly contact the upper surface of the floating gate electrode FG. This results from the following reasons. That is, when the insulating layer $6a$ comprising silicon nitride is deposited by a plasma chemical vapor deposition (CVD) method or the like, the insulating layer $6a$ is easy to assume a silicon-rich film at the early stage of its deposition. Therefore, there is a case in which when the insulting layer $6a$ is formed in a state of being in direct contact with the upper surface of the floating gate electrode FG, the electric charge in the floating gate electrode FG flows into the substrate 1S side through the silicon-rich portion of the insulating layer $6a$ and is discharged through the corresponding conductor part. As a result, a data retention characteristic of the flash memory is degraded. Forming the cap insulating layer $6c$ enables suppression or prevention of such a defective condition.

The cap insulating layer $6c$ is formed even over resistive elements (not shown) provided in other area of the substrate 1S. Each resistive element is constituted of, for example, a polycrystalline silicon film and can be formed in accordance with the same process step as the process step of forming the floating gate electrode FG. Providing the cap insulating layer $6c$ over such resistive elements makes it possible to selectively make and divide an area in which the silicide layer $5a$ is formed over each resistive element and an area in which no silicide layer $5a$ is formed. Thus, the resistive element having a desired resistance value can be formed. That is, in the first embodiment, an insulating layer for fabricating and dividing the silicide layer 5a over the resistive elements and an insulating layer provided between the silicide layer and the insulating layer 6a provided over the floating gate electrode FG are formed using the cap insulating layer 6c in accordance with the same process step. Thus, the respective insulating layers need not to be formed in discrete process steps and hence the process of manufacturing the semiconductor device can be simplified.

As shown in FIG. 5, the cap insulating layer 6c covers the upper surface of each floating gate electrode FG and the surfaces of the sidewalls SW and is formed so as to extend to over $n^+$-type semiconductor regions 12b, $p^+$-type semiconductor regions 15b and $p^+$-type semiconductor regions 17b to be described later. This is because there is a high possibility that when the silicide layer 5a grows to within the low-concentration $n^-$-type semiconductor region 12a, $p^-$-type semiconductor region 15a and $p^-$-type semiconductor region 17a upon forming the silicide layer 5a, a junction leak current relative to the substrate 1S will occur. In the present application, the above occurrence of junction leak can be prevented because the silicide layers 5a can be formed so as to be separated from the low-concentration $n^-$-type semiconductor regions 12a, $p^-$-type semiconductor regions 15a and $p^-$-type semiconductor regions 17a by the cap insulating layer 6c.

As shown in FIGS. 3 and 4, the floating gate electrodes FG are formed in a state of extending along the first direction Y so as to planarly overlap with the p-type wells HPW1, HPW2 and HPW3 adjacent to one another along the first direction Y. That is, each of the floating gate electrodes FG integrally has a first part which planarly overlaps with the p-type well HPW1, a second part which extends from a first side of the first part to the data read MIS•FETQR along the first direction Y, and a third part which extends from a second side extending along the first side, of the first part to the data write/erase charge injection/discharge section CWE along the first direction.

Data read MIS•FETQR and selection MIS•FETQS are disposed in the p-type well HPW3. That is, each data read MIS•FETQR is disposed in a position (second position) where the second part of the floating gate electrode FG planarly overlaps with the active region L1 of the p-type well HPW3. The data read MIS•FETQR has a gate electrode (second electrode) FGR, a gate insulting film (second insulating film) 10b and a pair of n-type semiconductor regions 12 and 12. A channel of the data read MIS•FETQR is formed in a surface layer of the p-type well HPW3 over which the gate electrode FGR and the active region L1 overlap each other planarly.

The gate electrode FGR is formed of part of the floating gate electrode FG. The gate insulating film 10b is constituted of, for example, silicon oxide and is formed between the gate electrode FGR and the substrate 1S (p-type well HPW3). The thickness of the gate insulating film 10b is 13.5 nm or so, for example.

The pair of n-type semiconductor regions 12 and 12 is formed in a position where the gate electrode FGR is interposed therebetween within the p-type well HPW3. The pair of n-type semiconductor regions 12 and 12 respectively have $n^-$-type semiconductor regions 12a on their channel sides, and $n^+$-type semiconductor regions 12b respectively coupled thereto. Although an impurity of the same conduction type, such as phosphor (P) or arsenic (As) or the like is contained in each of the $n^-$-type semiconductor regions 12a and the $n^+$-type semiconductor regions 12b, the impurity concentration of the $n^+$-type semiconductor region 12b is set so as to become higher than that of the $n^-$-type semiconductor region 12a.

One (source side) of the pair of the semiconductor regions 12 and 12 is shared with one (source side) of a pair of semiconductor regions 12 for data read MIS•FETQR of other adjoining memory cell MC1. The semiconductor region 12 on the source side is electrically coupled to a conductor part 7d lying in a contact hole CT formed in the insulating layer 6, through the silicide layer 5a formed in part of the surface layer of the $n^+$-type semiconductor region 12b. The conductor part 7d is electrically coupled to its corresponding source line SL. On the other hand, the other of the pair of semiconductor regions 12 and 12 is shared with one of the n-type semiconductor regions 12 used for the source and drain of the selection MIS•FETQS.

The selection MIS•FETQS has a gate electrode FGS, a gate insulating film 10e and a pair of n-type semiconductor regions 12 and 12 for source/drain. A channel for the selection MIS•FETQS is formed in the surface layer of the p-type well HPW3 over which the gate electrode FGS and the active region L1 overlap planarly.

The gate electrode FGS is formed of, for example, low-resistance polycrystalline silicon. Sidewalls SW are formed even over their corresponding side surfaces of the gate electrode FGS. The silicide layer 5a is formed in the surface layer of the gate electrode FGS. The gate electrode FGS is electrically coupled to its corresponding conductor part 7f lying in a contact hole CT formed in the insulating layer 6. The conductor part 7f is electrically coupled to its corresponding selection line GS.

The gate insulating film 10e comprises, for example, silicon oxide and is formed between the gate electrode FGS and the substrate 1S (p-type well HPW3). The thickness of the gate insulating film 10e is 13.5 nm or so, for example.

The pair of n-type semiconductor regions 12 and 12 for the selection MIS•FETQS is identical in configuration to the n-type semiconductor regions 12 for the data read MIS•FETQR. The other n-type semiconductor region 12 for the selection MIS•FETQS is electrically coupled to its corresponding conductor part 7g lying in a contact hole CT defined in the insulating layer 6, through the silicide layer 5a formed in part of its surface layer. The conductor part 7g is electrically coupled to its corresponding data read bit line RBL.

Data write/erase charge injection/discharge sections CWE are disposed for a plurality of p-type wells HPW2. That is, each data write/erase charge injection/discharge section CWE is disposed in a position (third position) where the third part of the floating gate electrode FG planarly overlaps with the active region L2 of the p-type well (second well) HPW2. The charge injection/discharge section CWE has a capacitive electrode (third electrode) FGC1, a capacitive insulating film (third insulating film) 10d, p-type semiconductor regions 15 and 15, and a p-type well HPW2.

The capacitive electrode FGC1 is formed of part of the floating gate electrode FG and corresponds to a portion for forming an electrode for the charge injection/discharge section CWE. The capacitive insulating film 10d comprises, for example, silicon oxide and is formed between the capacitive electrode FGC1 and the substrate 1S (p-type well HPW2). The thickness of the capacitive insulating film 10d ranges from, for example, over 10 nm to under 20 nm.

In the charge injection/discharge section CWE employed in the first embodiment, however, electrons are injected from the p-type well HPW2 to the capacitive electrode FGC1 through the capacitive insulating film 10d, and the electrons of the capacitive electrode FGC1 are discharged into the p-type well HPW2 through the capacitive insulating film 10d, upon rewriting or reprogramming of data. Therefore, the thickness of the capacitive insulating film 10d is set thin, described specifically, its thickness is set to a thickness of 13.5 nm or so, for example. This is because when the thickness of the capacitive insulating film 10d is thinner than 10 nm, the reliability of the capacitive insulating film 10d cannot be ensured. Further, when the thickness of the capacitive insulating film 10d is made thicker than 20 nm, it becomes difficult to cause the electrons to pass therethrough, and hence the rewriting of data cannot be carried out successfully.

The p-type semiconductor regions 15 for each charge injection/discharge section CWE are formed in positions where they interpose the capacitive electrode FGC1 therebetween within the p-type well HPW2. The semiconductor regions 15 respectively have p$^-$-type semiconductor regions 15a on the channel side and p$^+$-type semiconductor regions 15b respectively coupled thereto. Although an impurity of the same conduction type, such as boron (B) is contained in the p$^-$-type semiconductor regions 15a and p$^+$-type semiconductor regions 15b, the impurity concentration of each p$^+$-type semiconductor region 15a is set so as to become higher than that of each p$^-$-type semiconductor region 15a.

The semiconductor regions 15 on both sides of the capacitive electrode FGC1 are both configured as a p type. However, it is also possible to configure one thereof as a p-type semiconductor region 15 and configure the other (one side) thereof as an n-type semiconductor region 15. In this case, the semiconductor region 15a of the other n-type semiconductor region 15 is configured as an n$^-$-type, and the semiconductor region 15b thereof is configured as an n$^+$-type (higher than n$^-$-type in impurity concentration). Each semiconductor region can be formed by causing the n$^-$-type semiconductor region 15a and n$^+$-type semiconductor region 15b to contain an impurity like arsenic (As) or phosphor (P). While the effect of providing each charge injection/discharge section CWE with the n$^-$-type semiconductor region 15a and n$^+$-type semiconductor region 15b will be explained in detail later, the rate of writing of data in each memory cell mainly can be enhanced.

The p-type semiconductor regions 15 are electrically coupled to the p-type well HPW2. The p-type semiconductor regions 15 and the p-type well HPW2 are portions for forming an electrode for the charge injection/discharge section CWE. The p-type semiconductor region 15 is electrically coupled to its corresponding conductor part 7c lying in a contact hole CT defined in the insulating layer 6, through the silicide layer 5a formed in part of the surface layer of the corresponding p$^+$-type semiconductor region 15b. The conductor part 7c is electrically coupled to its corresponding data write/erase bit line WBL.

Capacitance sections C corresponding to plural bits are disposed in the p-type well HPW1. That is, each capacitance section C is formed in a position (first position) where the first part of the floating gate electrode FG planarly overlaps with the p-type well HPW1. The capacitance section C has a control gate electrode CGW, a capacitive electrode (first electrode) FGC2, a capacitive insulating film (first insulating film) 10c and p-type semiconductor regions 17.

The control gate electrode CGW is formed by the p-type well HPW1 portion to which the floating gate electrode FG is opposed. The capacitive electrode FGC2 is formed by the first part of the floating gate electrode FG opposite to the control gate electrode CGW. The length of the capacitive electrode FGC2 as viewed in the second direction X is formed so as to be longer than the lengths of the capacitive electrode FGC1 of the data write/erase charge injection/discharge section CWE and the gate electrode FGR of the data read MIS•FETQR as viewed in the second direction X. Thus, since the plan area of the capacitive electrode FGC2 can be ensured on a large scale, a coupling ratio can be enhanced and the efficiency of supply of a voltage from the control gate electrode CGW can be increased.

The capacitive insulating film 10c comprises, for example, silicon oxide and is formed between the control gate electrode CGW and the capacitive electrode FGC2. The capacitive insulating film 10c is simultaneously formed by a thermal oxidation process used upon forming the gate insulating films 10b and 10e and the capacitive insulating film 10d. The thickness of the capacitive insulating film 10c is 13.5 nm or so, for example. The gate insulating films 10b and 10e and the capacitive insulating films 10c and 10d are formed by the same process step as one for a gate insulating film for each high breakdown MISFET, of high breakdown MISFETs each having a relatively thick gate insulating film and low breakdown MISFETs each having a relatively thin gate insulating film in the main circuit. Thus, the reliability of the flash memory can be enhanced.

The p-type semiconductor regions 17 are formed in positions where they interpose the capacitive electrode FGC2 therebetween within the p-type well HPW1. The semiconductor regions 17 respectively have p$^-$-type semiconductor regions 17a on the channel side and p$^+$-type semiconductor regions 17b respectively coupled thereto. An impurity of the same conduction type like, for, example, boron (B) or the like is contained in the p$^-$-type semiconductor regions 17a and p$^+$-type semiconductor regions 17b. However, the impurity concentration of the p$^+$-type semiconductor region 17b is set so as to be higher than that of the p$^-$-type semiconductor region 17a.

The semiconductor regions 17 on both sides of the capacitive electrode FGC2 are both configured as a p type. However, it is also possible to configure one thereof as a p-type semiconductor region 17 and configure the other (one side) thereof as an n-type semiconductor region 17. In this case, the semiconductor region 17a of the other n-type semiconductor region 17 is configured as an n$^-$-type, and the semiconductor region 17b thereof is configured as an n$^+$-type (higher than n$^-$-type in impurity concentration). Each semiconductor region can be formed by causing the n$^-$-type semiconductor region 17a and n$^+$-type semiconductor region 17b to contain an impurity like arsenic (As) or phosphor (P). While the effect of providing each capacitance section C with the n$^-$-type semiconductor region 17a and n$^+$-type semiconductor region 17b will be explained in detail later, the rate of erasing of data in each memory cell mainly can be enhanced.

The p-type semiconductor regions 17 are electrically coupled to the p-type well HPW1. The p-type semiconductor regions 17 and the p-type well HPW1 are portions for forming a control gate electrode CGW for the capacitance section C. The p-type semiconductor region 17 is electrically coupled to its corresponding conductor part 7e lying in a contact hole CT defined in the insulating layer 6, through the silicide layer 5a formed in the surface layer of the corresponding p$^+$-type semiconductor region 17b. The conductor part 7e is electrically coupled to its corresponding control gate wiring CG.

Meanwhile, the memory cells MC1 employed in the first embodiment are different from the memory cells MC0 shown in FIGS. 1 and 2 in terms of the layout of the data read MIS•FETQR, capacitance sections C and data write/erase charge injection/discharge sections CWE.

In the memory cells MC1 employed in the first embodiment, the data read MIS•FETQR, the capacitance sections C and the data write/erase charge injection/discharge sections CWE are disposed in order from top to bottom as viewed in FIGS. 3 and 4. That is, each of the capacitance sections C is disposed between the data read MIS•FETQR and the charge injection/discharge section CWE.

In the first embodiment, the first part of the floating gate electrode FG is provided between the second and third parts thereof as described above, and the second part having the gate electrode FGR of the data read MIS•FETQR and the third part having the capacitive electrode FGC1 of the data write/erase charge injection/discharge section CWE are separated from each other.

Therefore, in the first embodiment, the length in the second direction X, of the second part of the floating gate electrode FG and the length in the second direction X, of the third part thereof can respectively be adjusted separately. Thus, the electrical characteristics of the flash memory can be enhanced.

The present embodiment shows as an example, the case in which the length in the second direction X, of the second part (gate electrode FGR) of the floating gate electrode FG and the length in the second direction X, of the third part (capacitive electrode FGC1) thereof are equal to each other. However, the length in the second direction X, of the third part (capacitive electrode FGC1) of the floating gate electrode FG may be set shorter than the length in the second direction X, of the second part (gate electrode FGR) of the floating gate electrode FG (this configuration will be explained in the paragraph of another embodiment). The length in the second direction X, of the second part (gate electrode FGR) of the floating gate electrode FG may be set shorter than the length in the second direction X, of the third part (capacitive electrode FGC1) of the floating gate electrode FG (this configuration will be explained in the paragraph of a further embodiment).

In the first embodiment, the length in the first direction Y, of the second part of the floating gate electrode FG and the length in the first direction Y, of the third part can respectively be adjusted in a separate manner. Thus, the electrical characteristics of the flash memory can be improved.

The present embodiment illustrates, as an example, the case in which the length in the first direction Y, the third part of the floating gate electrode FG is shorter than the length in the first direction Y, of the second part thereof. However, the length in the first direction Y, of the third part of the floating gate electrode FG may be set longer than the length in the first direction Y, of the second part. Alternatively, the length in the first direction Y, of the third part of the floating gate electrode FG and the length in the first direction Y, of the second part may be set equal to each other.

In the first embodiment, the length from the capacitive electrode FGC2 in the floating gate electrode FG to the data read MIS•FETQR can be shortened by a portion corresponding to the charge injection/discharge section CWE non-interposed therebetween as compared with each of the memory cells MC0 shown in FIGS. 1 and 2. Thus, the electrical characteristics of the data read MIS•FETQR can be enhanced.

In the first embodiment, the positions in the second direction X, of the second part (gate electrode FGR) and the third part (capacitive electrode FGC1) can respectively be adjusted in a discrete manner by separating the second and third parts of the floating gate electrode FG from each other as described above.

In the first embodiment, the second part (gate electrode FGR) of the floating gate electrode FG and the third part (capacitive electrode FGC1) thereof are disposed with being shifted in the direction moved away from each other along the second direction X. Although the present embodiment shows, as an example, the case in which the second and third parts are diagonally located, the present invention is not limited to it. One or both of the second and third parts may be located in portions spaced away from the corners (opposite angles) of the first part (capacitive electrode FGC2).

Further, in the first embodiment, the memory cells MC1 adjacent to each other are arranged in such a manner that the second parts (gate electrodes FGR) of their floating gate electrodes FG approach each other and the third parts (capacitive electrodes FGC1) thereof are moved away from each other. Thus, the semiconductor regions 12 for the data read MIS•FETQR of the memory cells MC1 adjacent to each other can be brought to the shared configuration as mentioned above while the semiconductor regions 15 and the p-type wells HPW2 in the charge injection/discharge sections CWE of the memory cells MC1 adjacent to each other remain in isolation respectively. Further, the semiconductor regions 17 for the capacitance sections C of the memory cells MC1 adjacent to each other can be brought to the shared configuration as described above. Thus, since the adjoining space in the second direction X defined between the adjacent memory cells MC1 can be closed up or reduced, the area of the memory cell array can be reduced. The storage capacity of each memory can be increased.

The main circuit unit of the semiconductor device according to the first embodiment will next be explained.

The LCD driver circuit corresponding to the main circuit unit of the first embodiment has a high breakdown section and a low breakdown section. An operating voltage of each MIS•FET in the high breakdown section is 25V or so, for example. As MIS•FETs in the low breakdown section, may be mentioned, two types of one having an operating voltage of, for example, 6.0V, and one having an operating voltage of, for example, 1.5V. The MIS•FET whose operating voltage is 1.5V is provided for the purpose of operating at a velocity faster than the MIS•FET whose operating voltage is 6.0V. In the MIS•FET having the operating voltage of 1.5V, its gate insulating film is thinner than that for the MIS•FET having the operating voltage of 6.0V. The thickness of the gate insulating film is formed in a range from about 1 nm to about 3 nm.

Figure 9:
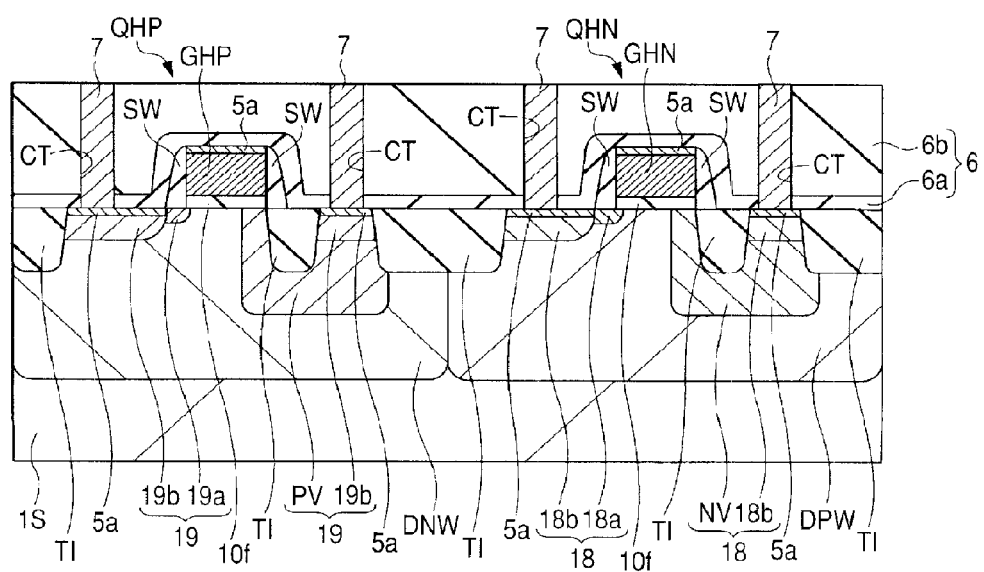
FIG. 9 is a cross-sectional view of a high breakdown section of a main circuit unit employed in the semiconductor device illustrative of the first embodiment of the present invention.

FIG. 9 is a cross-sectional view of a high breakdown section of a main circuit unit employed in the semiconductor device according to the first embodiment.

An n-type embedded well DNW and a p-type embedded well DPW are formed in the high breakdown section of the substrate 1S of the semiconductor chip. A high breakdown n channel type MIS•FETQHN is formed in the p-type embedded well DPW, and a p channel type MIS•FETQHP is formed in the n-type embedded well DNW.

An impurity indicative of a p type like, for example, boron (B) or the like is contained in the p-type embedded well. DPW. The n channel type MIS•FETQHN formed in the p-type embedded well DPW has a gate electrode GHN, a gate insulating film 10f and n-type semiconductor regions 18 and 18 for source/drain.

The gate electrode GHN comprises, for example, low-resistance polycrystalline silicon, and a silicide layer 5a is formed over its upper surface. Sidewalls SW are formed over their corresponding side surfaces of the gate electrode GHN. The gate insulating film 10f comprises, for example, silicon oxide and is formed between the gate electrode GHN and the substrate 1S. The thickness of the gate insulating film 10f is thicker than a gate insulating film of a low breakdown section to be described later and ranges from about 50 nm to about 100 nm, for example. Such a gate insulating film 10f can also be formed by laminating a film formed by thermal oxidation and a film deposited by a CVD method.

The n-type semiconductor regions 18 and 18 for source/drain are internally wrapped in the p-type embedded well DPW. One of the n-type semiconductor regions 18 and 18 has an n⁻-type semiconductor region 18a on the channel side, and an n⁺-type semiconductor region 18b coupled thereto. The other thereof has an n-type semiconductor region NV on the channel side, and an n⁺-type semiconductor region 18b coupled thereto. On the other n-type semiconductor region 18 side, an isolation part TI is provided between one end of the gate electrode GHN and the n⁺-type semiconductor region 18b. The n-type semiconductor region NV is coupled to the n⁺-type semiconductor region 18b so as to straddle the isolation part TI.

An impurity of the same conduction type like, for example, phosphor (P) or arsenic (As) or the like is contained in the semiconductor regions 18a, 18b and NV. However, the impurity concentrations of the semiconductor regions 18a and 18b are set so as to become higher than the impurity concentration of the n-type semiconductor region NV. The semiconductor regions 18 and 18 for source/drain are electrically coupled to their corresponding conductor parts 7 lying in contact holes CT defined in the insulating layer 6, through silicide layers 5a each formed in part of a surface layer of the n⁺-type semiconductor region 18b.

The p channel type MIS•FETQHP has a gate electrode GHP, gate insulating film 10f and p-type semiconductor regions 19 and 19 for source/drain.

The gate electrode GHP comprises, for example, low-resistance polycrystalline silicon and a silicide layer 5a is formed over its upper surface. Sidewalls SW are formed over their corresponding side surfaces of the gate electrode GHP. The gate insulating film 10f for the p channel type MIS•FETQHP is formed between the gate electrode GHP and the substrate 1S. The material and thickness of the gate insulating film 10f are the same as above.

The p-type semiconductor regions 19 and 19 for source/drain are internally wrapped in the n-type embedded well DNW. One of the p-type semiconductor regions 19 and 19 has a p⁻-type semiconductor region 19a on the channel side, and a p⁺-type semiconductor region 19b coupled thereto. The other thereof has a p-type semiconductor region PV on the channel side, and a p⁺-type semiconductor region 19b coupled thereto. On the other p-type semiconductor region 19 side, an isolation part TI is provided between one end of the gate electrode GHP and the p⁺-type semiconductor region 19b. The p-type semiconductor region PV is coupled to the p⁺-type semiconductor region 19b so as to straddle the isolation part TI.

An impurity of the same conduction type like, for example, boron (B) or the like is contained in the semiconductor regions 19a, 19b and PV. However, the impurity concentrations of the semiconductor regions 19a and 19b are set so as to become higher than the impurity concentration of the p-type semiconductor region PV. The semiconductor regions 19 and 19 for source/drain are electrically coupled to their corresponding conductor parts 7 lying in contact holes CT defined in the insulating layer 6, through silicide layers 5a each formed in part of a surface layer of the p⁺-type semiconductor region 19b.

Figure 10:
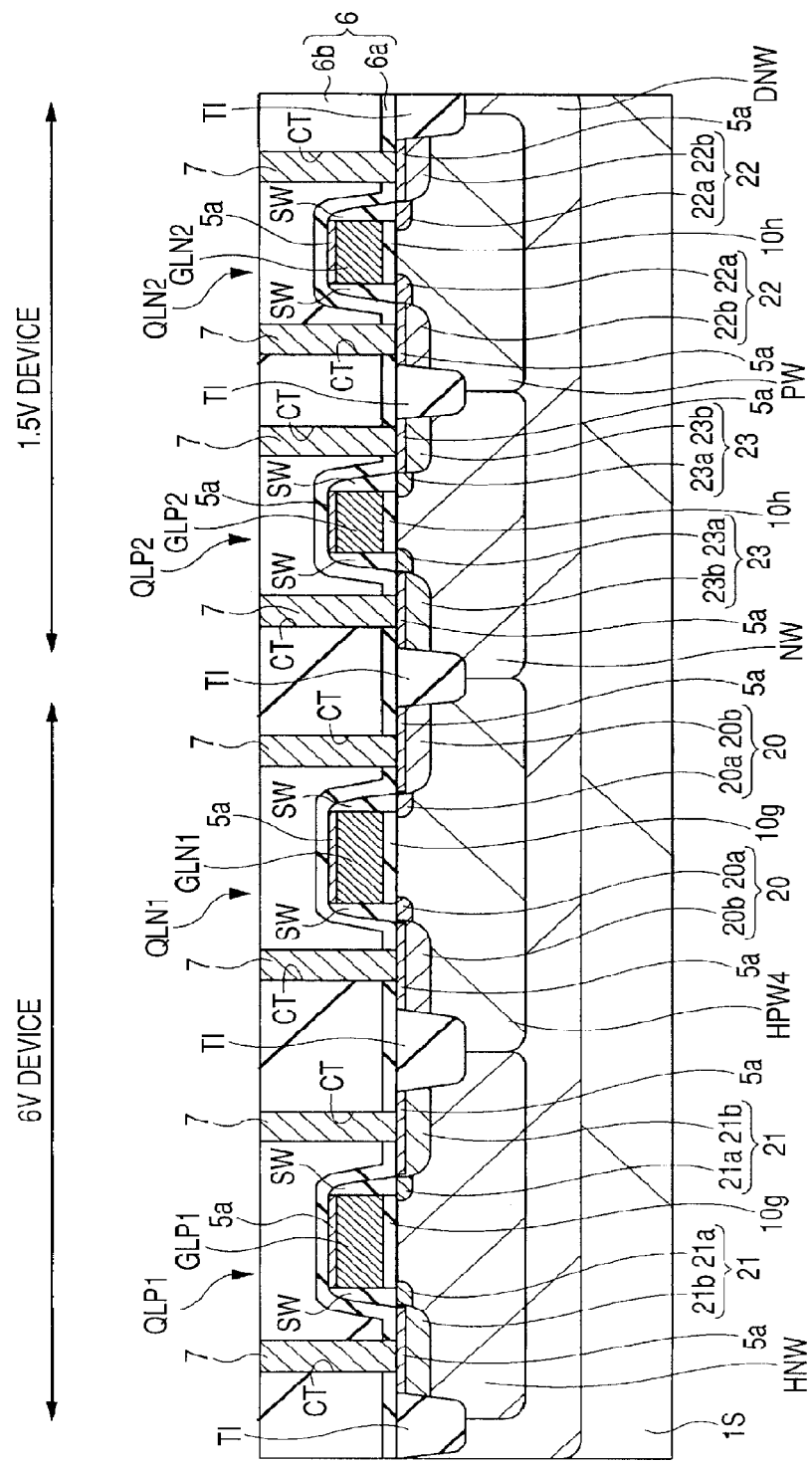
FIG. 10 is a cross-sectional view of a low breakdown section of the main circuit unit employed in the semiconductor device illustrative of the first embodiment of the present invention.

Next, FIG. 10 shows a cross-sectional view of a low breakdown section of the main circuit unit employed in the semiconductor device illustrative of the first embodiment of the present invention.

A p-type well PW and an n-type well NW are formed in the low breakdown section of the substrate 1S in the semiconductor chip. An impurity indicative of a p type like, for example, boron (B) or the like is contained in the p-type well PW. An impurity indicative of an n type like, for example, phosphor (P) or arsenic (As) or the like is contained in the n-type well NW. The p-type well PW and the n-type well NW are internally wrapped in an n-type embedded well DNW.

A low breakdown n channel type MIS•FETQLN1 is formed in a p-type well HPW4 lying in a 6V system device forming area. The n channel type MIS•FETQLN1 is of a device whose operating voltage is 6V and has a gate electrode GLN1, a gate insulating film 10g and a pair of n-type semiconductor regions 20 and 20 for source/drain.

The gate electrode GLN1 comprises, for example, low-resistance polycrystalline silicon, and a silicide layer 5a is formed over its upper surface. Sidewalls SW are formed over their corresponding side surfaces of the gate electrode GLN1. The gate insulating film 10g comprises, for example, silicon oxide and is formed between the gate electrode GLN1 and the substrate 1S. The thickness of the gate insulating film 10g is thinner than the gate insulating film for the MIS•FET of the high breakdown section and is 13.5 nm or so, for example.

The n-type semiconductor regions 20 and 20 for source/drain are internally wrapped in the p-type well HPW4. Each of the n-type semiconductor regions 20 and 20 has an n⁻-type semiconductor region 20a on the channel side, and an n⁺-type semiconductor region 20b coupled thereto. An impurity of the same conduction type like, for example, phosphor (P) or arsenic (As) or the like is contained in the semiconductor regions 20a and 20b. However, the impurity concentration of the n⁺-type semiconductor region 20b is set so as to be higher than that of the n⁻-type semiconductor region 20a.

The semiconductor regions 20 and 20 for source/drain are electrically coupled to their corresponding conductor parts 7 lying in contact holes CT defined in the insulating layer 6, through silicide layers 5a each formed in part of a surface layer of the n⁺-type semiconductor region 20b.

A low breakdown p channel type MIS•FETQLP1 is formed in an n-type well HNW lying in the 6V system device forming area. The p channel type MIS•FETQLP1 is of a device whose operating voltage is 6V and has a gate electrode GLP1, a gate insulating film 10g and a pair of p-type semiconductor regions 20 and 20 for source/drain.

The gate electrode GLP1 comprises, for example, low-resistance polycrystalline silicon and a silicide layer 5a is formed over its upper surface. Sidewalls SW are formed over their corresponding side surfaces of the gate electrode GLP1. The gate insulating film 10g comprises, for example, silicon oxide and is formed between the gate electrode GLP1 and the substrate 1S. The material and thickness of the gate insulating film 10g are the same as above.

The p-type semiconductor regions 21 and 21 for source/drain are internally wrapped in an n-type well HNW. Each of the p-type semiconductor regions 21 and 21 has a p⁻-type semiconductor region 21a on the channel side, and a p⁺-type semiconductor region 21b coupled thereto. An impurity of the same conduction type like, for example, boron (B) or the like is contained in the semiconductor regions 21a, 21b. However, the impurity concentration of the p⁺-type semiconductor region 21b is set so as to become higher than the impurity concentration of the p⁻-type semiconductor region 21a.

The semiconductor regions 21 and 21 for source/drain are electrically coupled to their corresponding conductor parts 7 lying in contact holes CT defined in the insulating layer 6, through silicide layers 5a each formed in part of a surface layer of the p⁺-type semiconductor region 21b.

A low breakdown n channel type MIS•FETQLN2 is formed in a p-type well PW lying in a 1.5V system device forming area. The n channel type MIS•FETQLN2 is of a device whose operating voltage is 1.5V and has a gate electrode GLN2, a gate insulating film 10h and a pair of n-type semiconductor regions 22 and 22 for source/drain.

The gate electrode GLN2 comprises, for example, low-resistance polycrystalline silicon and a silicide layer 5a is formed over its upper surface. The lateral or transverse length (or gate length) of the gate electrode GLN2 is smaller than the transverse length (or gate length) of the gate electrode GLN1 of the low breakdown n channel type MIS•FETQLN1 (whose operating voltage is 6V). Sidewalls SW are formed even over their corresponding side surfaces of such a gate electrode GLN2.

The gate insulating film 10h comprises, for example, silicon oxide and is formed between the gate electrode GLN2 and the substrate 1S. The thickness of the gate insulating film 10h is thinner than the gate insulating film for the MIS•FET of the low breakdown section and is 3.7 nm or so, for example.

The n-type semiconductor regions 22 and 22 for source/drain are internally wrapped in the p-type well PW. Each of the n-type semiconductor regions 22 and 22 has an $n^-$-type semiconductor region 22a on the channel side, and an $n^+$-type semiconductor region 22b coupled thereto. An impurity of the same conduction type like, for example, phosphor (P) or arsenic (As) or the like is contained in the semiconductor regions 22a and 22b. However, the impurity concentration of the $n^+$-type semiconductor region 22b is set so as to be higher than that of the $n^-$-type semiconductor region 22a.

As the configurations of the pair of n-type semiconductor regions 22 for source/drain, p-type semiconductor regions (p-type hollow regions or p-type punchthrough stopper regions) are formed near the ends of the $n^-$-type semiconductor regions 22a. Thus, a short channel effect of the n channel type MIS•FETQLN2 smaller than the n channel type MIS•FETQLN1 can be suppressed or prevented.

The semiconductor regions 22 and 22 for source/drain are electrically coupled to their corresponding conductor parts 7 lying in contact holes CT defined in the insulating layer 6, through silicide layers 5a each formed in part of a surface layer of the $n^+$-type semiconductor region 22b.

A low breakdown p channel type MIS•FETQLP2 is formed in the n-type well PW lying in the 1.5V system device forming area. The p channel type MIS•FETQLP2 is of a device whose operating voltage is 1.5V and has a gate electrode GLP2, a gate insulating film 10h and a pair of p-type semiconductor regions 23 and 23 for source/drain.

The gate electrode GLP2 comprises, for example, low-resistance polycrystalline silicon and a silicide layer 5a is formed over its upper surface. The lateral or transverse length (or gate length) of the gate electrode GLP2 is smaller than the transverse length (or gate length) of the gate electrode GLP1 of the low breakdown p channel type MIS•FETQLP1 (whose operating voltage is 6V). Sidewalls SW are formed even over their corresponding side surfaces of such a gate electrode GLP2. The gate insulating film 10h of the p channel type MIS•FETQLP2 is formed between the gate electrode GLP2 and the substrate 1S. The material and thickness of the gate insulating film 10h are the same as above.

The p-type semiconductor regions 23 and 23 for source/drain are internally wrapped in the n-type well NW. Each of the p-type semiconductor regions 23 and 23 has an $p^-$-type semiconductor region 23a on the channel side, and an $p^+$-type semiconductor region 23b coupled thereto. An impurity of the same conduction type like, for example, boron (B) or the like is contained in the semiconductor regions 23a and 23b. However, the impurity concentration of the $p^+$-type semiconductor region 23b is set so as to be higher than that of the $p^-$-type semiconductor region 23a.

As the configurations of the pair of p-type semiconductor regions 23 for source/drain, p-type semiconductor regions (p-type hollow regions or p-type punchthrough stopper regions) are formed near the ends of the $n^-$-type semiconductor regions 22a. Thus, a short channel effect of the p channel type MIS•FETQLP2 smaller than the p channel type MIS•FETQLP1 can be suppressed or prevented.

The semiconductor regions 23 and 23 for source/drain are electrically coupled to their corresponding conductor parts 7 lying in contact holes CT defined in the insulating layer 6, through silicide layers 5a each formed in part of a surface layer of the $p^+$-type semiconductor region 23b.

Figure 11:
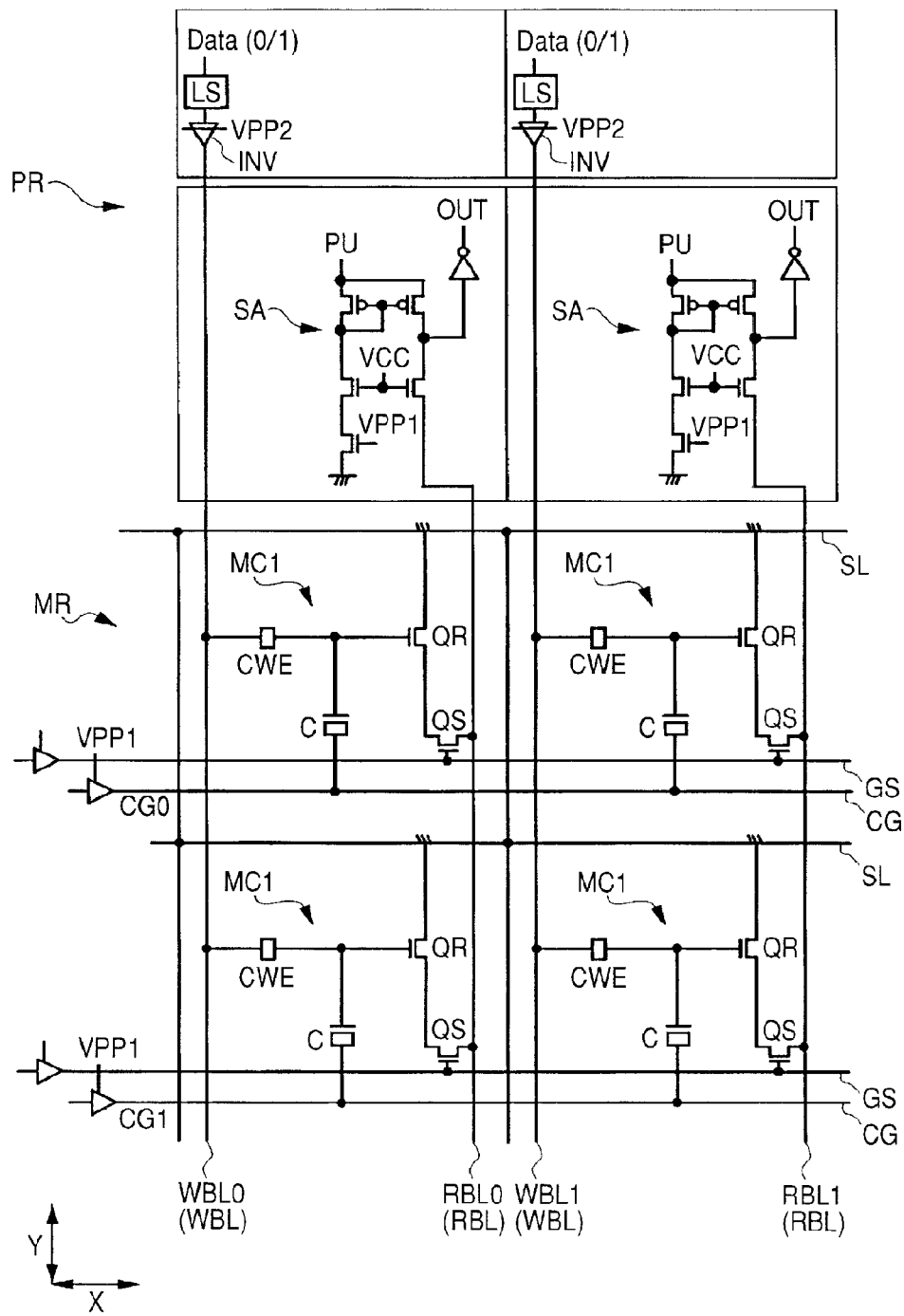
FIG. 11 is a fragmentary circuit diagram of the flash memory shown in FIG. 3.

Next, FIG. 11 shows a fragmentary circuit diagram of the flash memory for the semiconductor device according to the first embodiment.

The flash memory has the memory cell array MR and a peripheral circuit area or region PR. A plurality of data write/erase bit lines WBL (WBL0, WBL1, . . . ) extending in a first direction Y, and data read bit lines RBL (RBL0, RBL2, . . . ) are arranged in the memory cell array MR along a second direction X. Further, a plurality of control gate wirings (word lines) CG (CG0, CG1, . . . ) extending along the second direction X orthogonal to the bit lines WBL and RBL, a plurality of source lines SL and a plurality of selection lines GS are arranged in the memory cell array MR along the first direction Y.

The respective data write/erase bit lines WBL are electrically coupled or coupled to their corresponding data (0/1) input inverter circuits INV arranged in the peripheral circuit area PR. The respective data read bit lines RBL are electrically coupled to their corresponding sense amplifier circuits SA arranged in the peripheral circuit area PR. Each of the sense amplifier circuits SA is configured as a current mirror type, for example. Memory cells MC1 each corresponding to one bit are respectively electrically coupled to the neighborhoods of lattice-like intersecting points of the bit lines WBL and RBL and the control gate wirings CG, the source lines SL and the selection lines GS. A case in which one bit is constituted of one memory cell MC1, is illustrated by way of example here.

The memory cell MC1 has a data write/erase capacitance section (charge injection/discharge section) CWE, a data read MIS•FETQR, a capacitance section C and a selection MIS•FETQS. One electrode of the data write/erase charge injection/discharge section CWE for each bit is electrically coupled to its corresponding data write/erase bit line WBL. The other electrode (floating gate electrode FG) of the data write/erase charge injection/discharge section CWE is electrically coupled to its corresponding gate electrode (floating gate electrode FG) of each data read MIS•FETQR and coupled to one electrode (floating gate electrode FG) of the capacitance section C. The other electrode (control gate electrode CGW) of the capacitance section C is electrically coupled to its corresponding control gate wiring CG. On the other hand, the drain of the data read MIS•FETQR of one memory cell MC corresponding to each bit is electrically coupled to its corresponding data read bit line RBL via the selection MIS•FETQS, and the source thereof is electrically coupled to its corresponding source line SL. The gate electrode of the selection MIS•FETQS is electrically coupled to the selection line GS.

Examples illustrative of data write operations of such a flash memory will next be explained with reference to FIGS. 12 through 15.

Figure 12:
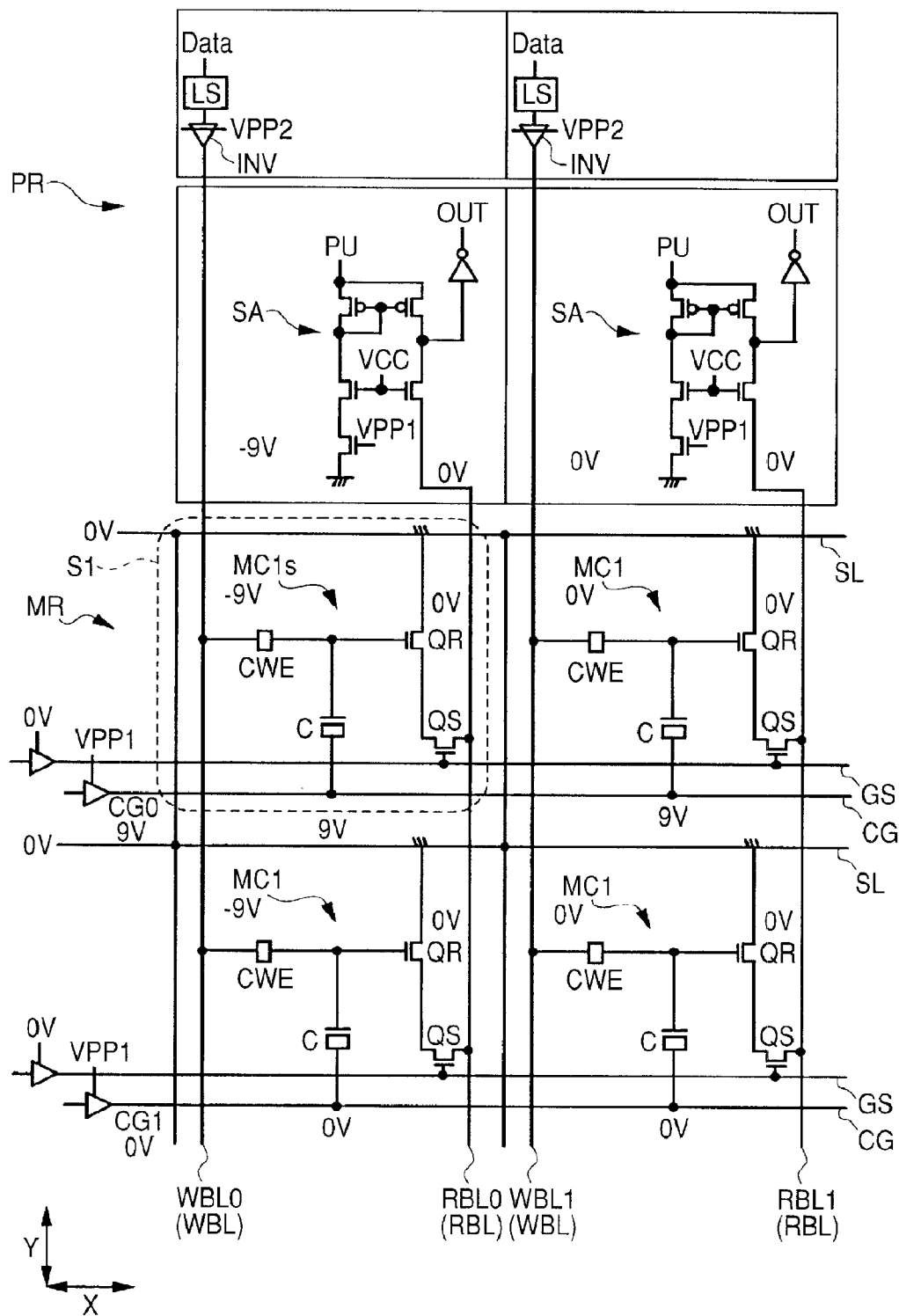
FIG. 12 is a circuit diagram showing voltages applied to respective parts at a data write operation of the flash memory shown in FIG. 11.

FIG. 12 shows voltages applied to respective parts at a data write operation of the flash memory shown in FIG. 11. A broken line S1 indicates a memory cell MC1 (hereinafter called selection memory cell MC1s) targeted for data writing. Incidentally, the injection of electrons in the floating gate electrode is defined as data writing. In reverse, the extraction or ejection of electrons from the floating gate electrode can also be defined as data writing.

Upon the writing of data, a positive control voltage of, for example, 9V or so is applied to a control gate wiring CG0 (CG) to which the other electrode of the capacitance section C in the selection memory cell MC1s is electrically coupled. A voltage of, for example, 0V is applied to a control gate wiring CG1 (CG) other that it. A negative voltage of, for example, −9V or so is applied to the data write/erase bit line WBL0 (WBL) to which one electrode of the data write/erase charge injection/discharge section CWE of the selection memory cell MC1s is electrically coupled. A voltage of, for example, 0V is applied to the data write/erase bit line WBL1 (WBL) other than it. For example, 0V is applied to the corresponding selection line GS, source line SL and data read bit line RBL. Thus, electrons are injected into the floating gate electrode of the data write/erase charge injection/discharge section CWE of the selection memory cell MC1s by an FN tunnel current at a channel entire surface to write data.

Figure 13:
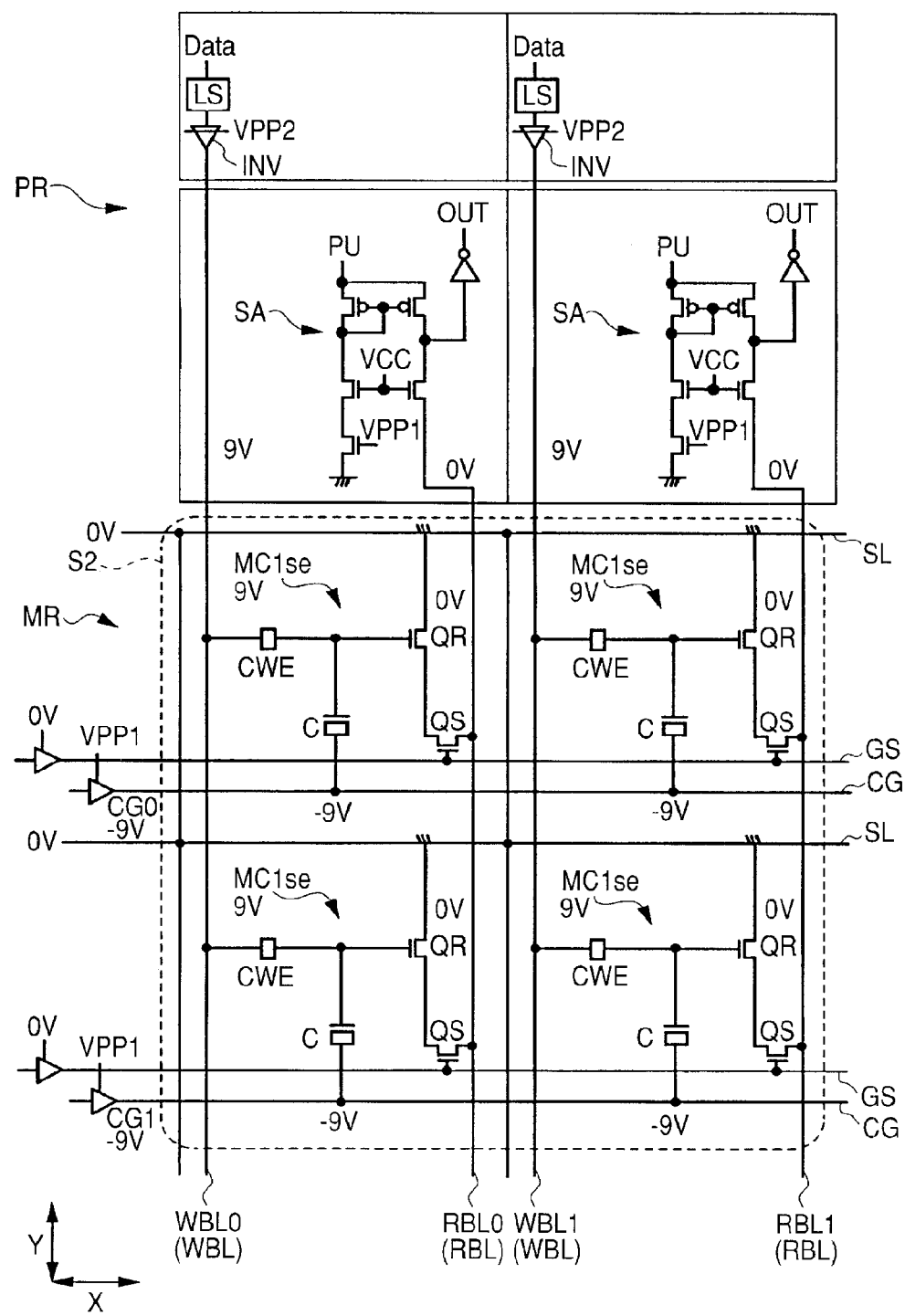
FIG. 13 is a circuit diagram illustrating voltages applied to the respective parts at a data batch-erase operation of the flash memory shown in FIG. 11.

Next, FIG. 13 shows voltages applied to the respective parts at a data batch-erase operation of the flash memory shown in FIG. 11. A broken line S2 indicates a plurality of memory cells MC1 (hereinafter called selection memory cells MC1se) targeted for data batch-erasure. Incidentally, the extraction or ejection of electrons from the floating gate electrode is defined as data erasure. In reverse, the injection of electrons into the floating gate electrode can also be defined as data erasure.

Upon data batch-erasing, a negative control voltage of, for example, −9V or so is applied to control gate wirings CG0 and CG1 (CG) to which the other electrodes of the capacitance sections C in the selection memory cells MC1se are electrically coupled. A negative voltage of, for example, −9V or so is applied to the data write/erase bit lines WBL0 and WBL1 (WBL) to which one electrodes of the data write/erase charge injection/discharge sections CWE of the selection memory cells MC1se are electrically coupled. For example, 0V is applied to the corresponding selection lines GS, source lines SL and data read bit lines RBL. Thus, electrons stored in the floating gate electrodes of the data write/erase charge injection/discharge sections CWE in the selection memory cells MC1se that perform the data batch-erasing are discharged by an FN tunnel current at the entire surface of a channel, thereby to batch-erase data of the selection memory cells MC1se.

Figure 14:
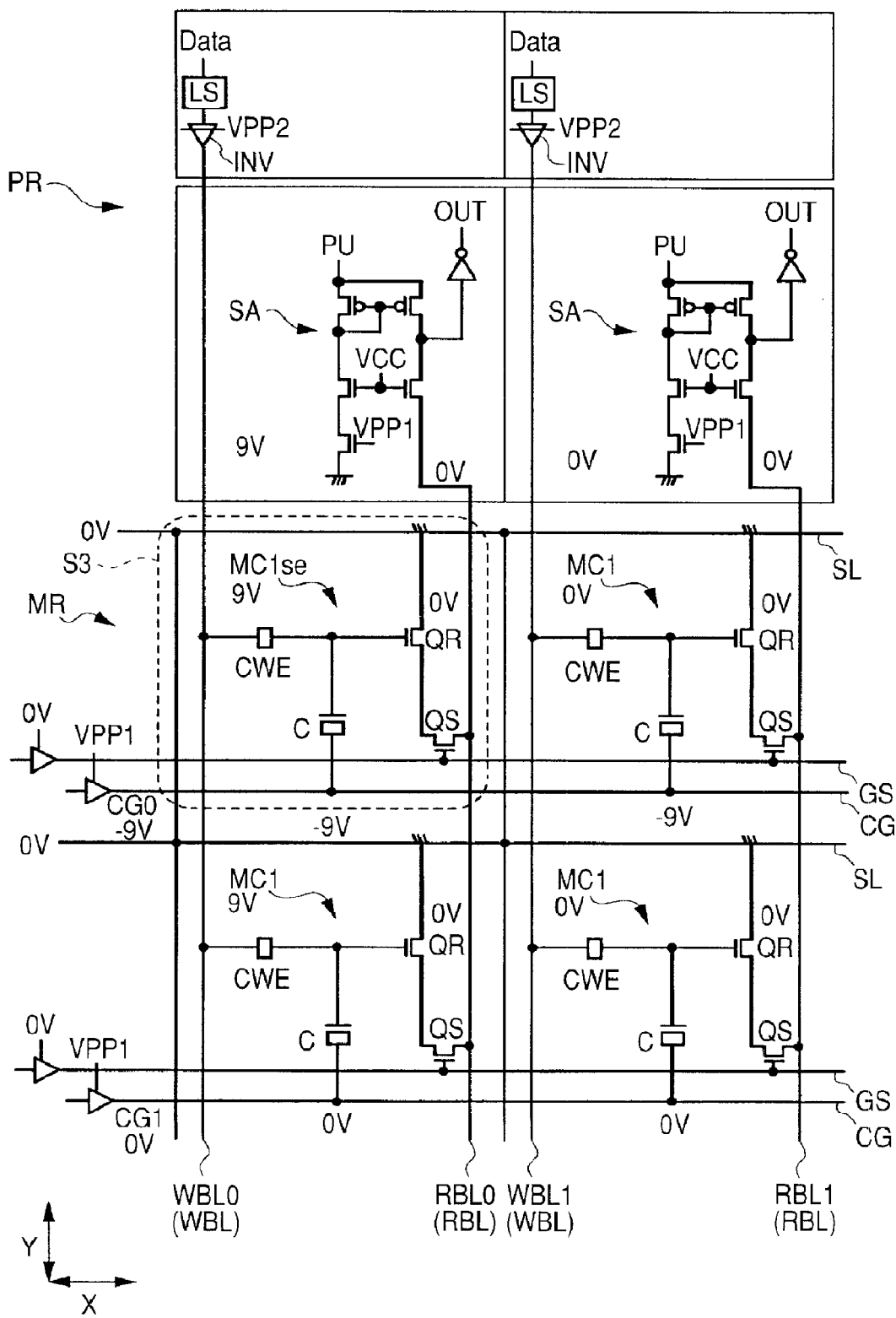
FIG. 14 is a circuit diagram depicting voltages applied to the respective parts at a data-bit unit erase operation of the flash memory shown in FIG. 11.

Next, FIG. 14 shows voltages applied to the respective parts at a data-bit unit erase operation of the flash memory shown in FIG. 11. A broken line S3 indicates a memory cell MC (called selection memory cell MC1se) targeted for data erasure.

Upon data-bit unit erasure, a negative control voltage of, for example, −9V or so is applied to a control gate wiring CG0 (CG) to which the other electrode of the capacitance section C in the selection memory cell MC1se is coupled. A voltage of, for example, 0V is applied to a control gate wiring CG1 (CG) other that it. A positive voltage of, for example, 9V or so is applied to the data write/erase bit line WBL0 (WBL) to which one electrode of the data write/erase charge injection/discharge section CWE of the selection memory cell MC1se is electrically coupled. A voltage of, for example, 0V is applied to the data write/erase bit line WBL1 (WBL) other than it. For example, 0V is applied to the corresponding selection line GS, source line SL and data read bit line RBL. Thus, electrons stored in the floating gate electrode of the data write/erase charge injection/discharge section CWE of the selection memory cell MC1se targeted for data erasure are discharged by an FN tunnel current at a channel entire surface, thereby erasing data of the selection memory cell MC1se targeted for data erasure.

Figure 15:
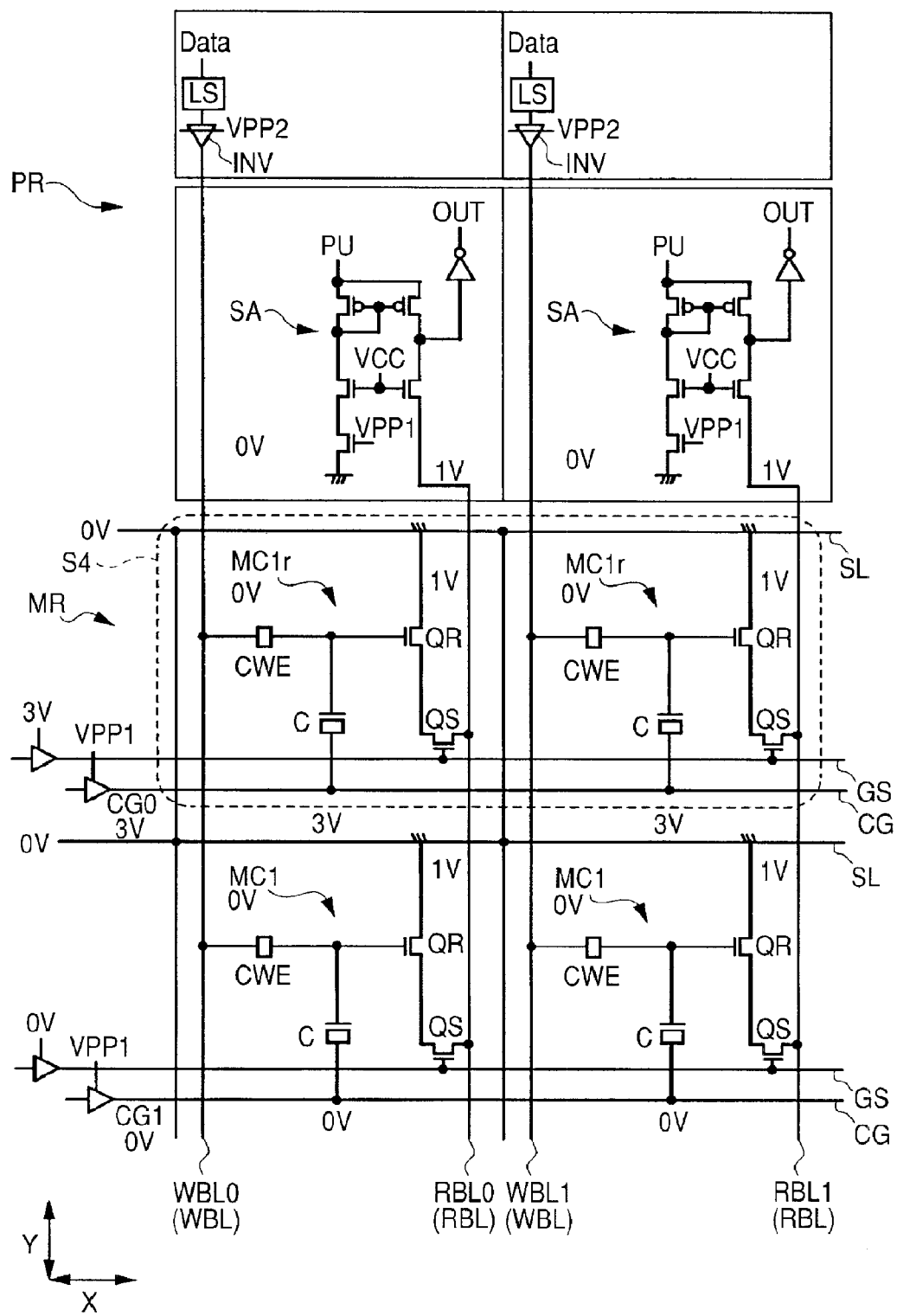
FIG. 15 is a circuit diagram showing voltages applied to the respective parts at a data read operation of the flash memory shown in FIG. 11.

Next, FIG. 15 shows voltages applied to the respective parts at a data read operation of the flash memory shown in FIG. 11. A broken line S4 indicates memory cells MC1 (hereinafter called selection memory cells MC1r) targeted for data reading.

Upon data reading, a control voltage of, for example, 3V or so is applied to its corresponding control gate wiring CG0 (CG) to which the other electrodes of the capacitance sections C of the selection memory cells MC1r are coupled. A voltage of, for example, 0V is applied to the corresponding control gate wiring CG1 (CG) other than above. A voltage of, for example, 0V or so is applied to the data write/erase bit lines WBL0 and WBL1 (WBL) to which one electrodes of the data write/erase charge injection/discharge sections CWE of the selection memory cells MC1r are electrically coupled. A voltage of, for example, 3V or so is applied to the corresponding selection line GS to which the gate electrodes of the selection MIS•FETQS of the selection memory cells MC1r are electrically coupled. A voltage of, for example, 1V or so is applied to the corresponding data read bit line RBL. Further, for example, 0V is applied to the corresponding source line SL. Thus, whether data stored in the corresponding selection memory cell MC1r is either 0 or 1 is read according to whether a drain current flows through a channel for each of data read MIS•FETQR of the selection memory cells MC1r targeted for data reading, under the condition that each of the data read MIS•FETQR of the selection memory cells MC1r targeted for data reading is on.

The manner of the memory cell MC1 at the operation of the flash memory according to the first embodiment will next be explained using FIGS. 16 through 18. Incidentally, the numerics inside the parentheses indicate applied voltages respectively.

Figure 16:
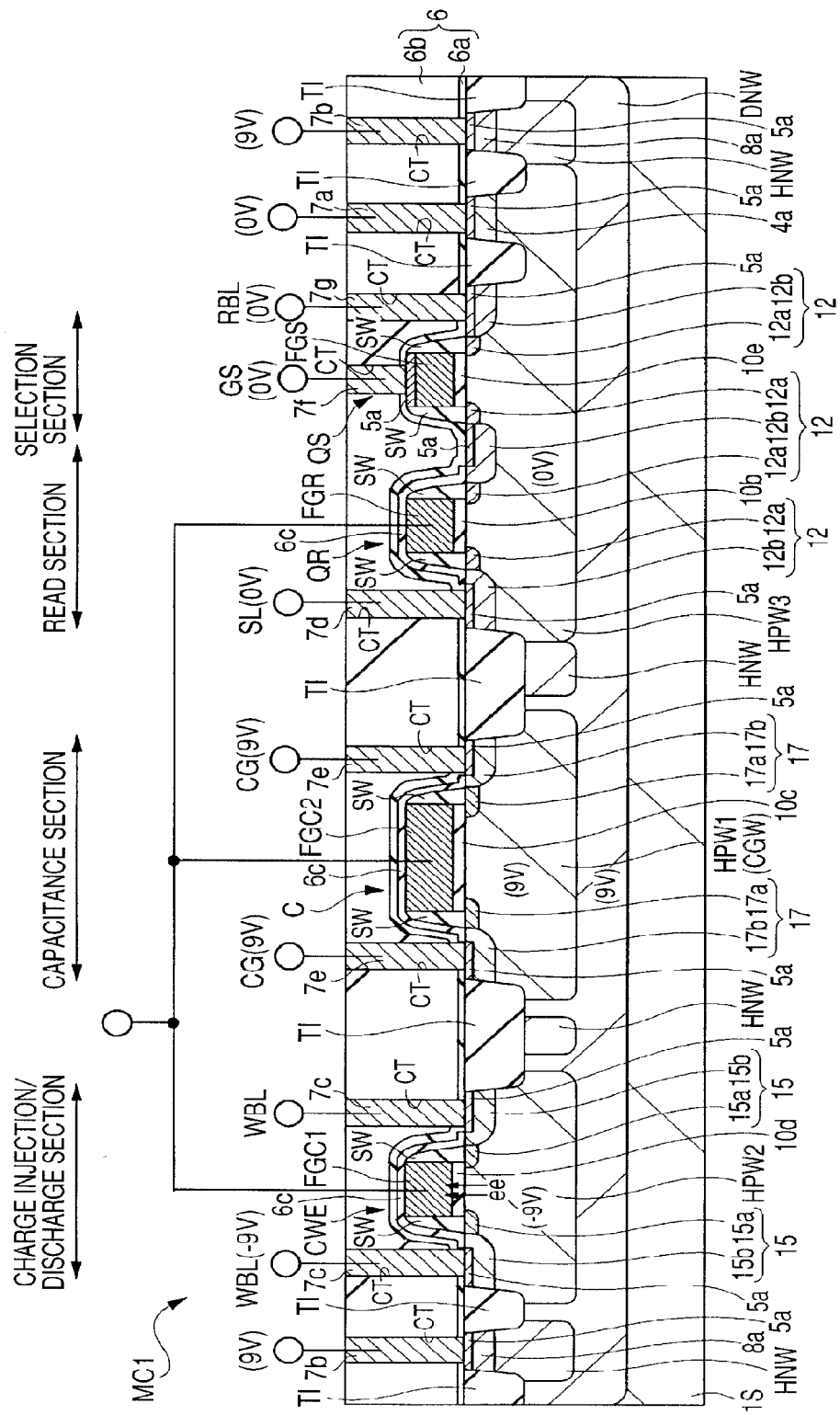
FIG. 16 is a cross-sectional view taken along line Y1-Y1 at the data write operation of the flash memory shown in FIG. 3.

FIG. 16 shows a cross-sectional view taken along line Y1-Y1 of FIG. 3 at the data write operation of the flash memory according to the first embodiment.

Here, a voltage of, for example, 9V or so is applied to the n-type well HNW and the n-type embedded well DNW through the conductor parts 7b to electrically isolate the substrate 1S and the p-type wells HPW1 through HPW3. A positive control voltage of, for example, 9V or so is applied from the control gate wiring CG to the control gate electrode CGW of the capacitance section C through each conductor part 7e. A negative voltage of, for example, −9V or so is applied from the data write/erase bit line WBL to one electrode (p-type semiconductor region 15 and p-type well HPW2) of the charge injection/discharge section CWE through the corresponding conductor part 7c.

For example, 0V is applied to the p-type well HPW3 through its corresponding conductor part 7a. For example, 0V is applied from the selection line GS to the gate electrode FGS of the selection MIS•FETQS through the corresponding conductor part 7f. For example, 0V is applied from the source line SL to one n-type semiconductor region 12 of the data read MIS•FETQR through the corresponding conductor part 7d. For example, 0V is applied from the data read bit line RBL to one n-type semiconductor region 12 of the selection MIS•FETQS through the corresponding conductor part 7g.

Thus, electrons e of the p-type well HPW2 are injected into the corresponding capacitive electrode FGC1 (floating gate electrode FG) through the capacitive insulating film 10d by an FN tunnel current at a channel entire surface in the data write/erase charge injection/discharge section CWE of the selected memory cell MC1 thereby to write data therein.

The effect of forming one of the semiconductor regions 15 of the charge injection/discharge section CWE by the n⁻-type semiconductor region 15a and the n⁺-type semiconductor region 15b as described above will be explained here. When the n-type semiconductor regions 15 exist, the formation of the inversion layer extending from each n-type semiconductor region 15 is promoted. The electrons are minority carriers in the p-type semiconductor, whereas the electrons are majority carriers in the n-type semiconductor. Therefore, the electrons to be injected can be easily supplied to the inversion layer placed directly below the capacitive electrode FGC1. As a result, since effective coupling capacitance can be increased, the potential of the capacitive electrode FGC1 can be controlled efficiently. It is thus possible to enhance a data write rate. A variation in the data write rate can also be reduced.

Figure 17:
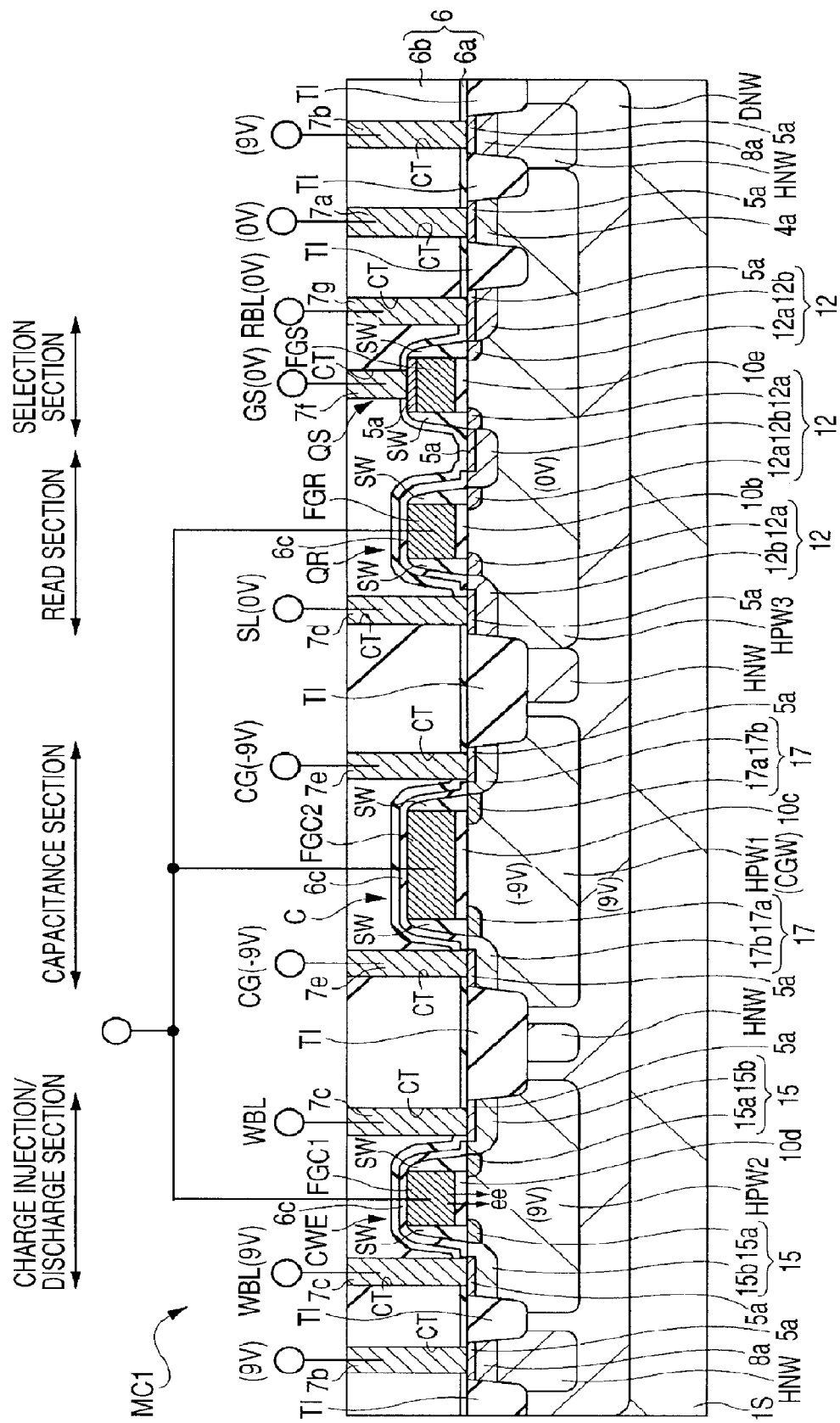
FIG. 17 is a cross-sectional view taken along line Y1-Y1 at the data erase operation of the flash memory shown in FIG. 3.

Next, FIG. 17 shows a cross-sectional view taken along line Y1-Y1 of FIG. 3 at a data erase operation of the flash memory according to the first embodiment.

Here, a voltage of, for example, 9V or so is applied to the n-type well HNW and the n-type embedded well DNW through the conductor parts 7b to electrically isolate the substrate 1S and the p-type wells HPW1 through HPW3. A negative control voltage of, for example, −9V or so is applied from the control gate wiring CG to the control gate electrode CGW of the capacitance section C through each conductor part 7e. A positive voltage of, for example, 9V or so is applied from the data write/erase bit line WBL to one electrode (p-type semiconductor region 15 and p-type well HPW2) of the charge injection/discharge section CWE through the corresponding conductor part 7c.

For example, 0V is applied to the p-type well HPW3 through its corresponding conductor part 7a. For example, 0V is applied from the selection line GS to the gate electrode FGS of the selection MIS•FETQS through the corresponding conductor part 7f. For example, 0V is applied from the source line SL to one n-type semiconductor region 12 of the data read MIS•FETQR through the corresponding conductor part 7d. For example, 0V is applied from the data read bit line RBL to one n-type semiconductor region 12 of the selection MIS•FETQS through the corresponding conductor part 7g.

Thus, the electrons e stored in the capacitive electrode FGC1 (floating gate electrode FG) are discharged to the p-type well HPW2 through the capacitive insulating film 10d by an FN tunnel current at the channel entire surface in the data write/erase charge injection/discharge section CWE of the selected memory cell MC1 thereby to erase data.

The effect of forming one of the semiconductor regions 17 of the capacitance section C by the n⁻-type semiconductor region 17a and the n⁺-type semiconductor region 17b as described above will be explained here. Upon data erasure, the electrons can smoothly be supplied to directly below the capacitive insulating film 10c by addition of the n-type semiconductor regions 17. Therefore, the p-type well HPW1 can promptly be fixed to −9V because the inversion layer can quickly be formed. As a result, since effective coupling capacitance can be increased, the potential of the capacitive electrode FGC2 can be controlled efficiently. It is thus possible to enhance a data erase rate. A variation in the data erase rate can also be reduced.

Figure 18:
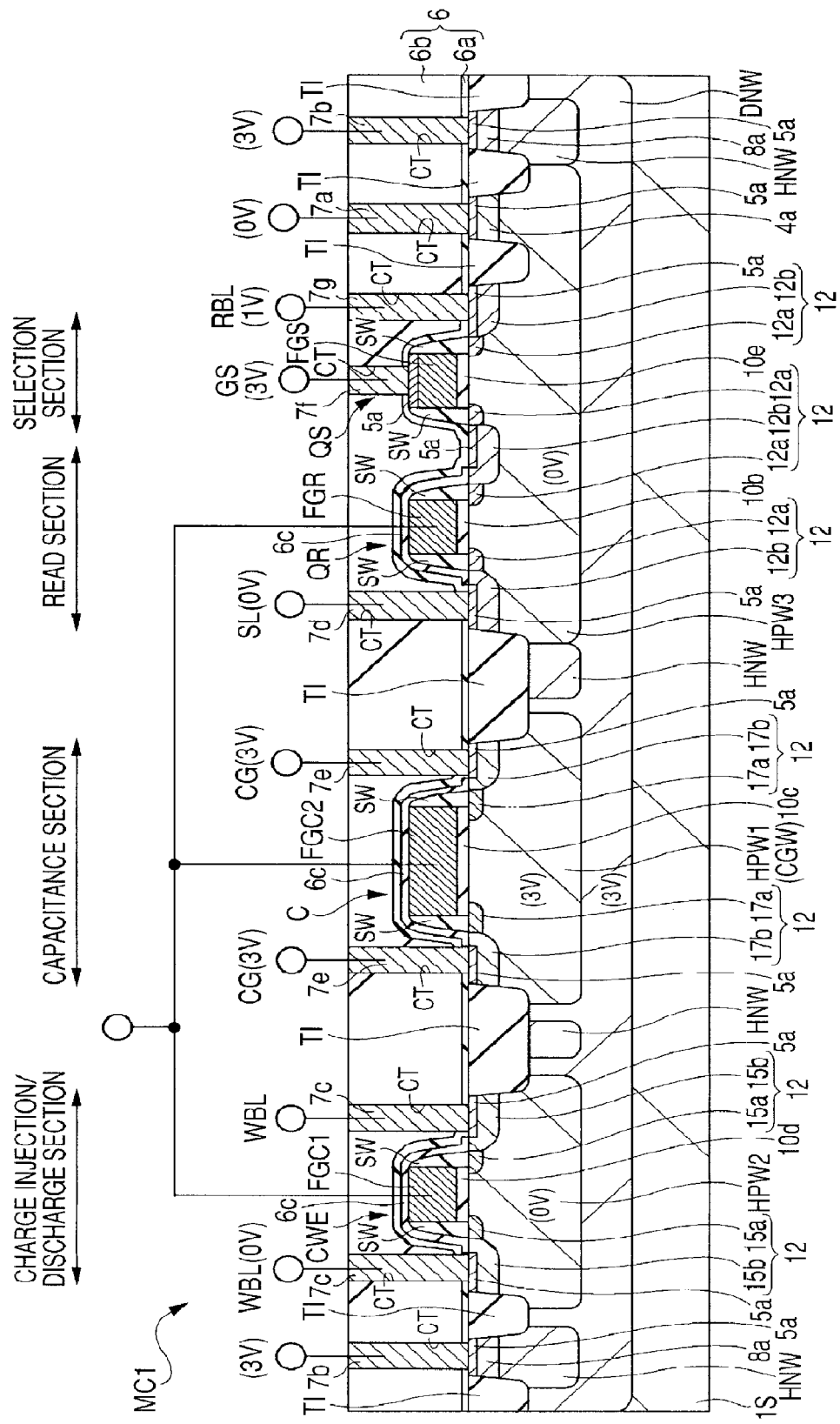
FIG. 18 is a cross-sectional view taken along line Y1-Y1 at the data read operation of the flash memory shown in FIG. 3.

Next, FIG. 18 shows a cross-sectional view taken along line Y1-Y1 of FIG. 3 at a data read operation of the flash memory according to the first embodiment.

Here, a voltage of, for example, 3V or so is applied to the n-type well HNW and the n-type embedded well DNW through each conductor part 7b to electrically isolate the substrate 1S and the p-type wells HPW1 through HPW3.

A positive control voltage of, for example, 3V or so is applied from the control gate wirings CG to the control gate electrode CGW of the capacitance section C through the conductor parts 7e. Thus, the positive voltage is applied to the gate electrode FGR of the data read MIS•FETQR.

For example, 0V is applied to the p-type well HPW3 through its corresponding conductor part 7a. For example, 3V is applied from the selection line GS to the gate electrode FGS of the selection MIS•FETQS through the corresponding conductor part 7f. For example, 0V is applied from the source line SL to one n-type semiconductor region 12 of the data read MIS•FETQR through the corresponding conductor part 7d. For example, 1V is applied from the data read bit line RBL to one n-type semiconductor region 12 of the selection MIS•FETQS through the corresponding conductor part 7g.

For example, a voltage of, for example, 0V is applied from the data write/erase bit line WBL to one electrode (p-type semiconductor region 15 and p-type well HPW2) of the charge injection/discharge section CWE through the corresponding conductor part 7c.

Thus, whether data stored in the corresponding selection memory cell MC1 is either 0 or 1 is read according to whether a drain current flows through a channel for the data read MIS•FETQR of the selected memory cell MC1, under the condition that the data read MIS•FETQR of the selected memory cell MC1 is on.

According to the first embodiment referred to above, the data rewrite area (charge injection/discharge section CWE), the data read area (data read MIS•FETQR) and the capacitance coupling area (capacitance section C) are formed in their corresponding separate p-type wells HPW1 through HPW3 and respectively separated by the n-type well HNW and the n-type embedded well DNW. Data rewriting is performed by each capacitive element.

Thus, since there is no need to provide the cut-off transistor in the data rewrite area of the flash memory, miniaturization of the semiconductor device can be promoted.

Since the data rewriting element is formed of the capacitive element, and the p-type semiconductor regions 15 and the p-type well HPW2 become identical in potential upon data rewriting by the FN tunnel current at the entire surface of the channel, the problem of a junction breakdown voltage no longer occurs. Therefore, it is possible to suppress or prevent deterioration of the memory cell MC1 of the flash memory and enhance the reliability of operation of the flash memory.

Since the scale of each peripheral circuit of the flash memory can be less reduced because no timing design is required, miniaturization of the semiconductor device can be promoted. Since the data rewriting can be done by the FN tunnel current at the channel entire surface, which is suitable for rewriting or reloading of a single power supply that is smallest in current consumption and held at a low voltage, single powering by an internal step-up circuit is easy.

Further, since the channel FN tunnel current free of the occurrence of holes is used upon the data writing/erasure, the number of rewritings of data can be enhanced.

The data rewrite area (charge injection/discharge section CWE) and the data read area (data read MIS•FETQR) are formed within their corresponding separate p-type wells HPW2 and HPW3, thereby making it possible to stabilize data rewriting. It is therefore possible to enhance the reliability of operation of the flash memory.

Second Preferred Embodiment

A second embodiment is different from the first embodiment in the following configurations in particular.

The first is that the configurations of a pair of semiconductor regions for source/drain, of a data read MIS•FET of each memory cell are identical to the configurations (including the p-type hollow regions) of the pair of semiconductor regions for source/drain, of the n channel type MIS•FET of the low breakdown section (1.5V device) in the main circuit.

The second is that the gate length of each data write/erase charge injection/discharge section of the memory cell is made short, and part of a p-type semiconductor region of the charge injection/discharge section is caused to extend (diffuse into) to a surface layer of a substrate placed directly below a capacitive electrode.

The third is that p-type wells of the charge injection/discharge sections adjacent to each other are separated by $n^+$-type semiconductor regions (each corresponding to an $n^+$-type diffusion layer) higher than the n-type wells in impurity concentration.

Figure 19:
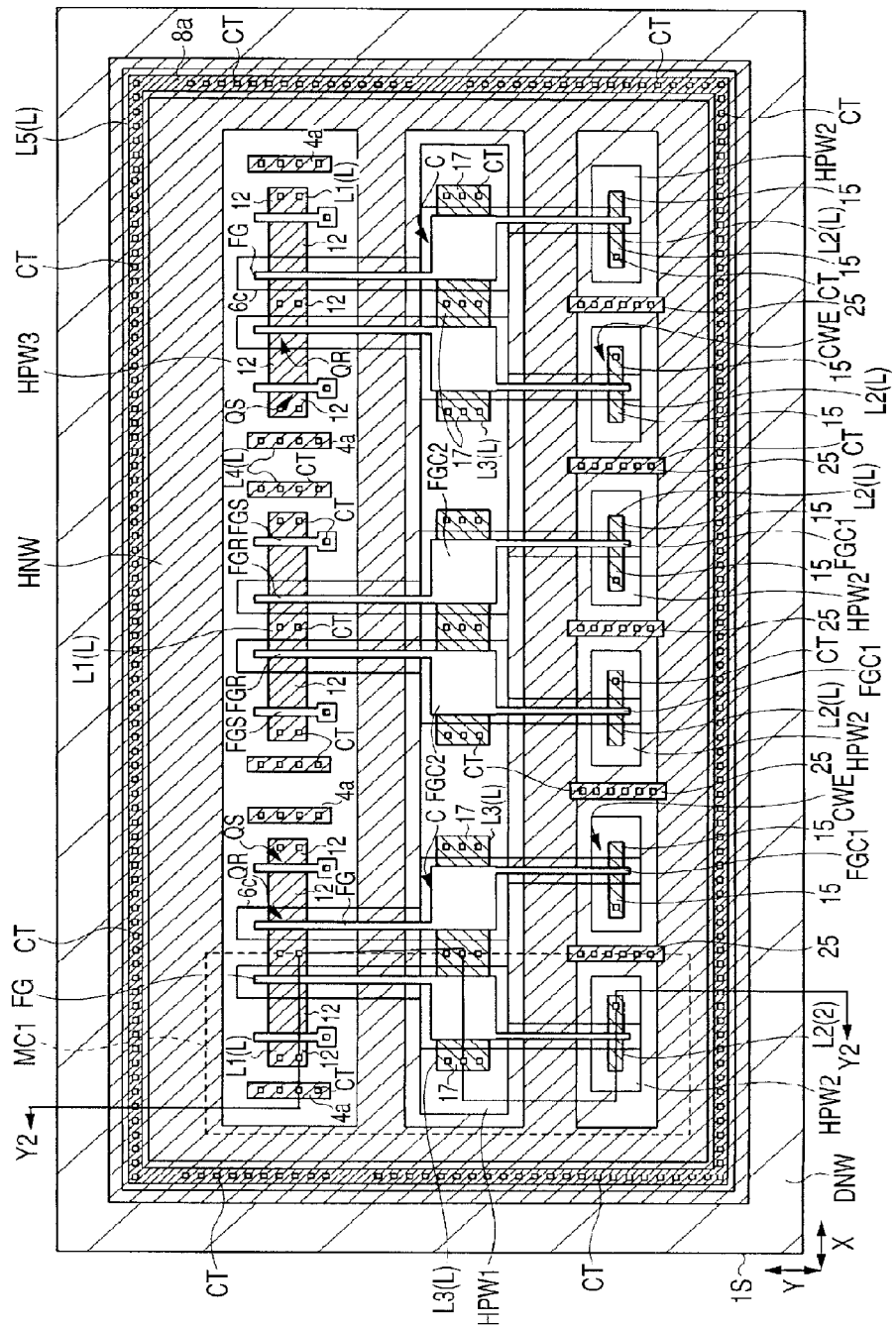
FIG. 19 is a plan view of a flash memory for a semiconductor device illustrative of a second embodiment of the present invention.
Figure 20:
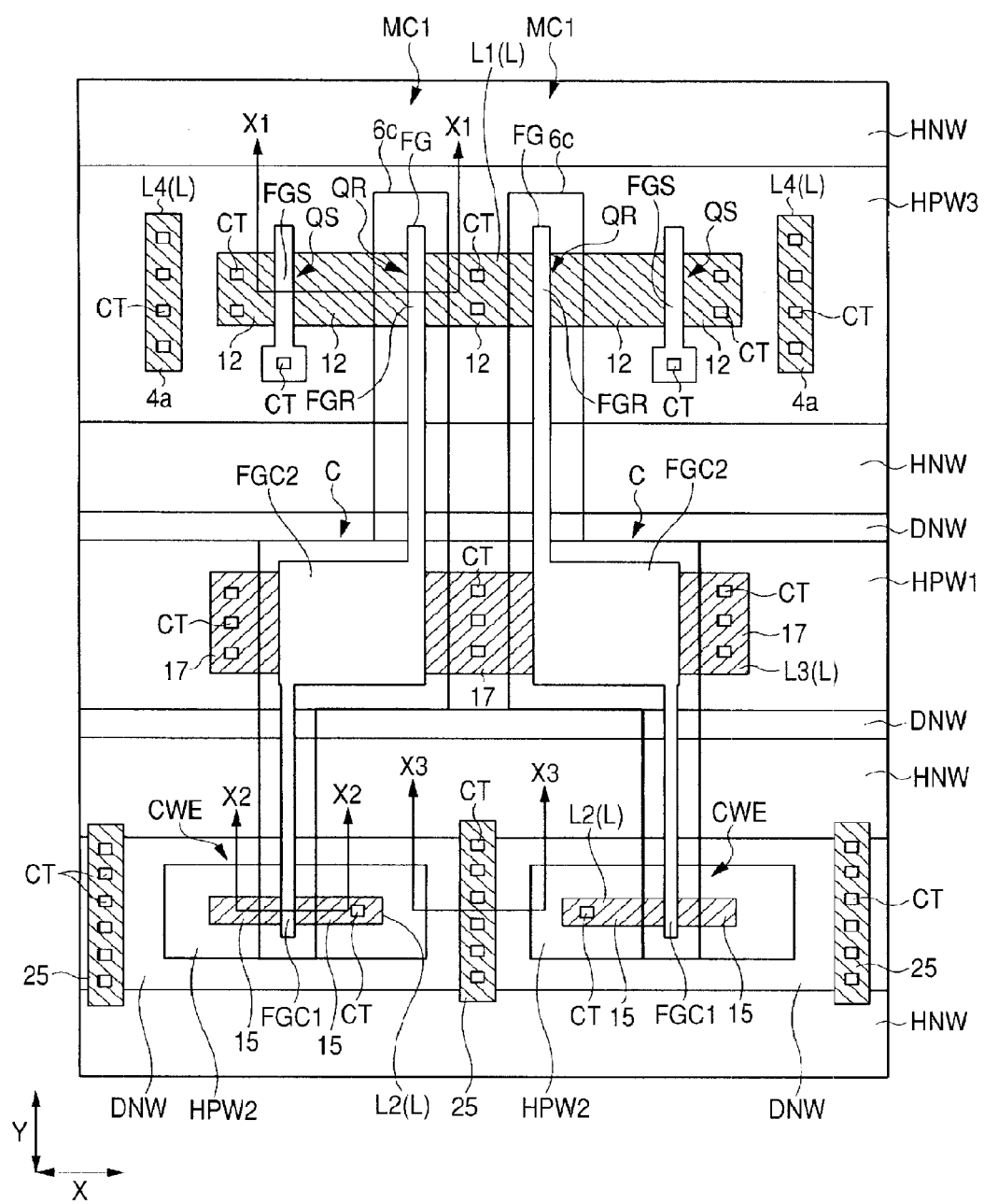
FIG. 20 is a fragmentary enlarged plan view of the flash memory shown in FIG. 19.
Figure 21:
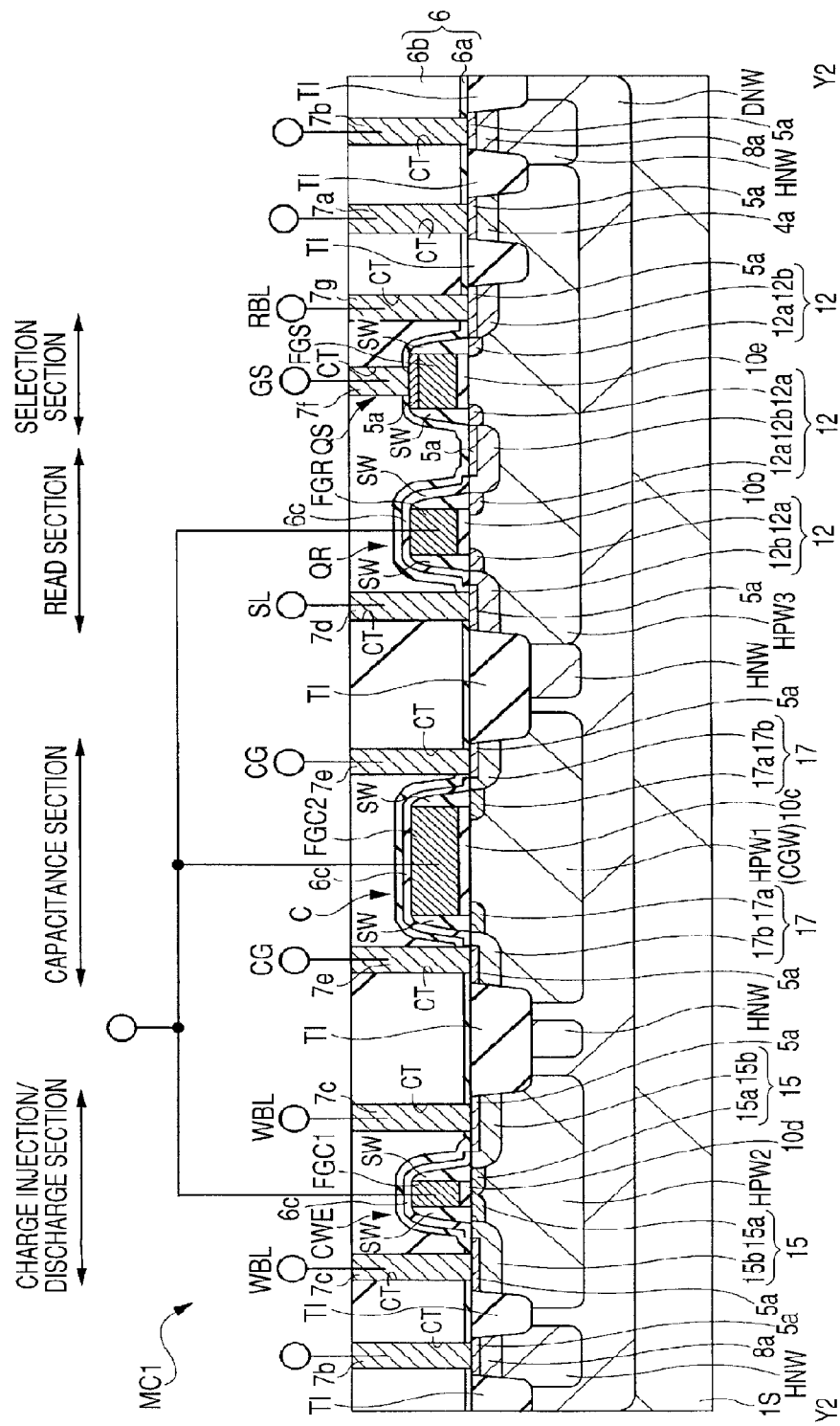
FIG. 21 is a cross-sectional view taken along line Y2-Y2 of FIG. 19.
Figure 22:
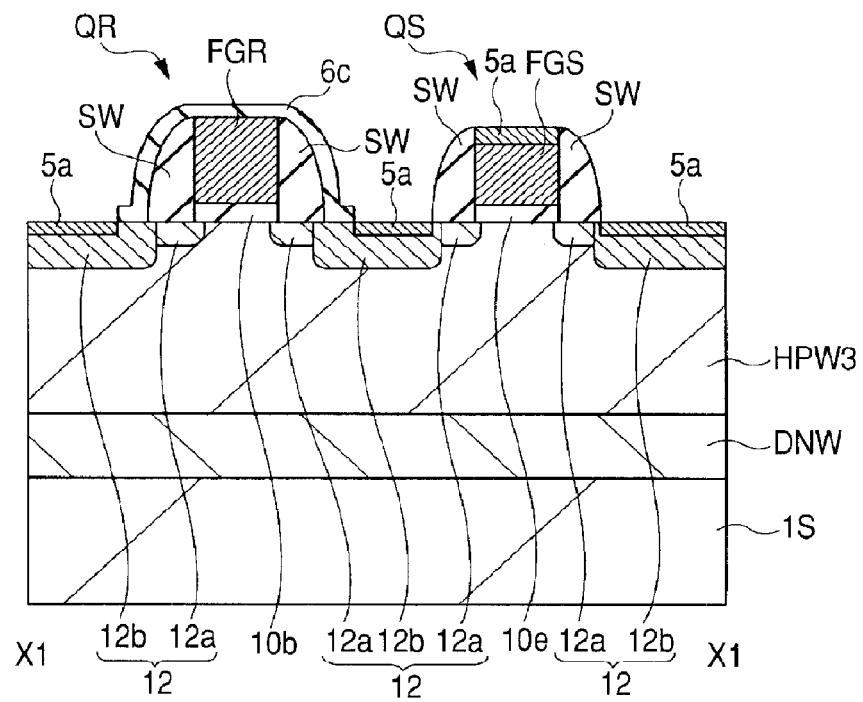
FIG. 22 is a cross-sectional view taken along line X1-X1 of FIG. 20.
Figure 23:
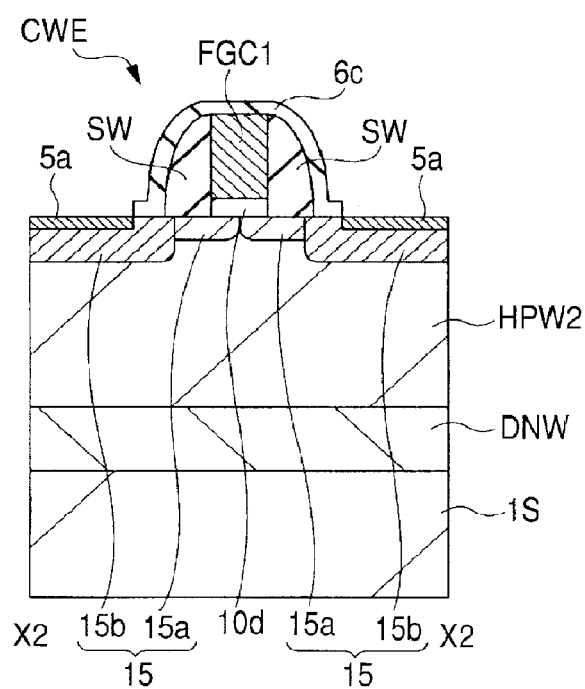
FIG. 23 is a cross-sectional view taken along line X2-X2 of FIG. 20.
Figure 24:
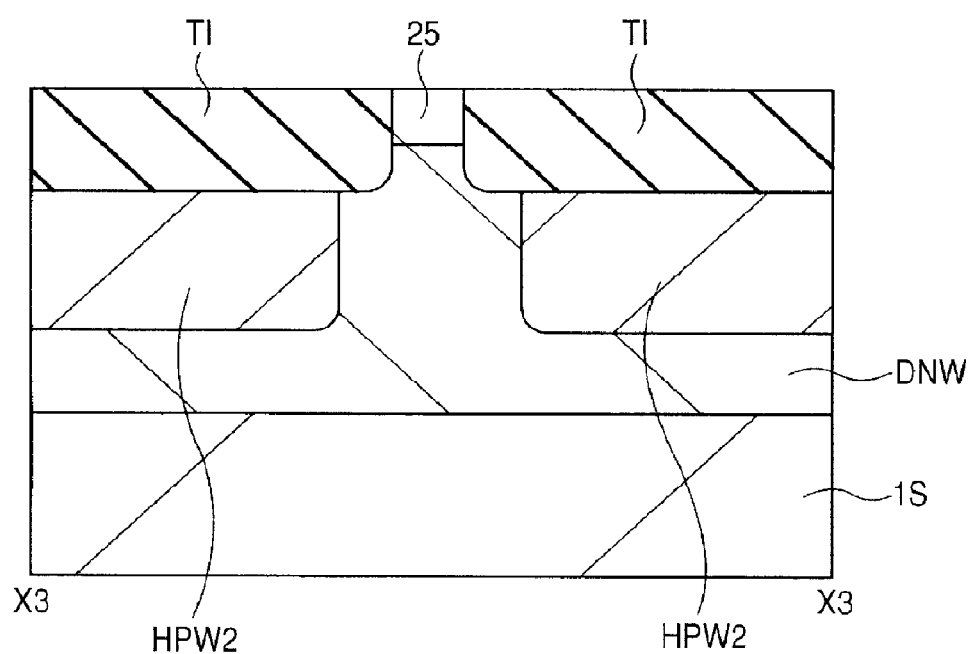
FIG. 24 is a cross-sectional view taken along line X3-X3 of FIG. 20.

A specific example of a configuration of a flash memory for a semiconductor device according to the second embodiment will be explained below with reference to FIGS. 19 through 24. FIG. 19 is a plan view of the flash memory for the semiconductor device illustrative of the second embodiment, FIG. 20 is a fragmentary enlarged plan view of the flash memory shown in FIG. 19, FIG. 21 is a cross-sectional view taken along line Y2-Y2 of FIG. 19, FIG. 22 is a cross-sectional view taken along line X1-X1 of FIG. 20, FIG. 23 is a cross-sectional view taken along line X2-X2 of FIG. 20, and FIG. 24 is a cross-sectional view taken along line X3-X3 of FIG. 20, respectively. Incidentally, although FIGS. 19 and 20 are plan views, parts thereof are hatched to make it easy to see the drawings.

In the second embodiment, as described above, the pair of semiconductor regions for source/drain, of the data read MIS•FETQR of each memory cell MC1 is made identical in configuration to the pair of semiconductor regions for source/drain, of the n channel type MIS•FETQLN2 of the low breakdown section (1.5V device) in the main circuit.

In this case, the pair of semiconductor regions for source/drain, of each data read MIS•FETQR has n-type semiconductor regions 12 each constituted of an $n^-$-type semiconductor region 12a and an $n^+$-type semiconductor region 12b as described in the first embodiment, and further includes p-type semiconductor regions (p-type hollow regions or p-type punchthrough stopper regions) formed near the ends on the channel side, of the $n^-$-type semiconductor regions 12a.

Thus, since a short channel effect at each data read MIS•FETQR can be suppressed or prevented, the data read MIS•FETQR can be miniaturized. Therefore, the area of a memory cell array MR can be scaled down because the size of the memory cell MC1 can be reduced. Further, the storage capacity of the memory can be increased.

A pair of semiconductor regions for source/drain, of each selection MIS•FETQS of the memory cell MC1 is identical in configuration to the pair of semiconductor regions for source/drain, of the n channel type MIS•FETQLN2 of the low breakdown section (1.5V device) in the main circuit.

In this case, the pair of semiconductor regions for source/drain, of each selection MIS•FETQS has n-type semiconductor regions 12 each constituted of an $n^-$-type semiconductor region 12a and an $n^+$-type semiconductor region 12b as described in the first embodiment, and further includes p-type semiconductor regions (p-type hollow regions or p-type punchthrough stopper regions) formed near the ends on the channel side, of the $n^-$-type semiconductor regions 12a.

Thus, since a short channel effect at each selection MIS•FETQS can be suppressed or prevented, the selection MIS•FETQS can be miniaturized. Therefore, the area of the memory cell array MR can be scaled down because the size of the memory cell MC1 can be reduced. Further, the storage capacity of the memory can be increased.

Since only a voltage of 0V or 1V is applied to the pairs of semiconductor regions for source/drain, of the data read MIS•FETQR and selection MIS•FETQS upon operation of the memory cell MC1, the data read MIS•FETQR and the selection MIS•FETQS can be formed by 1.5V-system MIS•FETs.

However, the thickness of each of gate insulating films 10b and 10e for the data read MIS•FETQR and selection MIS•FETQS is identical to that described in the first embodiment and formed thicker than the gate insulating film 10h for the n channel type MIS•FETQLN2 of the low breakdown section (1.5V device) in the main circuit. This is because a difference in potential of 3V or more occurs between the gate insulating films 10b and 10e upon the operation of the memory cell.

The length (gate length) in a second direction X, of a capacitive electrode FGC1 of a data write/erase charge injection/discharge section CWE of each memory cell MC1 is shorter than the length (gate length) in the second direction X, of a gate electrode FGR of each data read MIS•FETQR. Parts (parts of $p^-$-type semiconductor regions 15a and 15a) of a pair of p-type semiconductor regions 15 and 15 on both sides as viewed in the second direction X, of the capacitive electrode FGC1 of the charge injection/discharge section CWE are extended over a surface layer of a substrate 1S placed directly below the capacitive electrode FGC1. A case in which the tips or leading end portions on the channel side, of the $p^-$-type semiconductor regions 15a and 15a of the pair of p-type semiconductor regions 15 and 15 intrude directly below the capacitive electrode FGC1 and are held in contact with each other, is illustrated by way of example as shown in FIGS. 21 and 23 here.

When a negative voltage of, for example, −9V or so is applied to its corresponding p-type well HPW2 of the charge injection/discharge section CWE upon data writing where the parts of the p-type semiconductor regions 15 of the charge injection/discharge section CWE are not extended over the surface layer of the substrate 1S directly below the capacitive electrode FGC1 as described in the first embodiment, a depletion layer is formed in the surface layer of the substrate 1S directly below the capacitive insulating film 10d. As a result, there are cases in which coupling capacitance is decreased and a data write rate is reduced, and a variation occurs in the data write rate.

On the other hand, when the parts of the p-type semiconductor regions 15 are extended (diffused) directly below the capacitive electrode FGC1 as in the second embodiment, the concentration of a p-type impurity lying in the surface layer of the substrate 1S directly below the capacitive electrode FGC1 can be made high. It is therefore possible to suppress or prevent the formation of the depletion layer in the surface layer of the substrate 1S directly below the capacitive electrode FGC1 upon data rewriting (write/erase). Thus, since effective coupling capacitance can be increased, the potential of the capacitive electrode FGC1 (floating gate electrode FG) can be controlled efficiently. It is thus possible to enhance a data write rate. A variation in the data write rate can also be reduced.

In the second embodiment, the p-type wells HPW2 of the charge injection/discharge sections CWE adjacent to each other along the second direction X are separated from each other by an $n^+$-type semiconductor region ($n^+$-type diffusion layer) 25 formed between the p-type wells HPW2 adjacent to each other within the memory cell array MR. The impurity concentration of the n+-type semiconductor region 25 is higher than the impurity concentration of each of the above n-type well HNW and n-type embedded well DNW.

When the p-type wells HPW2 and HPW2 of the charge injection/discharge sections CWE adjacent to each other are separated from each other by the n-type well HNW and the n-type embedded well DNW as in the first embodiment, there is a limit to narrow the adjoining space or interval between the p-type wells HPW2 and HPW2 from the viewpoint of inhibition of the formation of a parasitic MOS•FET between the adjacent p-type wells HPW2 and HPW2, for example.

On the other hand, since the impurity concentration of the n+-type semiconductor region 25 is higher than the impurity concentration of each of the n-type well HNW and the n-type embedded well DNW where the p-type wells HPW2 adjacent to each other along the second direction X are separated by the n+-type semiconductor region (n+-type diffusion layer) 25 as in the second embodiment, the formation of the parasitic MOS•FET can be suppressed or prevented even though the adjoining space between the p-type wells HPW2 and HPW2 is made narrow. Thus, the adjoining space between the p-type wells HPW2 and HPW2 adjacent to each other along the second direction X can be narrowed as compared with first embodiment. It is therefore possible to reduce the area of the memory cell array MR. Further, the storage capacity of the memory can be increased.

The n+-type semiconductor region 25 is formed simultaneously upon formation of each device in the main circuit. Thus, the number of process steps for manufacturing the semiconductor device does not increase even supposing that the n+-type semiconductor region 25 was formed. It is thus possible to prevent the time required to manufacture the semiconductor device from increasing and prevent an increase in the cost of semiconductor device.

One example of a method for manufacturing a semiconductor device according to the present embodiment will next be explained with reference to FIGS. 25 through 42. Incidentally, FIGS. 25 through 42 respectively show fragmentary cross-sectional views illustrative of a substrate 1S (corresponding to an approximately circular semiconductor thin board or plate called a wafer in this stage) during the manufacturing process of the semiconductor device according to the present embodiment. Here, a low breakdown section and a flash memory are shown and a high breakdown section is not illustrated. Selection MISs are also omitted.

Figure 25:
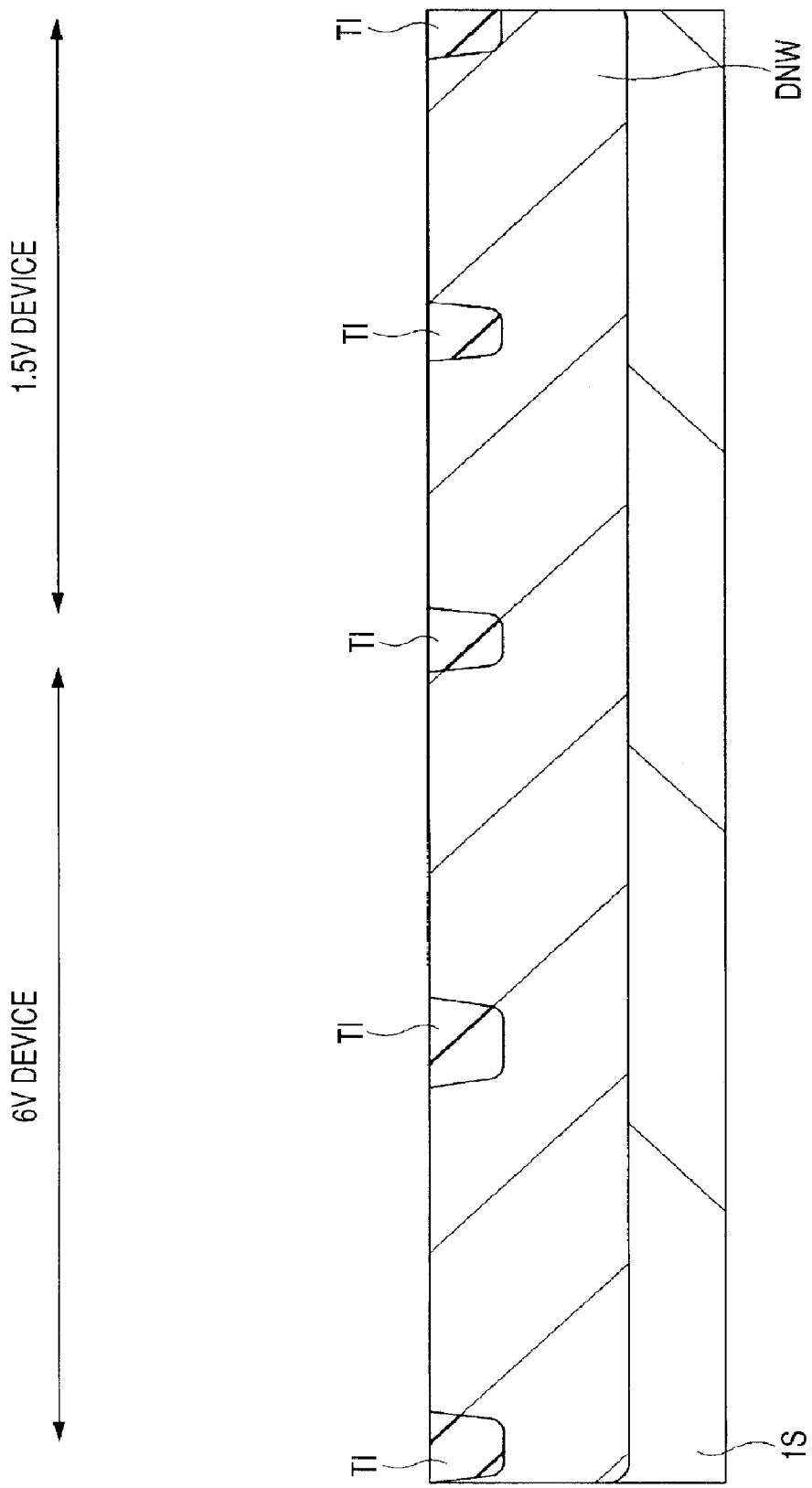
FIG. 25 is a fragmentary cross-sectional view showing a semiconductor substrate lying in a main circuit forming area during a process for manufacturing a semiconductor device, showing one embodiment of the present invention.
Figure 26:
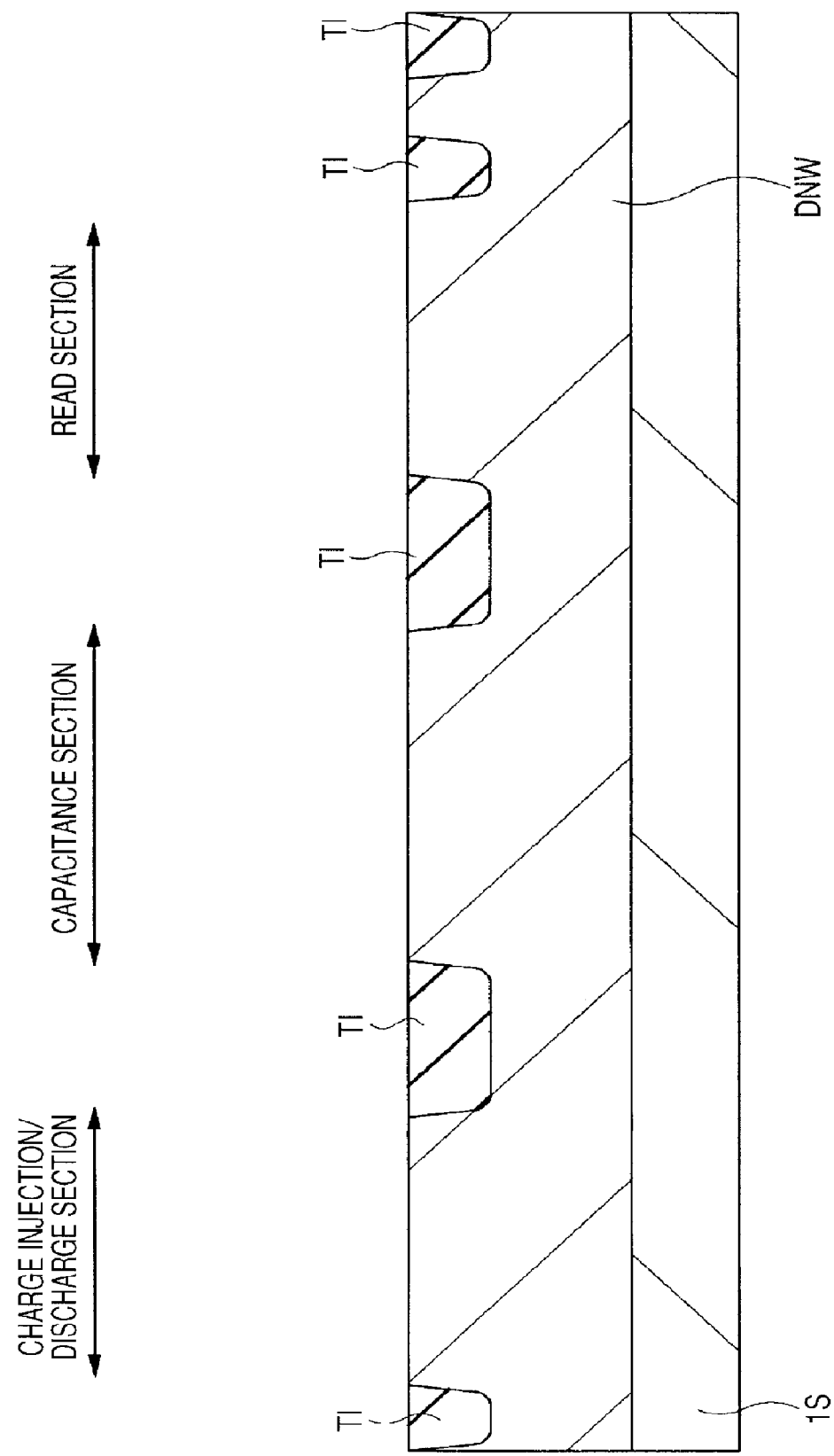
FIG. 26 is a fragmentary cross-sectional view showing the semiconductor substrate lying in a flash memory forming area at the same manufacturing process as FIG. 25.

As shown in FIGS. 25 and 26, a p-type substrate 1S (wafer) is first prepared. The substrate 1S has a first main surface and a second main surface located on the sides opposite to each other along its thickness direction.

Subsequently, an n-type embedded well DNW is formed simultaneously in the low breakdown section, a memory cell forming area of the flash memory and the high breakdown section by a photolithography (hereinafter called simply lithography) process and an ion implanting process or the like. The lithography process is a series of process steps for forming desired resist patterns by application of a photoresist film (hereinafter called simply resist) film, exposure and development or the like. In the ion implanting process, desired impurities are selectively introduced into desired portions of the substrate 1S with the resist patterns formed over the main surface of the substrate 1S through the lithography process as masks. The resist patterns shown here are defined as such patterns that impurity introducing regions are exposed and regions other than the same are covered.

Incidentally, a p-type embedded well DPW is formed by the photolithography process and the ion implanting process or the like in the high breakdown section prior to the impurity introducing step for forming the n-type embedded well DNW.

Thereafter, isolation trenches are formed in an isolation area of the first main surface of the substrate 1S. Afterwards, an insulating film is embedded into the isolation trenches to form trench-type isolation parts TI. Thus, active regions are defined. The isolation parts TI may be formed before the process steps for forming the p-type embedded well DPW and n-type embedded well DNW.

Next, the n-type semiconductor region NV is formed in its corresponding n channel type MIS•FET forming region of the high breakdown section by the lithography process and the ion implanting process or the like. The p-type semiconductor region PV is formed in its corresponding p channel type MIS•FET forming region of the high breakdown section by the lithography process and the ion implanting process or the like (see FIG. 9). The impurity concentration of the n-type semiconductor region NV is higher than that of the n-type embedded well DNW, and the impurity concentration of the p-type semiconductor region PV is higher than that of the p-type embedded well DPW.

Figure 27:
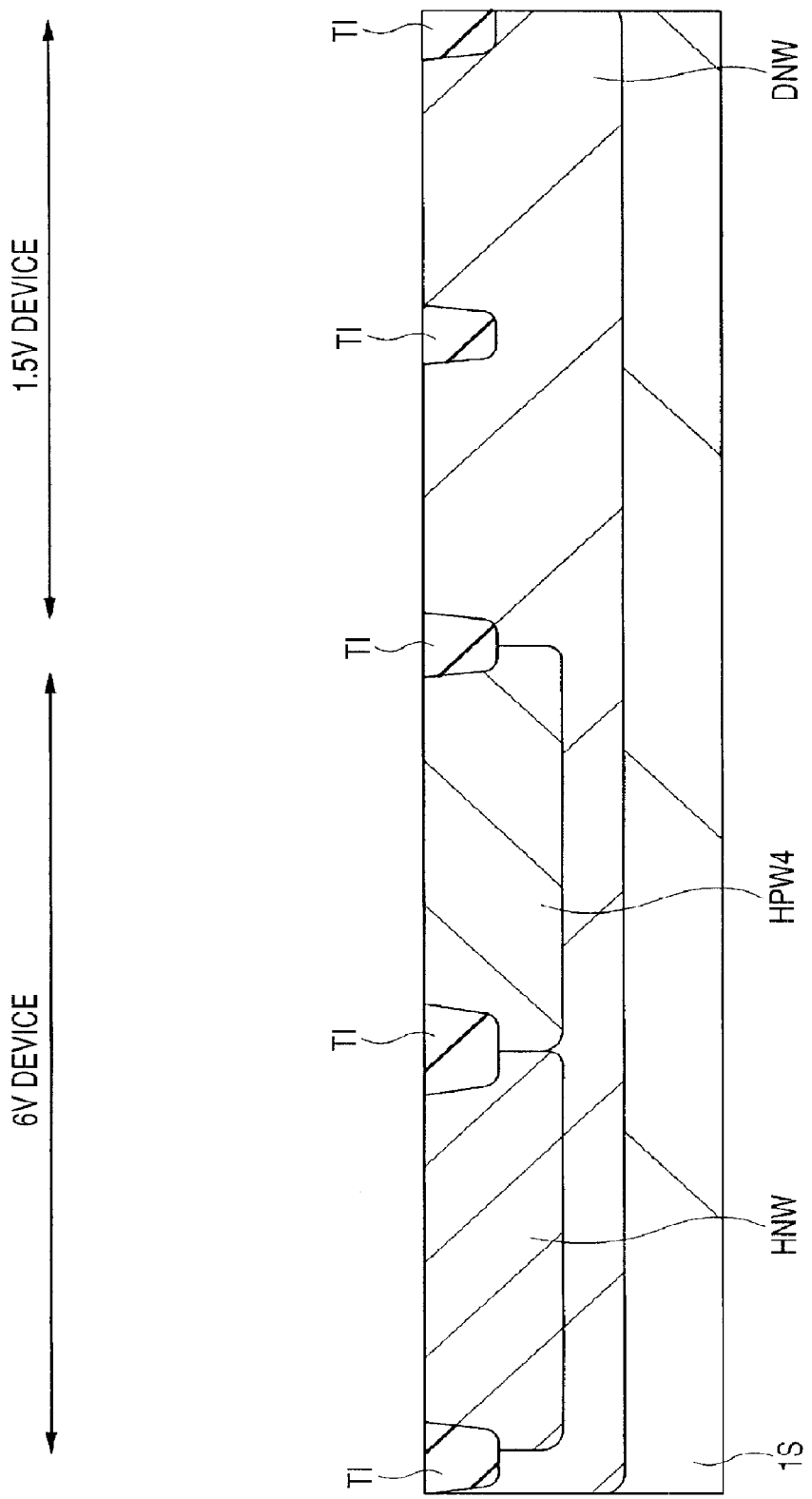
FIG. 27 is a fragmentary cross-sectional view showing the semiconductor substrate lying in the main circuit forming area during the semiconductor device manufacturing process following FIG. 25.
Figure 28:
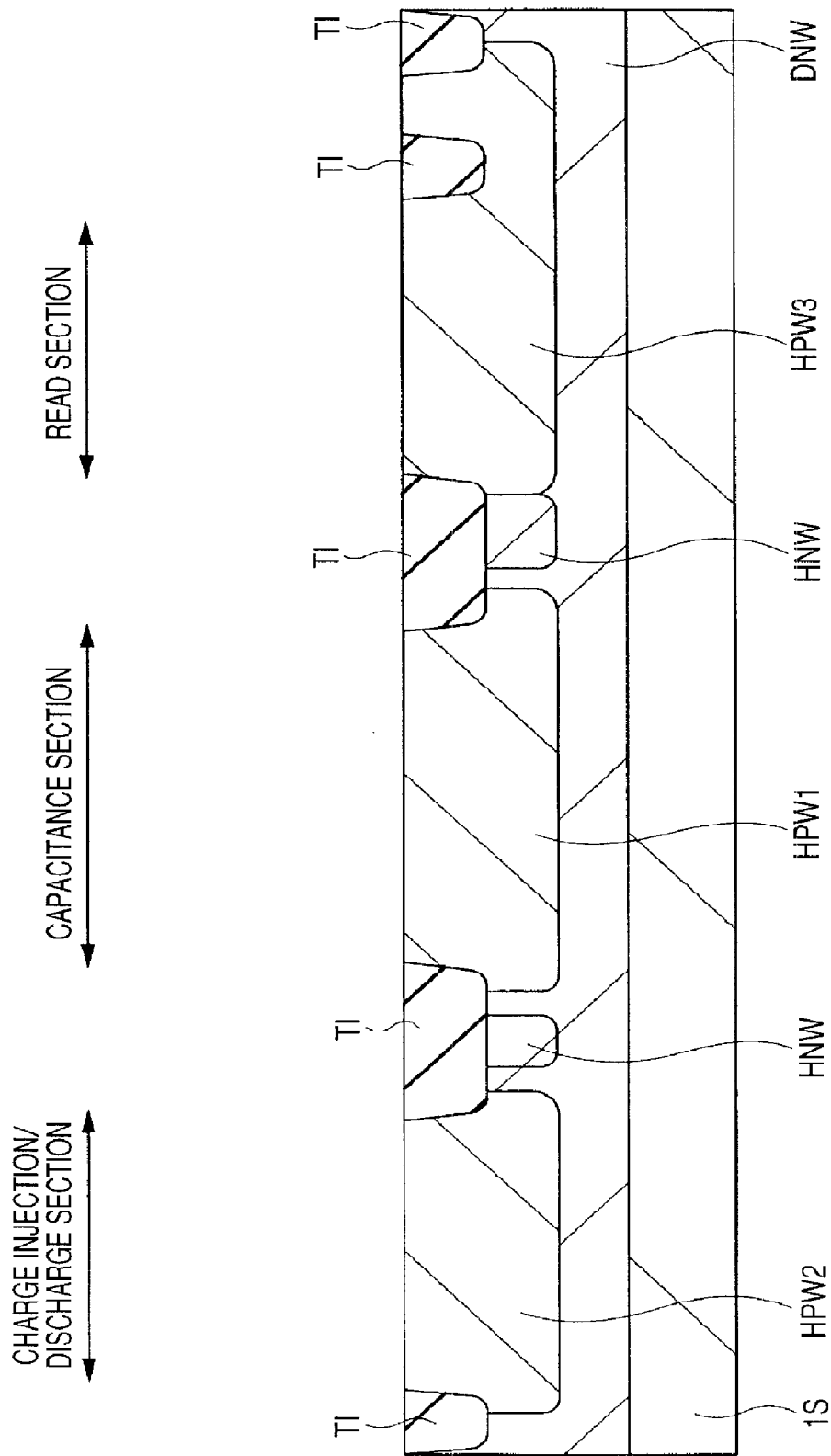
FIG. 28 is a fragmentary cross-sectional view showing the semiconductor substrate lying in the flash memory forming area at the same manufacturing process as FIG. 27.

Subsequently, as shown in FIGS. 27 and 28, an n-type well HNW is formed in a p channel type MIS•FET forming region of a 6V device forming area of the low breakdown section and each isolation region of a memory cell forming area of the flash memory by the lithography process and the ion implanting process or the like.

Subsequently, p-type wells HPW1 through HPW4 are simultaneously formed in an n channel type MIS•FET forming region of the 6V device forming area of the low breakdown section and the memory cell forming area of the flash memory by the lithography process and the ion implanting process or the like.

Figure 29:
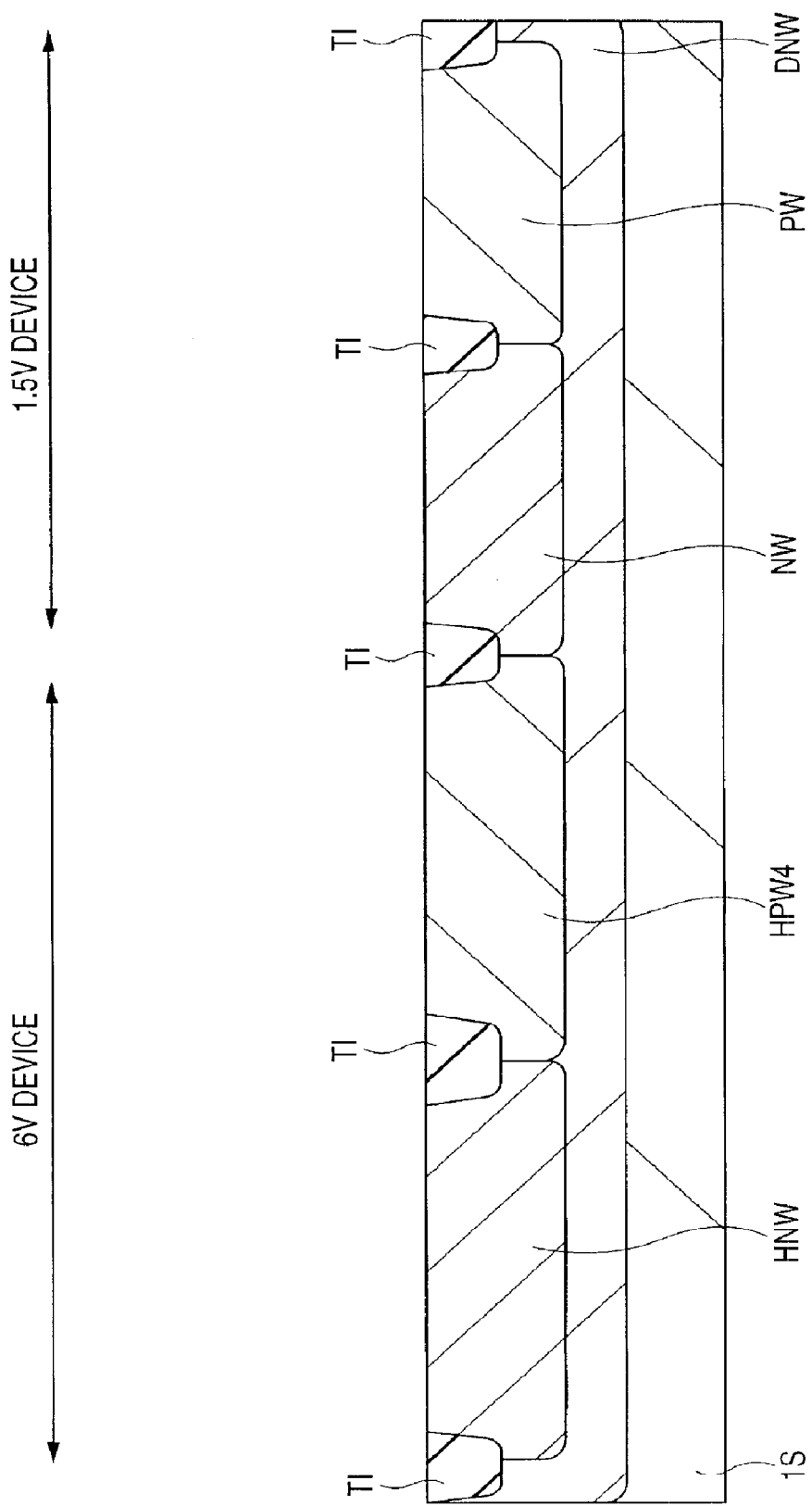
FIG. 29 is a fragmentary cross-sectional view showing the semiconductor substrate lying in the main circuit forming area during the semiconductor device manufacturing process following FIG. 27.
Figure 30:
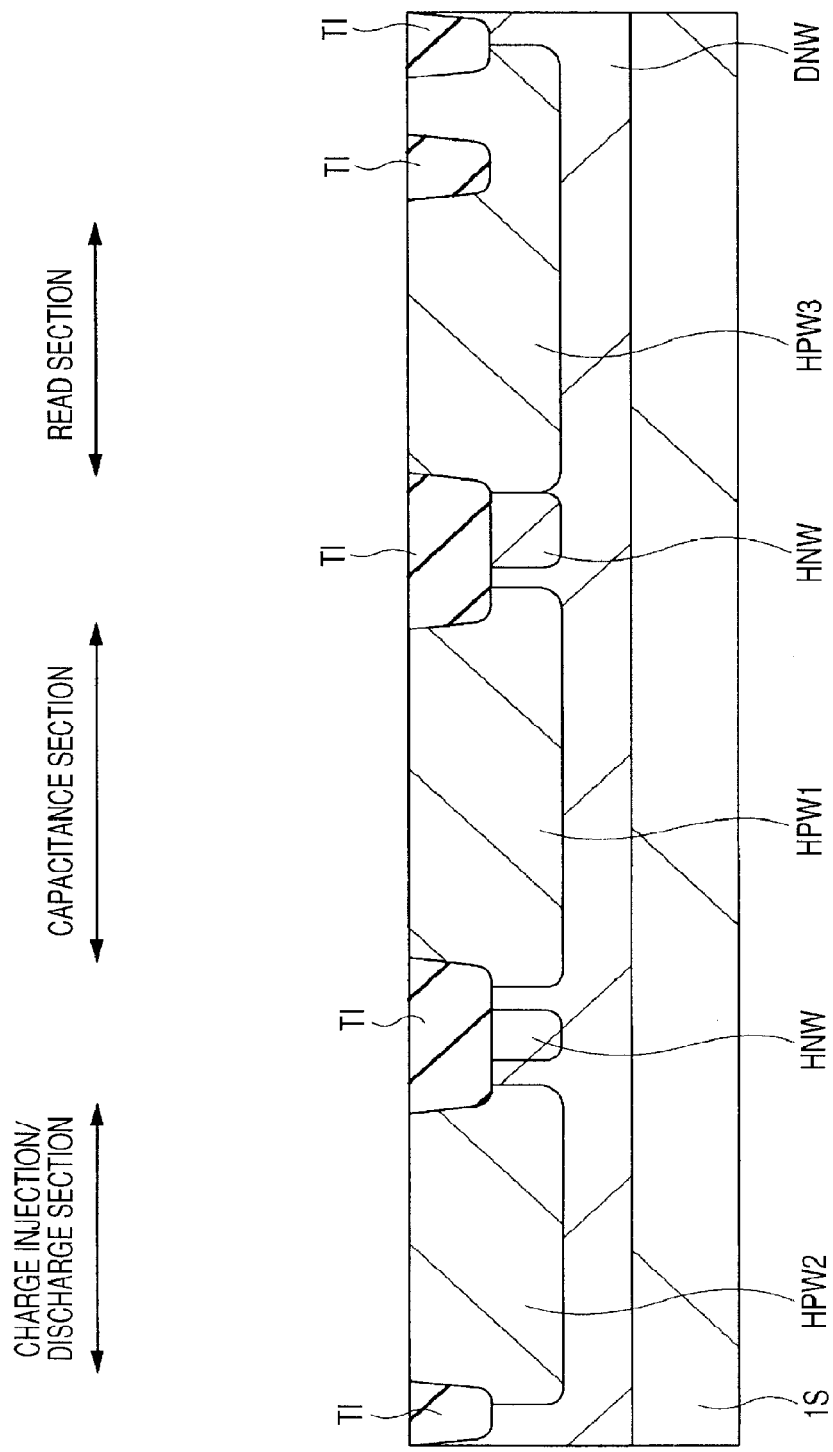
FIG. 30 is a fragmentary cross-sectional view showing the semiconductor substrate lying in the flash memory forming area at the same manufacturing process as FIG. 29.

Then, as shown in FIGS. 29 and 30, an n-type well NW is formed in a p channel type MIS•FET forming region of a 1.5V device forming area of the low breakdown section by the lithography process and the ion implanting process or the like.

Subsequently, a p-type well PW is formed in an n channel type MIS•FET forming region of the 1.5V device forming area of the low breakdown section by the lithography process and the ion implanting process or the like.

Figure 31:
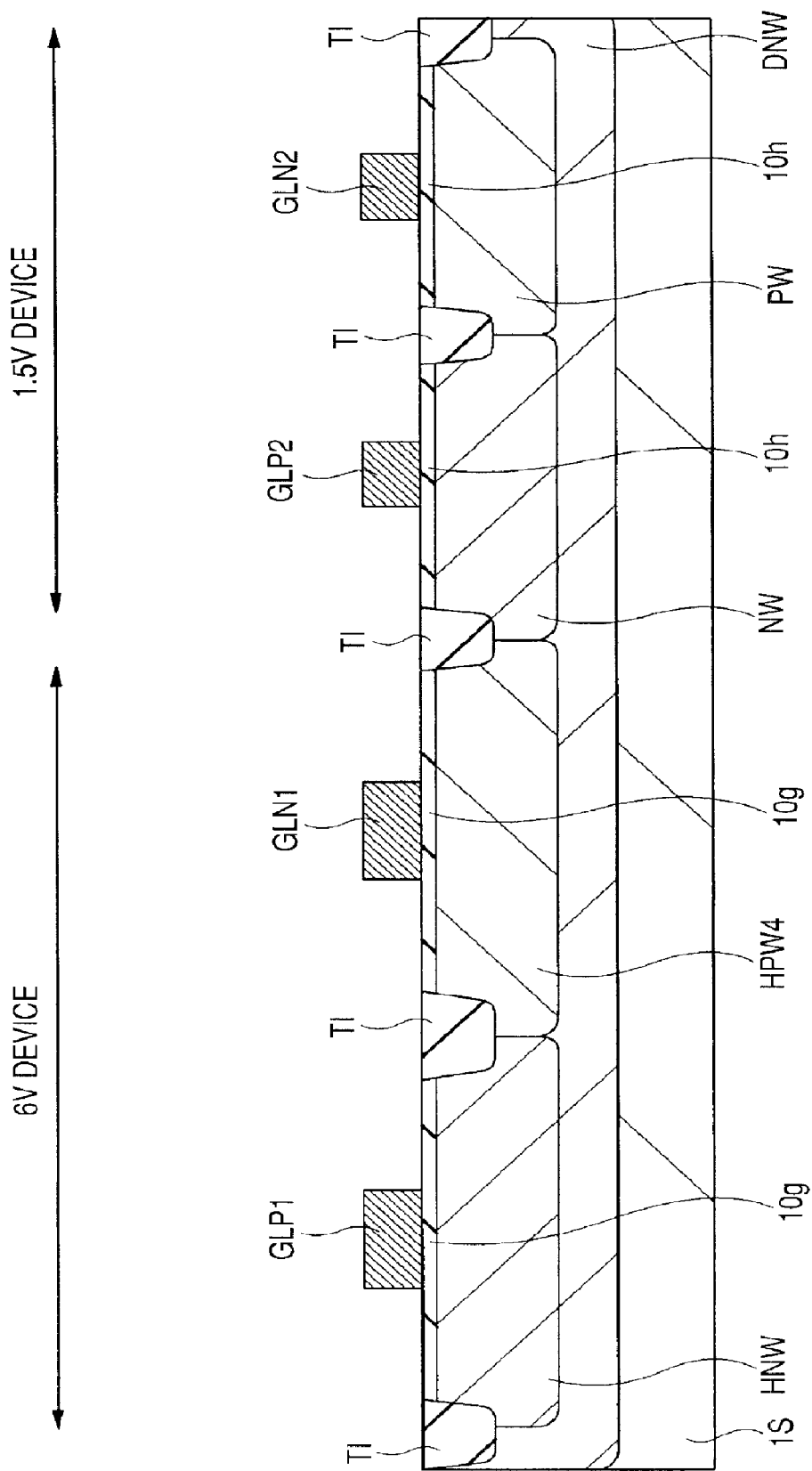
FIG. 31 is a fragmentary cross-sectional view showing the semiconductor substrate lying in the main circuit forming area during the semiconductor device manufacturing process following FIG. 29.
Figure 32:
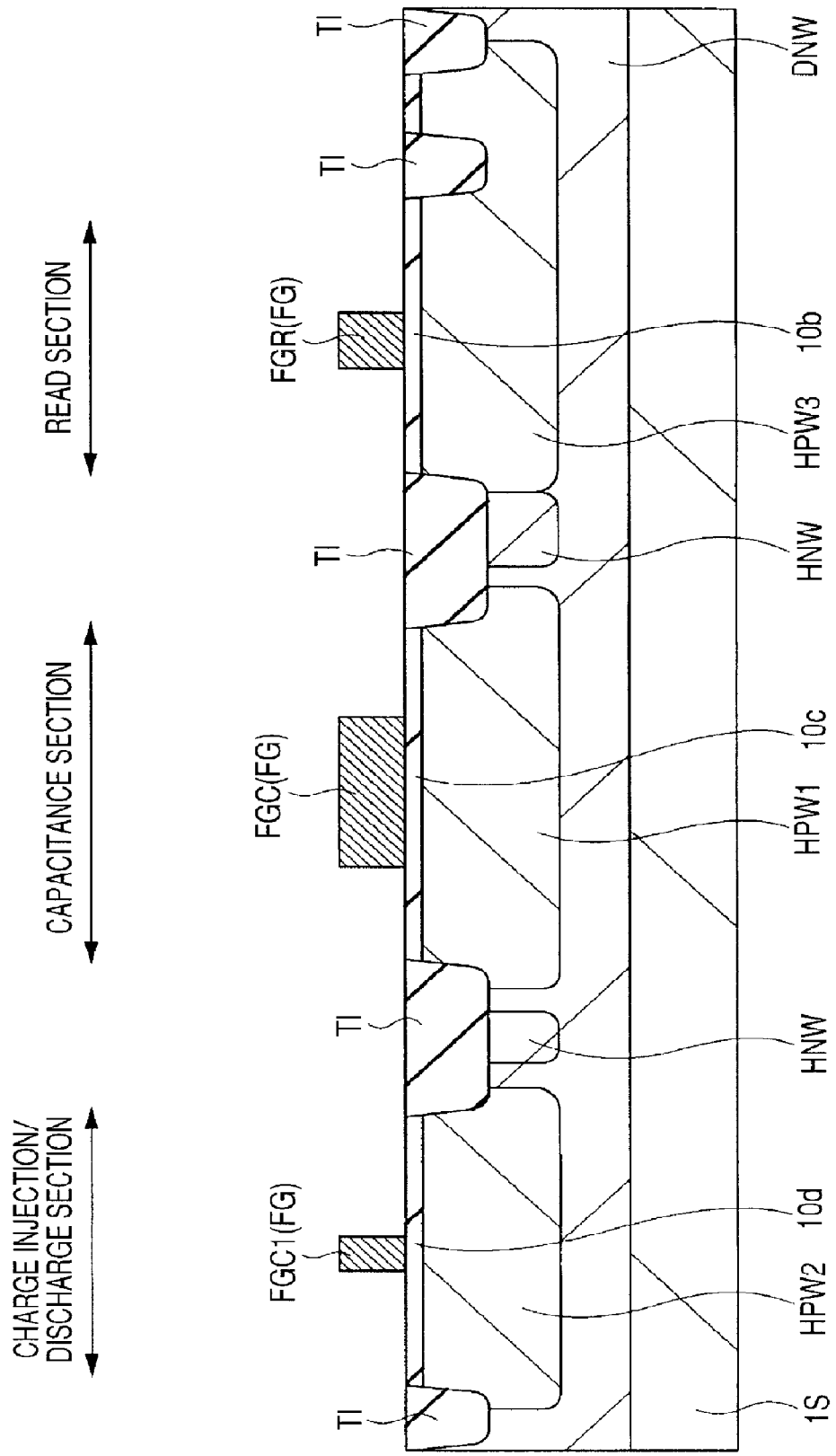
FIG. 32 is a fragmentary cross-sectional view showing the semiconductor substrate lying in the flash memory forming area at the same manufacturing process as FIG. 31.

Thereafter, as shown in FIGS. 31 and 32, gate insulating films 10b, 10g and 10h and capacitive insulating films 10c and 10d are formed over the first man surface of the substrate 1S by a thermal oxidation method or the like. The gate insulating films 10b and 10g and the capacitive insulating films 10c and 10d are formed simultaneously. Their thicknesses preferably range from 10 nm to 20 nm, for example and are set to 13.5 nm, for example.

On the other hand, the gate insulating films 10h for the p channel type MIS•FET forming region and the n channel type MIS•FET forming region in the 1.5V device forming area are formed simultaneously. Their thicknesses are thinner than those of the gate insulating films 10b and 10g and the capacitive insulating films 10c and 10d and are 3.7 nm or so, for example.

Changing the thickness of each insulating film in this way is performed in the following manner, for example. An insulating film is formed by subjecting the first main surface of the substrate 1S to a thermal oxidation process. Thereafter, a thin-film portion of the insulating film is selectively removed. Subsequently, a thermal oxidation process corresponding to a second time is effected on the first main surface of the substrate 1S. Thus, a thick insulating film is formed at a thick-film portion and a thin insulating film is formed at the thin-film portion. In place of the thermal oxidation process corresponding to the second time, the insulating film may be deposited using a CVD (Chemical Vapor Deposition) method or the like.

Thereafter, a conductor film constituted of, for example, low-resistance polycrystalline silicon is deposited over the first main surface of the substrate 1S (wafer) by the CVD method or the like and patterned by the lithography process and an etching step, thereby forming gate electrodes GHP, GHN, GLP1, GLN1, GLP2, GLN2 and FGS and flowing gate electrodes FG (gate electrode FGR and capacitive electrodes FGC1 and FGC2) simultaneously.

Figure 33:
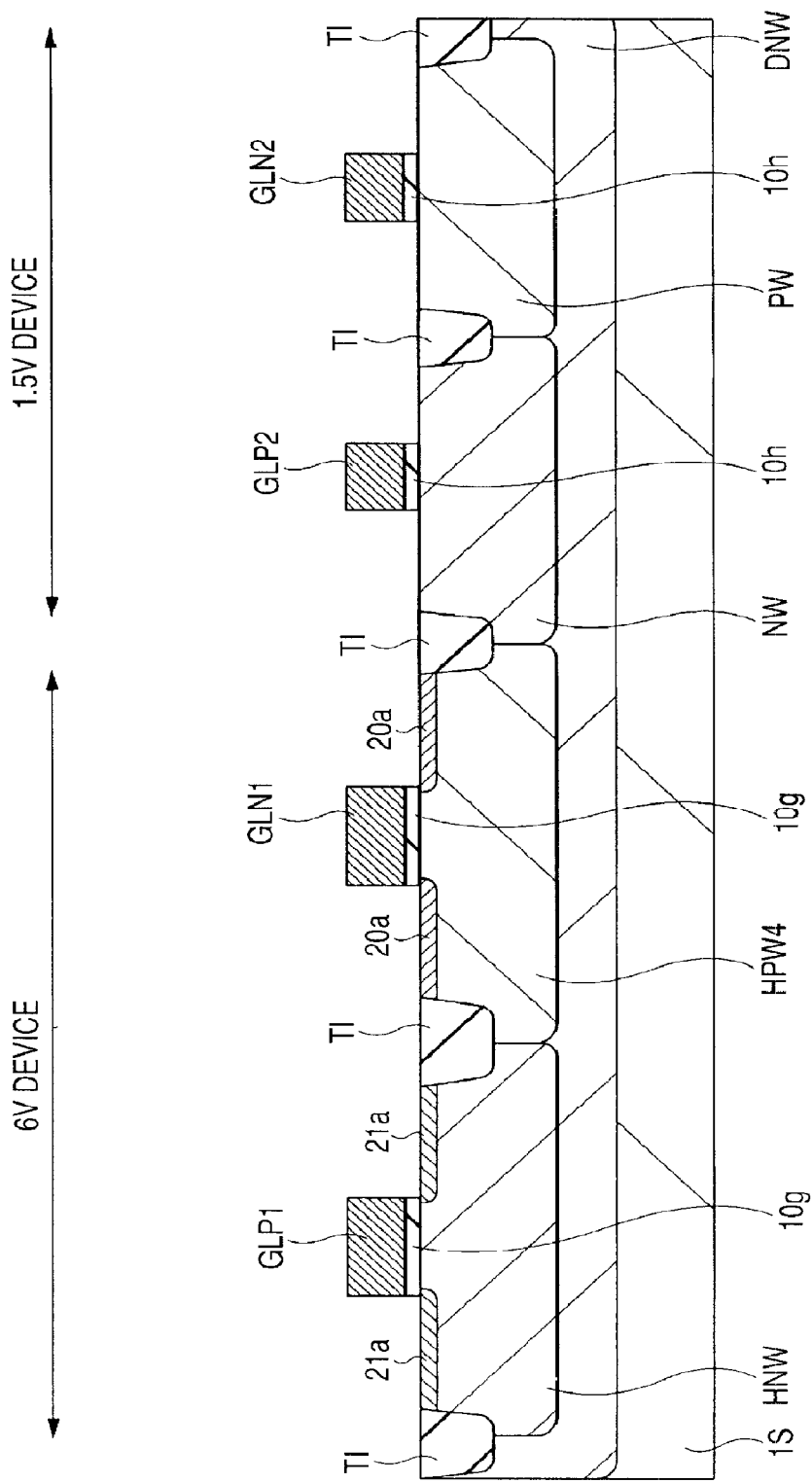
FIG. 33 is a fragmentary cross-sectional view showing the semiconductor substrate lying in the main circuit forming area during the semiconductor device manufacturing process following FIG. 31.
Figure 34:
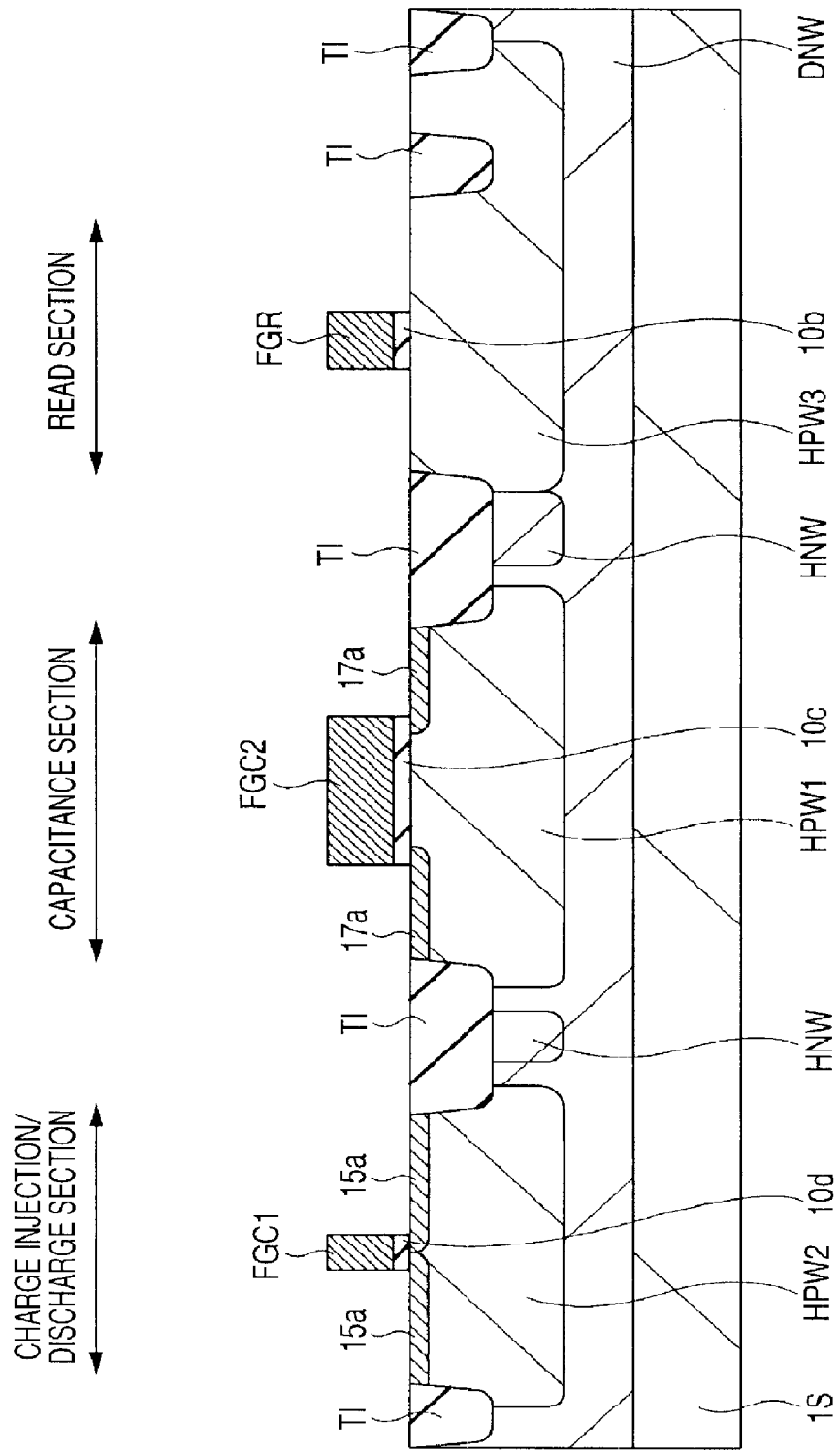
FIG. 34 is a fragmentary cross-sectional view showing the semiconductor substrate lying in the flash memory forming area at the same manufacturing process as FIG. 33.

Next, as shown in FIGS. 33 and 34, $n^−$-type semiconductor regions 20a are simultaneously formed in the n channel type MIS•FET forming region of the 6V device forming area of the low breakdown section by the lithography process and an ion implanting method or the like.

Subsequently, $p^−$-type semiconductor regions 21a, 17a and 15a are simultaneously formed in the p channel type MIS•FET forming region of the 6V device forming area of the low breakdown section, a region for forming a capacitance section C and a region for forming a data write/erase charge injection/discharge section CWE by the lithography process and the ion implanting method or the like.

Figure 35:
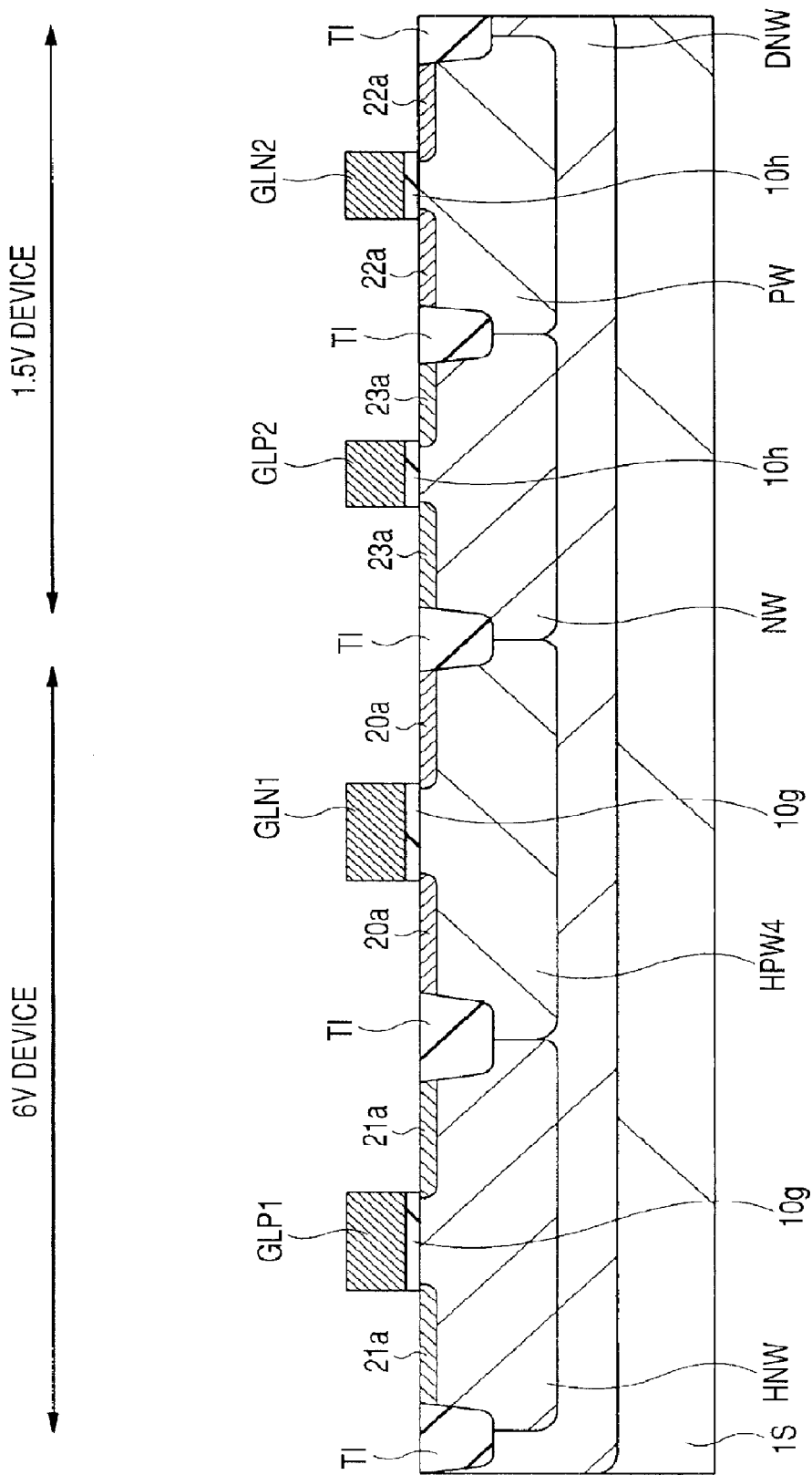
FIG. 35 is a fragmentary cross-sectional view showing the semiconductor substrate lying in the main circuit forming area during the semiconductor device manufacturing process following FIG. 33.
Figure 36:
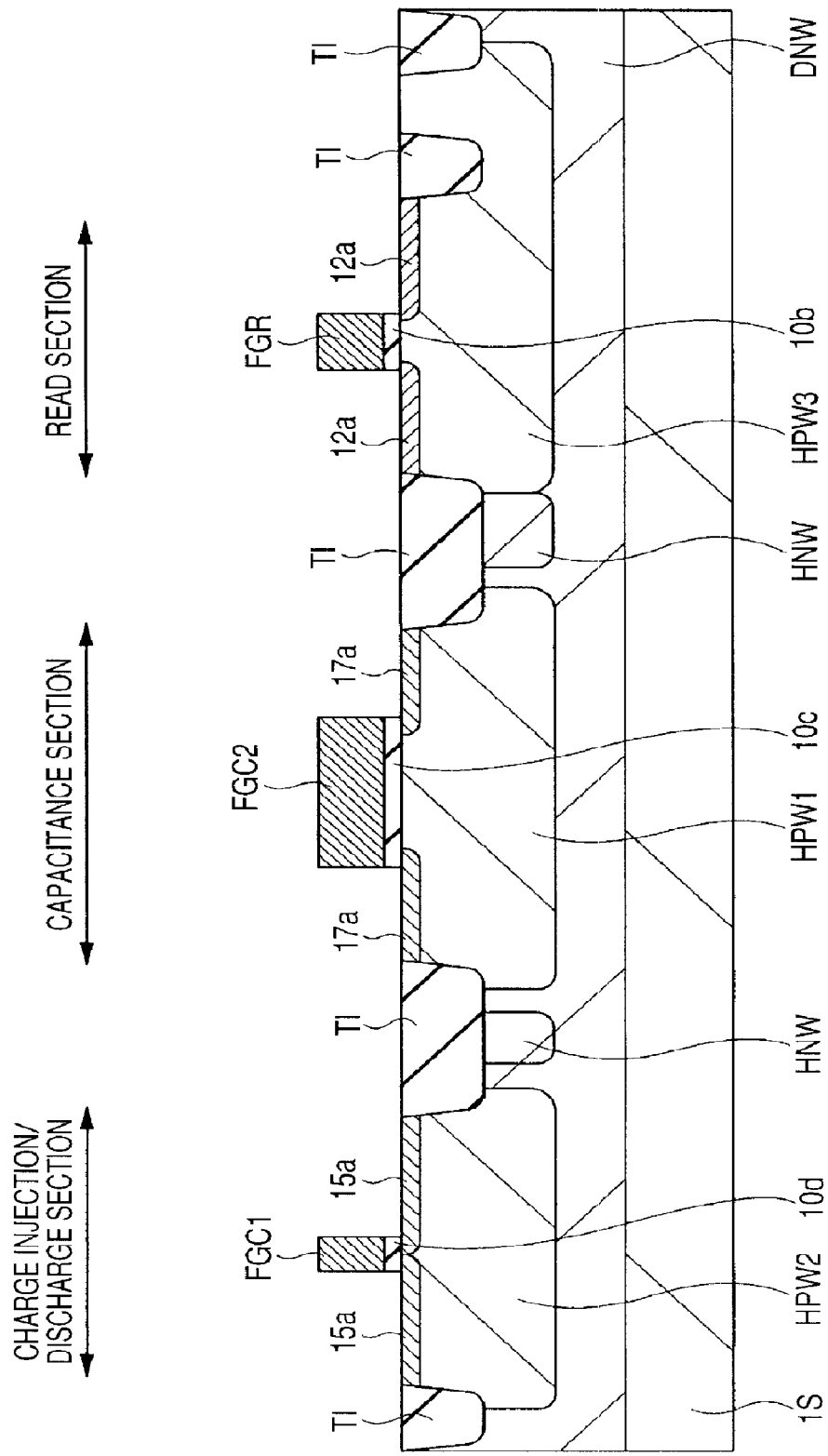
FIG. 36 is a fragmentary cross-sectional view showing the semiconductor substrate lying in the flash memory forming area at the same manufacturing process as FIG. 35.

Then, as shown in FIGS. 35 and 36, $n^−$-type semiconductor regions 22a and 12a are simultaneously formed in the n channel type MIS•FET forming region lying in the 1.5V device forming area of the low breakdown section, a data read MIS•FETQR forming region and a selection MIS•FETQS forming region lying therein by the lithography process and the ion implanting method or the like.

Here, the p-type semiconductor regions (the p-type hollow regions) are formed in addition to the introduction of an n-type impurity for forming the $n^−$-type semiconductor regions 22a and 12a. In such a case, a p-type impurity for forming the p-type hollow regions is introduced into the neighborhoods (corresponding to substrate 1S's portions located below the gate electrodes GLN2, FGR and FGS) of the leading end portions on the channel side, of the $n^−$-type semiconductor regions 22a and 12a of the substrate 1S from the direction diagonal to the first main surface of the substrate 1S, for example. Thus, a short channel effect can suppressed or prevented at the n channel type MIS•FET and data read MIS•FETQR for the 1.5V device.

Subsequently, $p^−$-type semiconductor regions 23a are simultaneously formed in the p channel type MIS•FET forming region of the 1.5V device forming area of the low breakdown section by the lithography process and the ion implanting method or the like.

Here, the n-type semiconductor regions (the n-type hollow regions) are formed in addition to the introduction of a p-type impurity for forming the $p^−$-type semiconductor regions 23a. In such a case, an n-type impurity for forming the n-type hollow regions is introduced into the neighborhoods (corresponding to a substrate 1S's portion located below the gate electrode GLP2) of the leading end portions on the channel side, of the $p^−$-type semiconductor regions 23a of the substrate 1S from the direction diagonal to the first main surface of the substrate 1S, for example. Thus, a short channel effect can suppressed or prevented at the p channel type MIS•FET for the 1.5V device.

Figure 37:
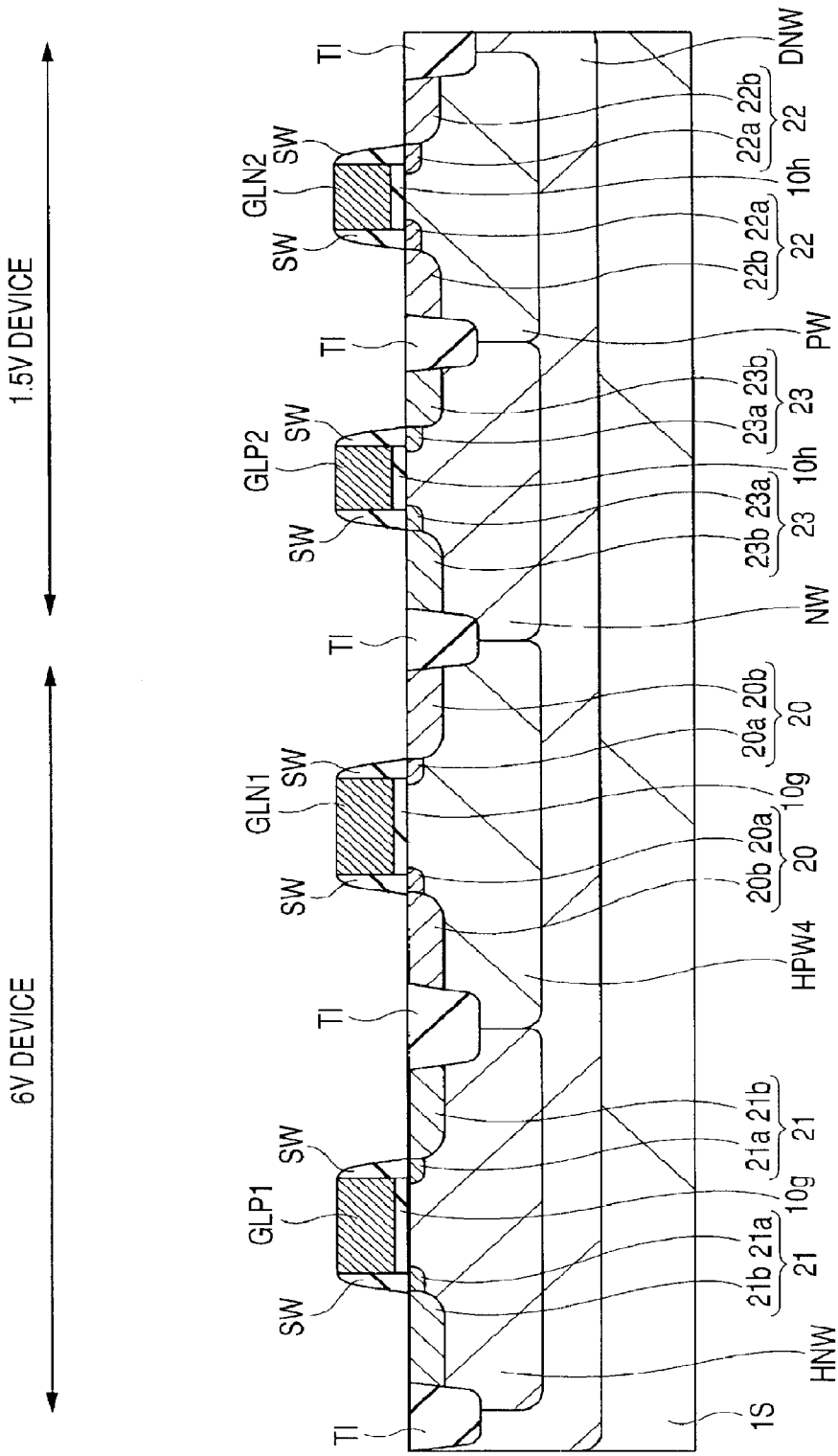
FIG. 37 is a fragmentary cross-sectional view showing the semiconductor substrate lying in the main circuit forming area during the semiconductor device manufacturing process following FIG. 35.
Figure 38:
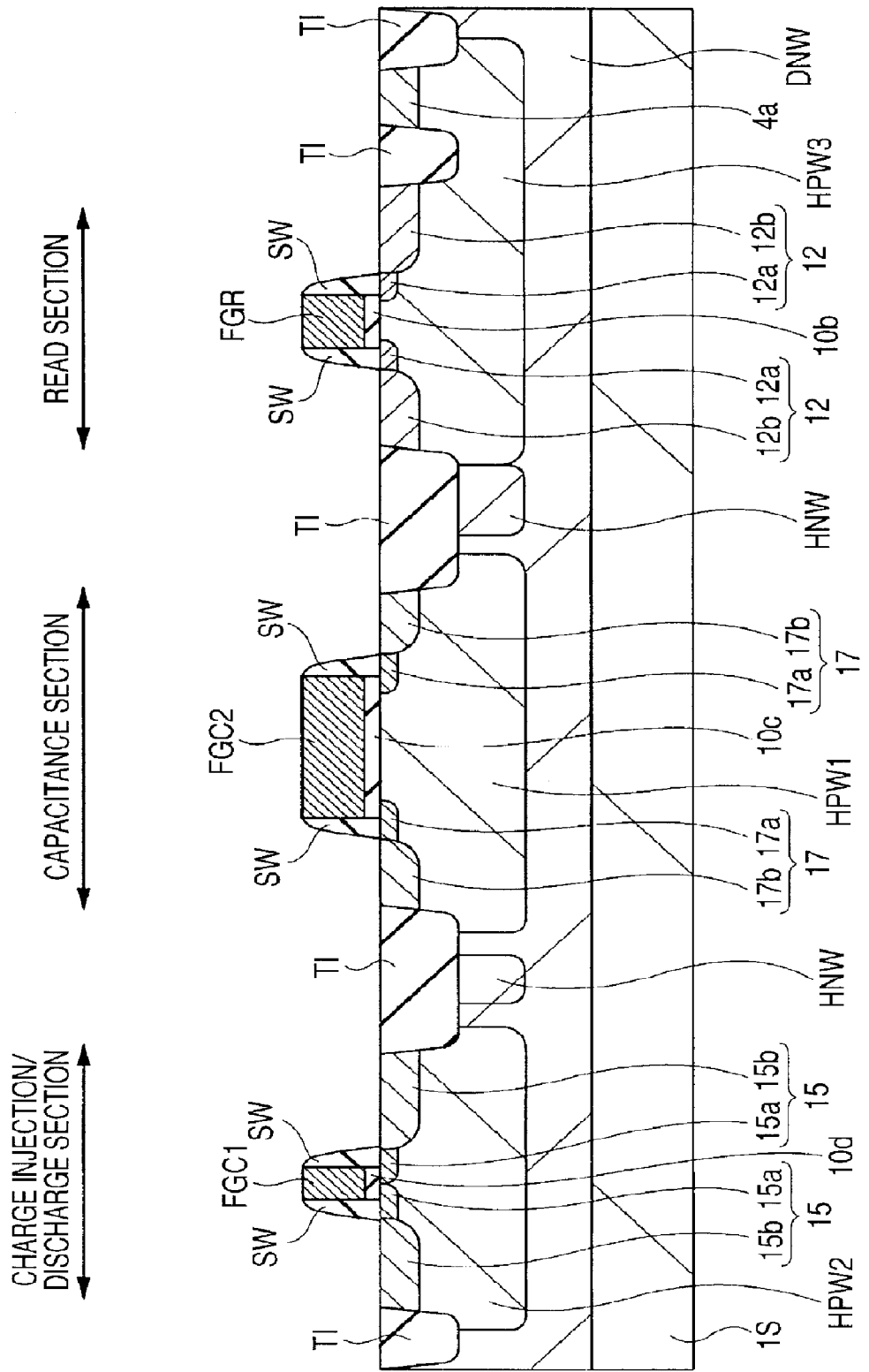
FIG. 38 is a fragmentary cross-sectional view showing the semiconductor substrate lying in the flash memory forming area at the same manufacturing process as FIG. 37.

Next, as shown in FIGS. 37 and 38, an insulating film constituted of, for example, silicon oxide is deposited over the first main surface of the substrate 1S by the CVD method or the like, followed by being etch-backed using an anisotropic dry etching method, thereby forming sidewalls SW over their corresponding side surfaces of the gate electrodes GHP, GHN, GLP1, GLN1, GLP2, GLN2, FGR and FGS and capacitive electrodes FGC1 and FGC2.

Subsequently, $n^+$-type semiconductor regions 18b, 20b, 22b and 12b are simultaneously formed in their corresponding n channel type MIS•FET forming regions of the high breakdown section, low breakdown section, data read section and selection section by the lithography process and the ion implanting method or the like. At this time, $n^+$-type semiconductor regions 25 for the above isolation are formed simultaneously.

Subsequently to it, $p^+$-type semiconductor regions 19b, 21b, 23b, 15b, 17b and 4a are respectively formed in p channel type MIS•FET forming regions of the high breakdown section and the low breakdown section, capacitance-section and write/erase charge injection/discharge forming regions and a drawing region for the p-type well HPW3 simultaneously by the lithography process and the ion implanting method or the like.

Figure 39:
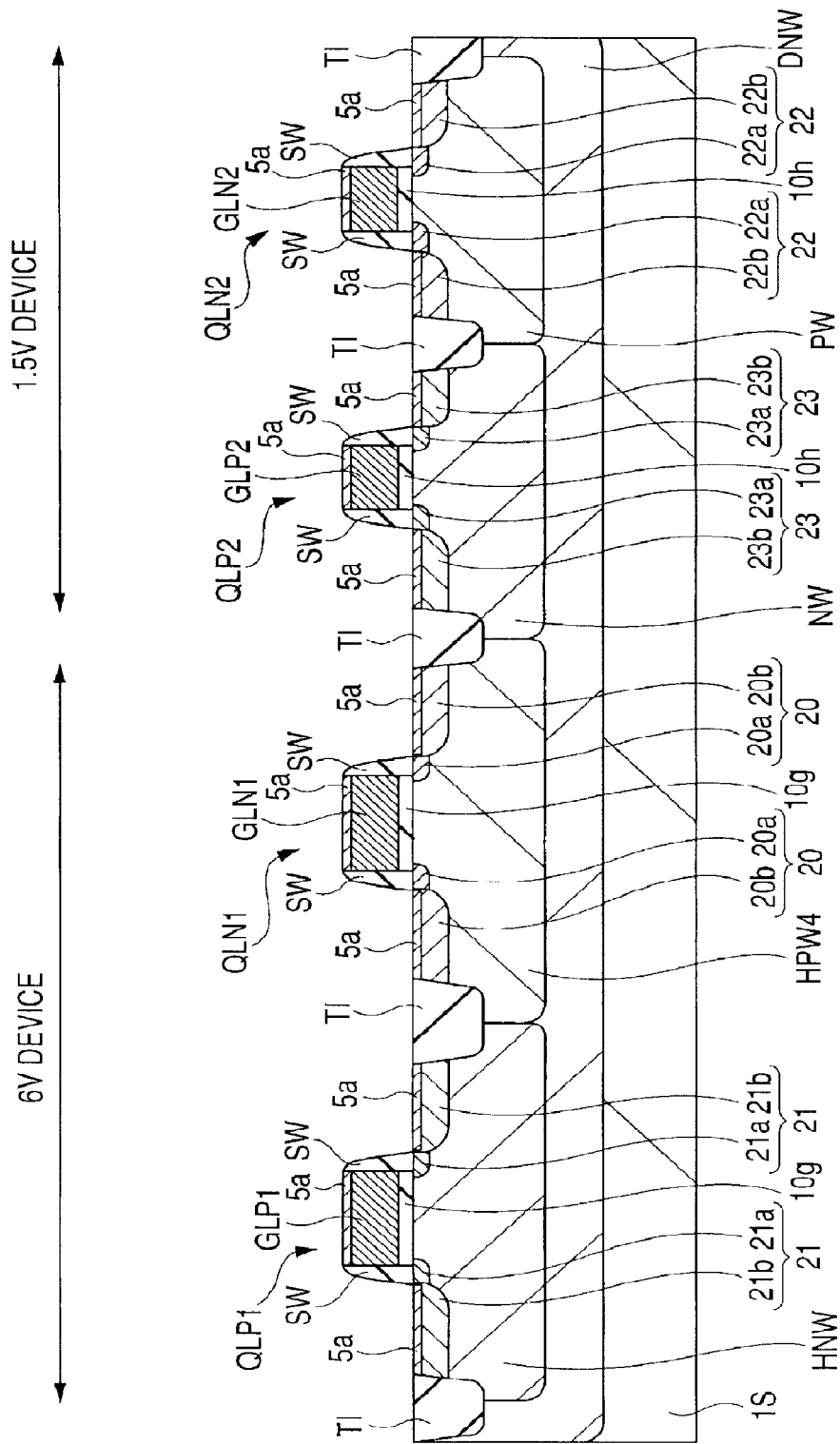
FIG. 39 is a fragmentary cross-sectional view showing the semiconductor substrate lying in the main circuit forming area during the semiconductor device manufacturing process following FIG. 37.
Figure 40:
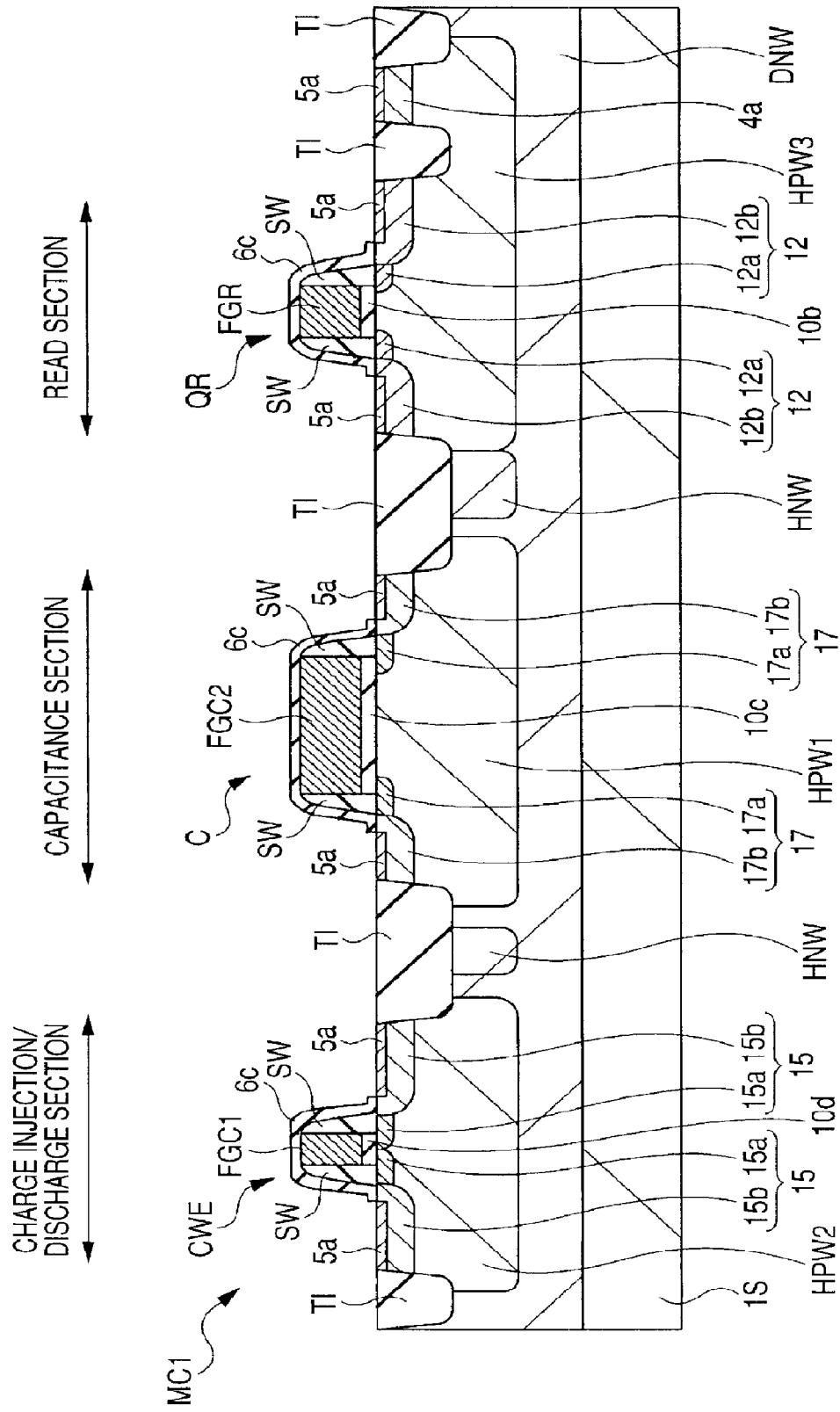
FIG. 40 is a fragmentary cross-sectional view showing the semiconductor substrate lying in the flash memory forming area at the same manufacturing process as FIG. 39.

Next, as shown in FIGS. 39 and 40, a silicide layer 5a is selectively formed at part of the first main surface of the substrate 1S, the upper surfaces of the gate electrodes GHP, GHN, GLP1, GLN1, GLP2 and GLN2 and resistive and capacitive electrode portions formed of polycrystalline silicon or the like in accordance with a salicide process.

Prior to the step for forming the silicide layer 5a, cap insulating layers 6c are respectively formed so as to cover the upper surfaces of the floating gate electrodes FG (capacitive electrode FGC1, FGC2 and gate electrode FGR) and gate electrode FGS, the surfaces of the sidewalls SW and parts of the first main surface of the substrate 1S lying therearound. Thus, the silicide layer 5a is prevented from being formed over the upper surfaces of the floating gate electrodes FG covered with the cap insulating layers 6c.

A p channel type MIS•FETQHP and an n channel type MIS•FETQHN are formed at the high breakdown section in this way. p channel type MIS•FETQLP1 and MIS•FETQLP2 and n channel type MIS•FETQLN1 and MIS•FETQLN2 are formed at the low breakdown section. Further, the capacitance section C, data write/erase charge injection/discharge section CWE and data read MIS•FETQR are formed in each memory cell forming area.

Figure 41:
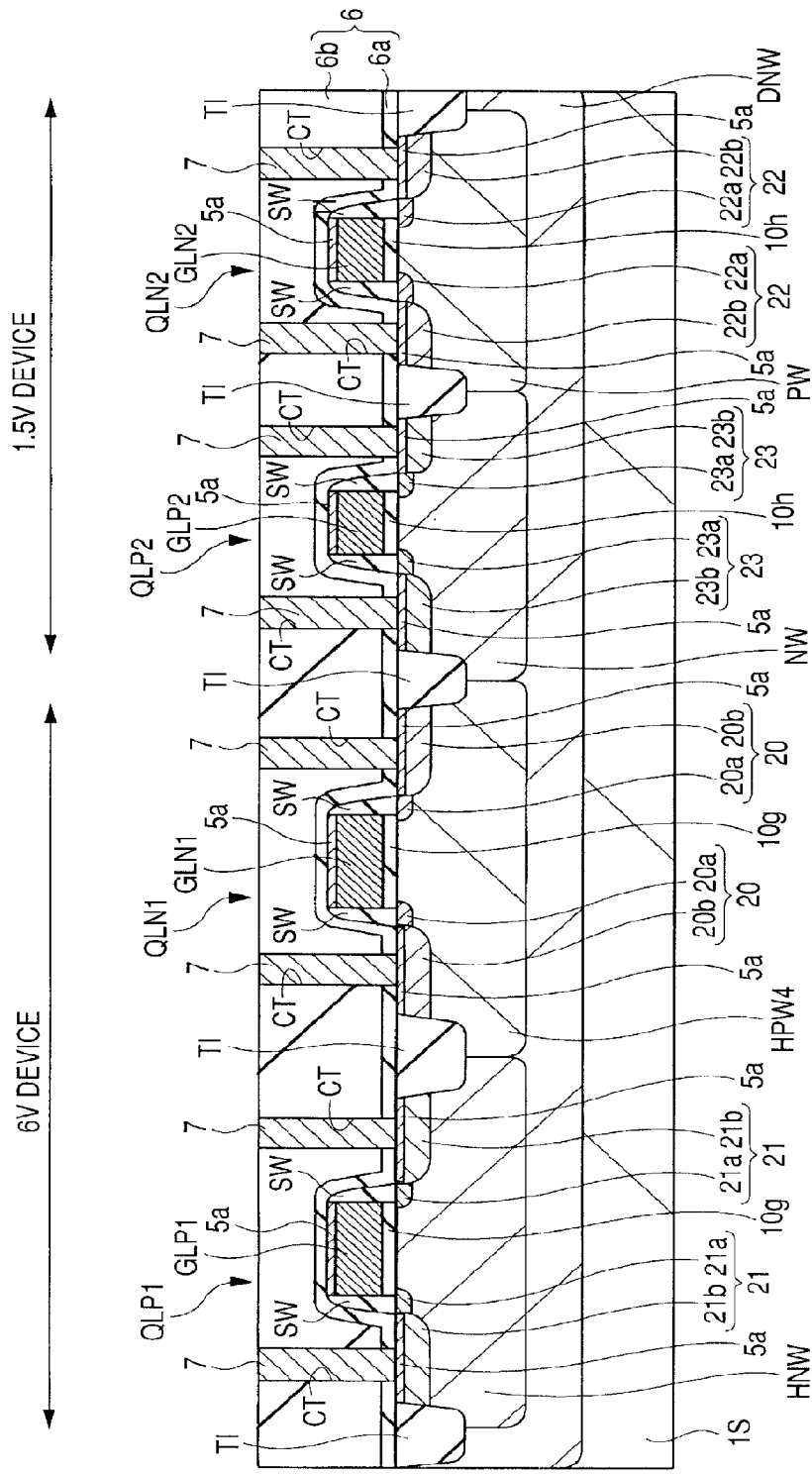
FIG. 41 is a fragmentary cross-sectional view showing the semiconductor substrate lying in the main circuit forming area during the semiconductor device manufacturing process following FIG. 39.
Figure 42:
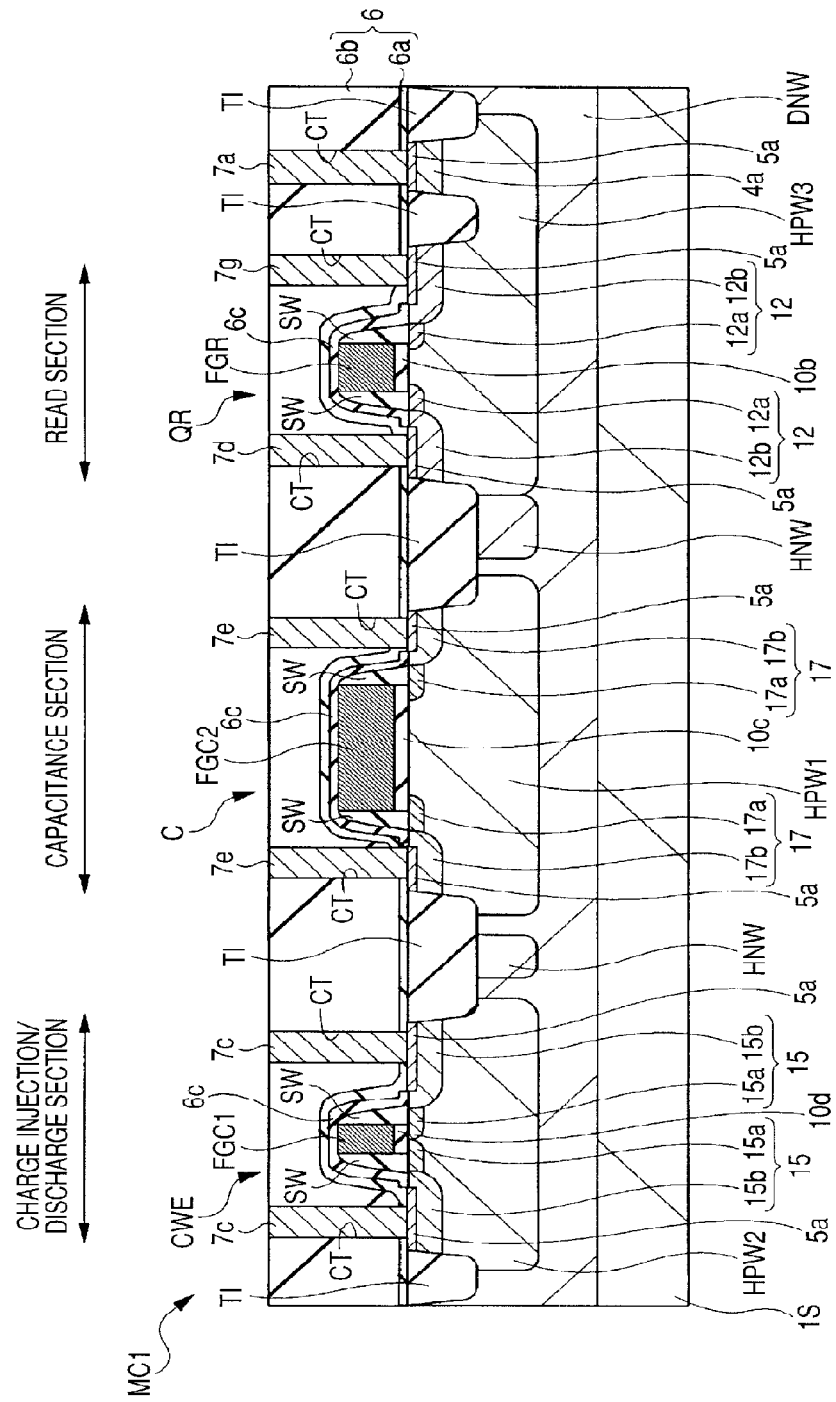
FIG. 42 is a fragmentary cross-sectional view showing the semiconductor substrate lying in the flash memory forming area at the same manufacturing process as FIG. 41.

Subsequently, as shown in FIGS. 41 and 42, an insulating layer 6a constituted of, for example, silicon nitride is deposited over the first main surface of the substrate 1S (wafer) by the CVD method or the like. Thereafter, an insulating layer 6b constituted of, for example, silicon oxide is deposited thereover thicker than the insulating layer 6a by the CVD method or the like. Afterwards, a chemical mechanical polishing (CMP) process is effected on the insulating layer 6b to planarize the upper surface of the insulating layer 6b.

Next, contact holes CT are formed in the insulating layer 6 by the lithography process and the etching process step. Subsequently, a conductor or conductive film constituted of, for example, tungsten (W) is deposited over the first main surface of the substrate 1S (wafer). Thereafter, it is polished by a CMP method or the like to form conductive or conductor parts 7 and 7a through 7g in the contact holes CT respectively. After their formation, the semiconductor device is manufactured via the normal wiring forming step, inspecting step and assembling step.

According to the second embodiment, the constituent portions (parts) of the MIS•FETQHP, MIS•FETQHN, MIS•FETQLP1, MIS•FETQLP2, MIS•FETQLN1 and MIS•FETQLN2 for the LCD driver circuit, and the constituent portions (parts) of the capacitance section C, charge injection/discharge section CWE and MIS•FETQR and MIS•FETQS of each memory cell MC1 can be formed simultaneously. Therefore, the process of manufacturing the semiconductor device can be simplified. Thus, the time required to manufacture the semiconductor device can be shortened. The cost of the semiconductor device can be reduced.

Third Preferred Embodiment

Figure 43:
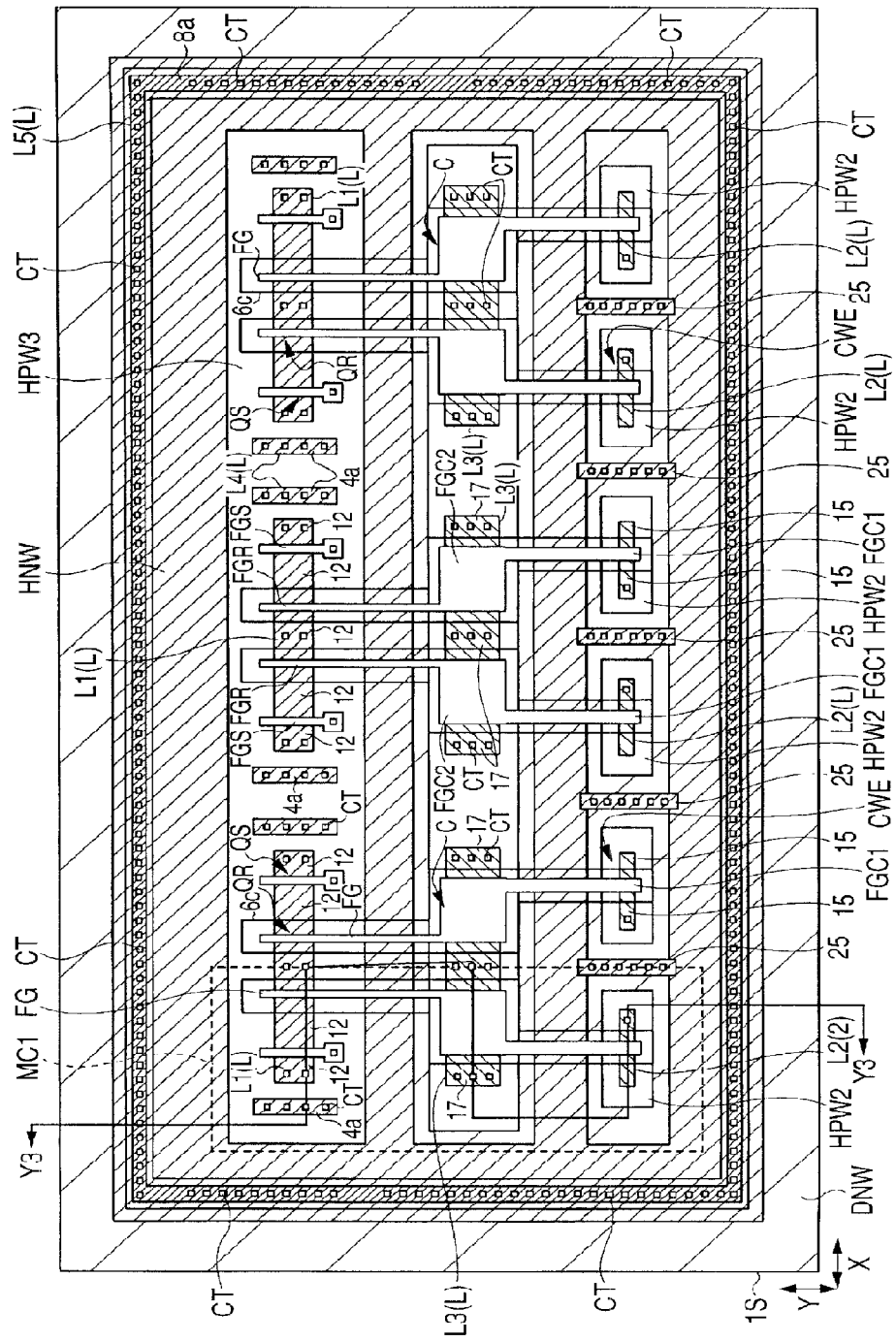
FIG. 43 is a plan view of a flash memory for a semiconductor device illustrative of a third embodiment of the present invention.
Figure 44:
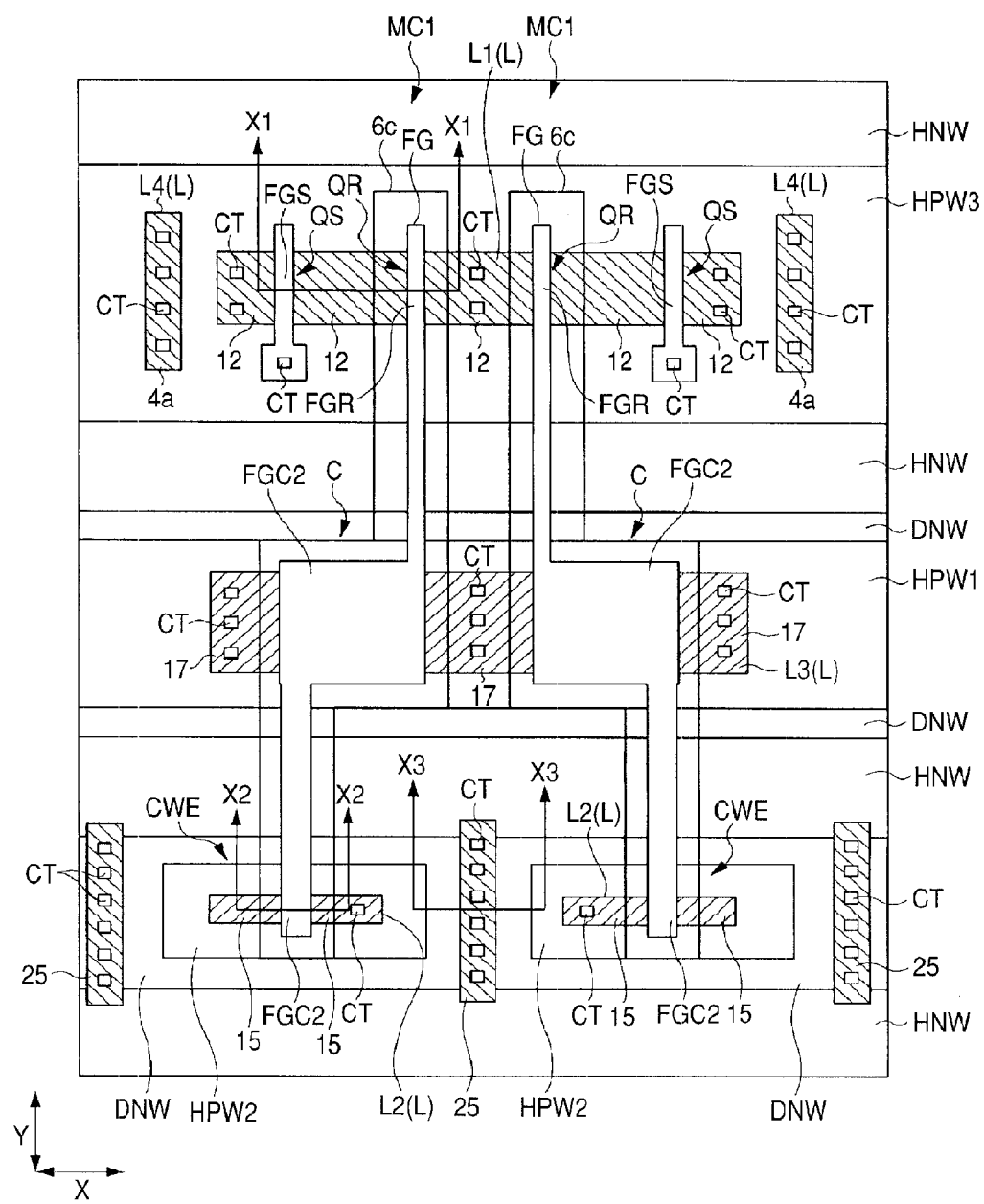
FIG. 44 is a fragmentary enlarged plan view of the flash memory shown in FIG. 43.
Figure 45:
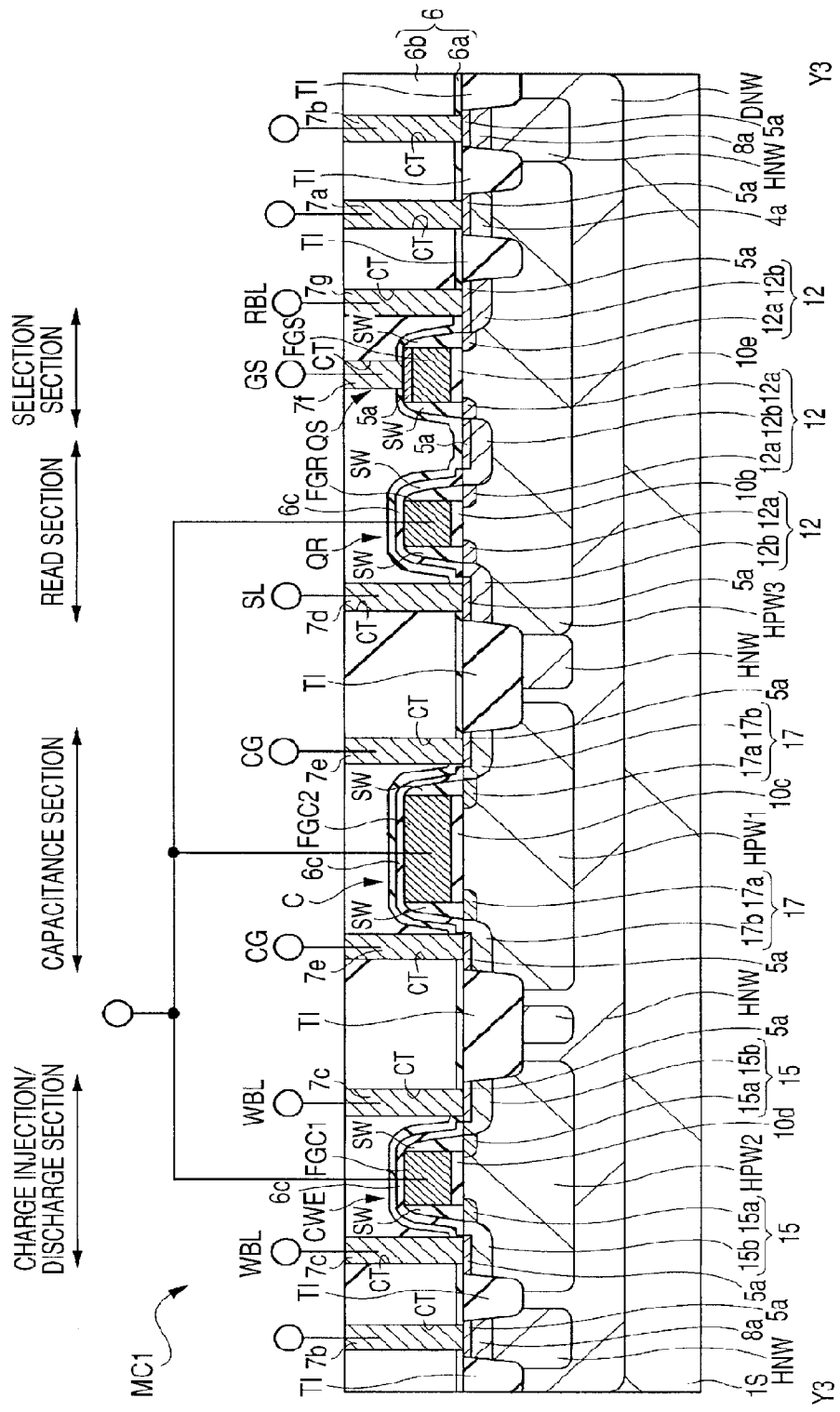
FIG. 45 is a cross-sectional view taken along line Y3-Y3 of FIG. 43.

FIG. 43 shows a plan view of a flash memory for a semiconductor device according to a third embodiment, FIG. 44 shows a fragmentary enlarged plan view of the flash memory shown in FIG. 43, and FIG. 45 shows a cross-sectional view taken along line Y3-Y3 of FIG. 43, respectively. Incidentally, although FIGS. 43 and 44 are plan views, parts thereof are hatched to make it easy to see the drawings. Cross-sectional views taken along lines X1-X1, X2-X2 and X3-X3 of FIG. 44 are respectively identical to FIGS. 22, 7 and 24.

In the third embodiment, the length (gate length) in a second direction X, of a capacitive electrode FGC1 of each charge injection/discharge section CWE is longer than the length (gate length) in the second direction X, of each data read MIS•FETQR. In the third embodiment, constitutions other than it are identical to those described in the first and second embodiments.

Thus, in the third embodiment, the length in the second direction X, of a second portion (gate electrode FGR) of a floating gate electrode FG, and the length in the second direction X, of a third portion (capacitive electrode FGC1) thereof can be changed (adjusted) according to need.

Fourth Preferred Embodiment

Figure 46:
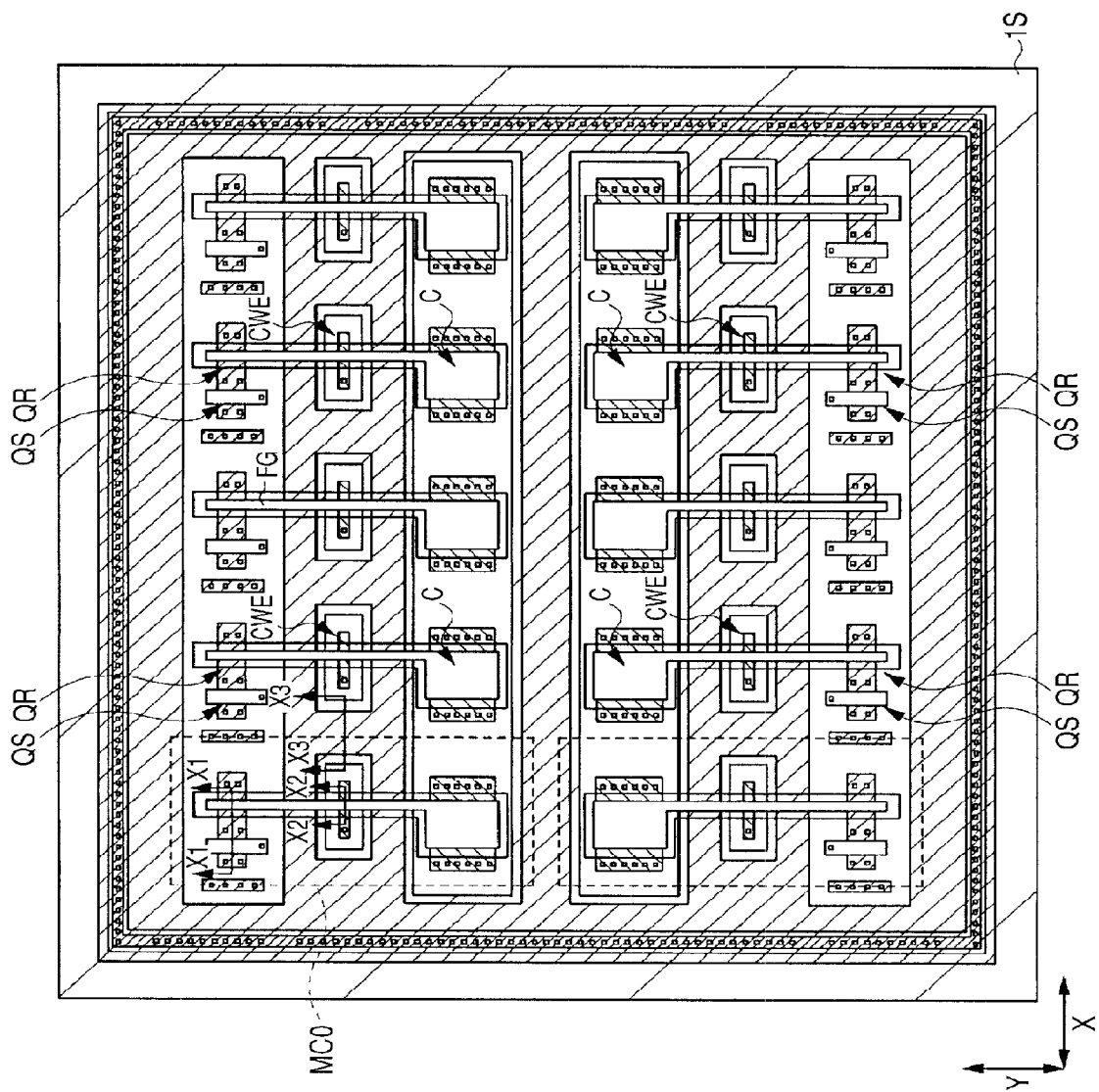
FIG. 46 is a plan view showing a flash memory as one example where a plurality of the memory cells shown in FIG. 2 are arranged even in a first direction.

FIG. 46 shows, as one example, where a plurality of the memory cells MC0 shown in FIG. 2 are arranged even in the first direction Y. Incidentally, although FIG. 46 is a plan view, parts thereof are hatched to make it easy to see the figure. Cross-sectional views taken along lines X1-X1, X2-X2 and X3-X3 of FIG. 46 are identical to those shown in FIGS. 6, 7 and 8 respectively.

The upper and lower memory cells MC0 shown in FIG. 46 are symmetrical with respect to one another along the first direction Y (they are in a mirror-inverted state). In the case of the layout of the memory cells MC0, respective capacitance sections C of the upper and lower memory cells MC0 are arranged so as to face one another. It is however necessary to electrically insulate the capacitance sections C and C of the upper and lower memory cells MC0 from one another.

Figure 47:
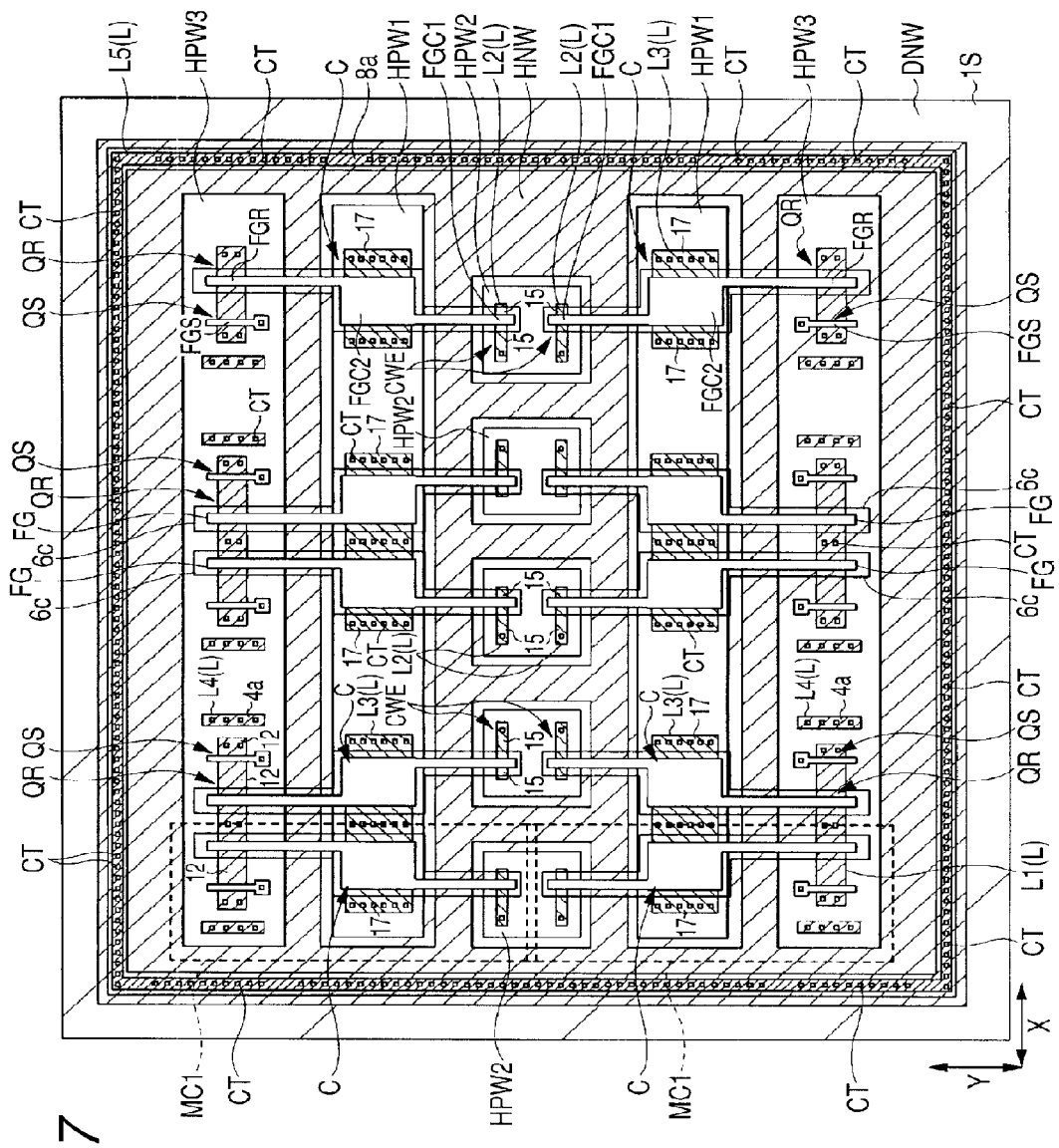
FIG. 47 is a plan view of a flash memory for a semiconductor device illustrative of a fourth embodiment of the present invention.
Figure 48:
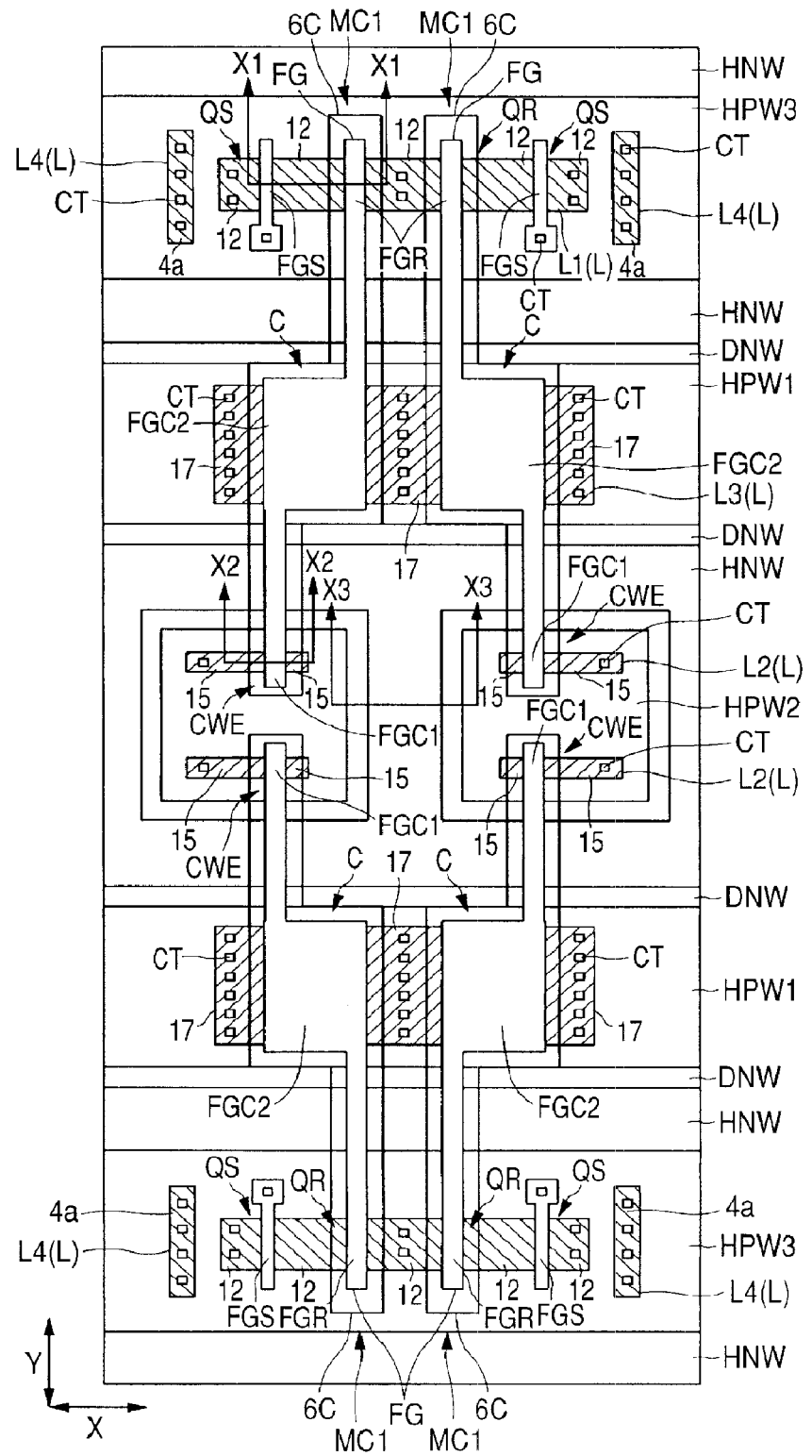
FIG. 48 is a fragmentary enlarged plan view of the flash memory shown in FIG. 47.

On the other hand, FIG. 47 is a plan view of a flash memory for a semiconductor device illustrative of a fourth embodiment, and FIG. 48 is a fragmentary enlarged plan view of the flash memory shown in FIG. 47. Incidentally, although FIGS. 47 and 48 are plan views, parts thereof are hatched to make it easy to see the drawings. Cross-sectional views taken along lines X1-X1, X2-X2 and X3-X3 are identical to those shown in FIGS. 6, 7 and 8.

Even in the fourth embodiment, memory cells MC1 located upward and downward (in a first direction Y) as viewed in FIGS. 47 and 48 are symmetrical with respect to one another along the first direction Y (held in a mirror-inverted state). In the fourth embodiment, however, data write/erase charge injection/discharge sections CWE of the memory cells MC1 located upward and downward (in the first direction Y) can be set so as to face one another by changing the layouts of respective elements of the memory cells MC1 as described above. Since, in this case, the charge injection/discharge sections CWE of the memory cells MC1 located upward and downward (in the first direction Y) can be set to the same potential, a p-type well HPW2 at which the charge injection/discharge sections CWE of the upper and lower memory cells MC1 can be shared. Thus, since the adjoining space between the upper and lower memory cells MC1 can be closed up or reduced, the size in the first direction Y, of a memory cell array MR can be reduced or scaled down as compared with the case of FIG. 46 (cell height can be reduced). Accordingly, the area of the memory cell array MR can be scaled down. Further, the storage capacity of a memory can be increased.

Figure 49:
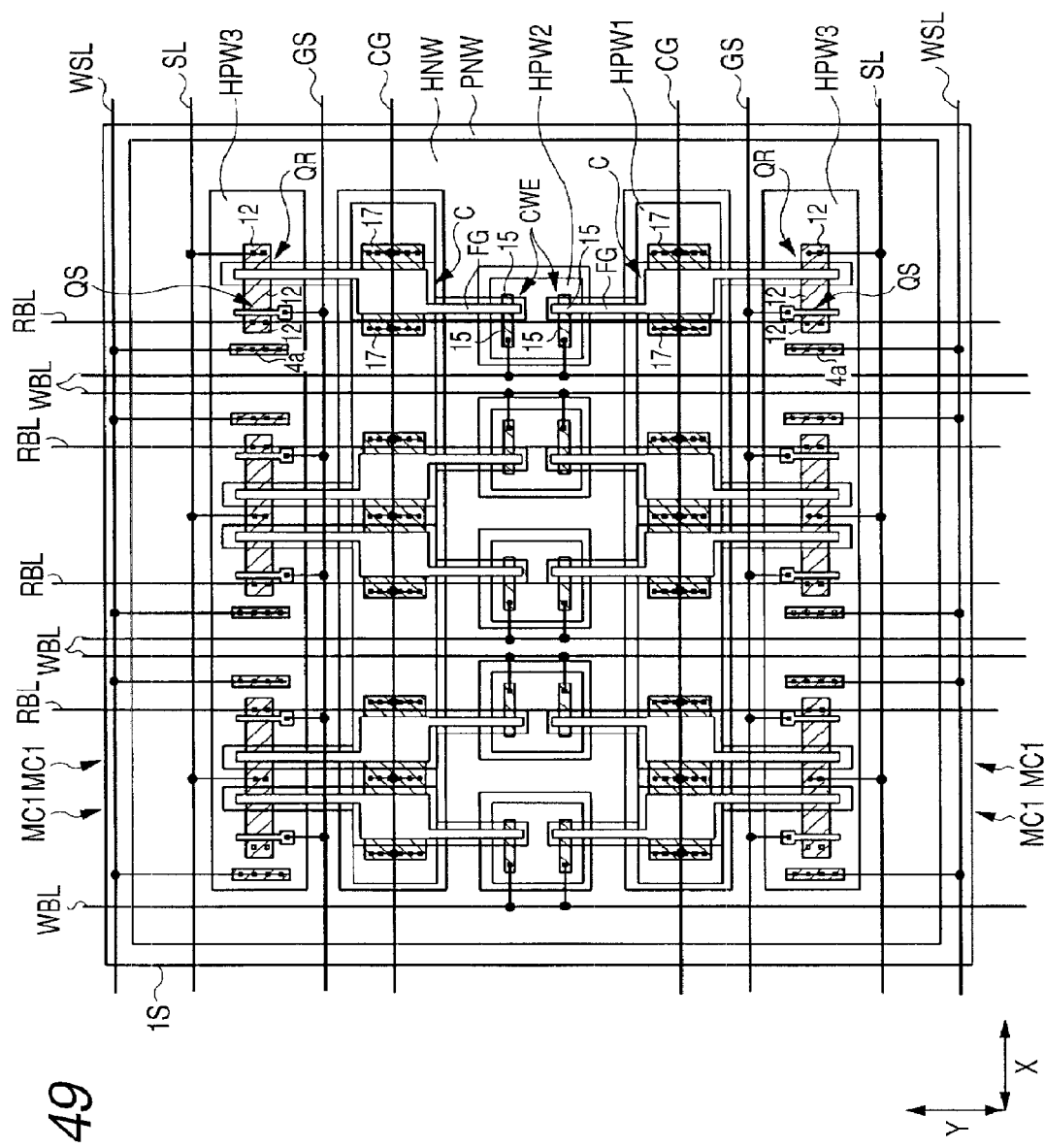
FIG. 49 is a plan view showing an arrangement of wirings in a memory cell array of FIG. 47.

FIG. 49 is a plan view showing an arrangement of wirings in the memory cell array MR of FIG. 47. Incidentally, although FIG. 49 is a plan view, parts thereof are hatched to make it easy to see the drawing.

Each of wirings (including data write/erase bit lines WBL, data read bit lines RBL, etc.) extending along the first direction Y indicates a first layer wiring. Each of wirings (including control gate wirings CG, source lines SL and selection lines GS, etc.) extending along a second direction X indicates a second layer wiring. Symbol WSL indicates a well power-feeding wire or line.

Fifth Preferred Embodiment

Figure 50:
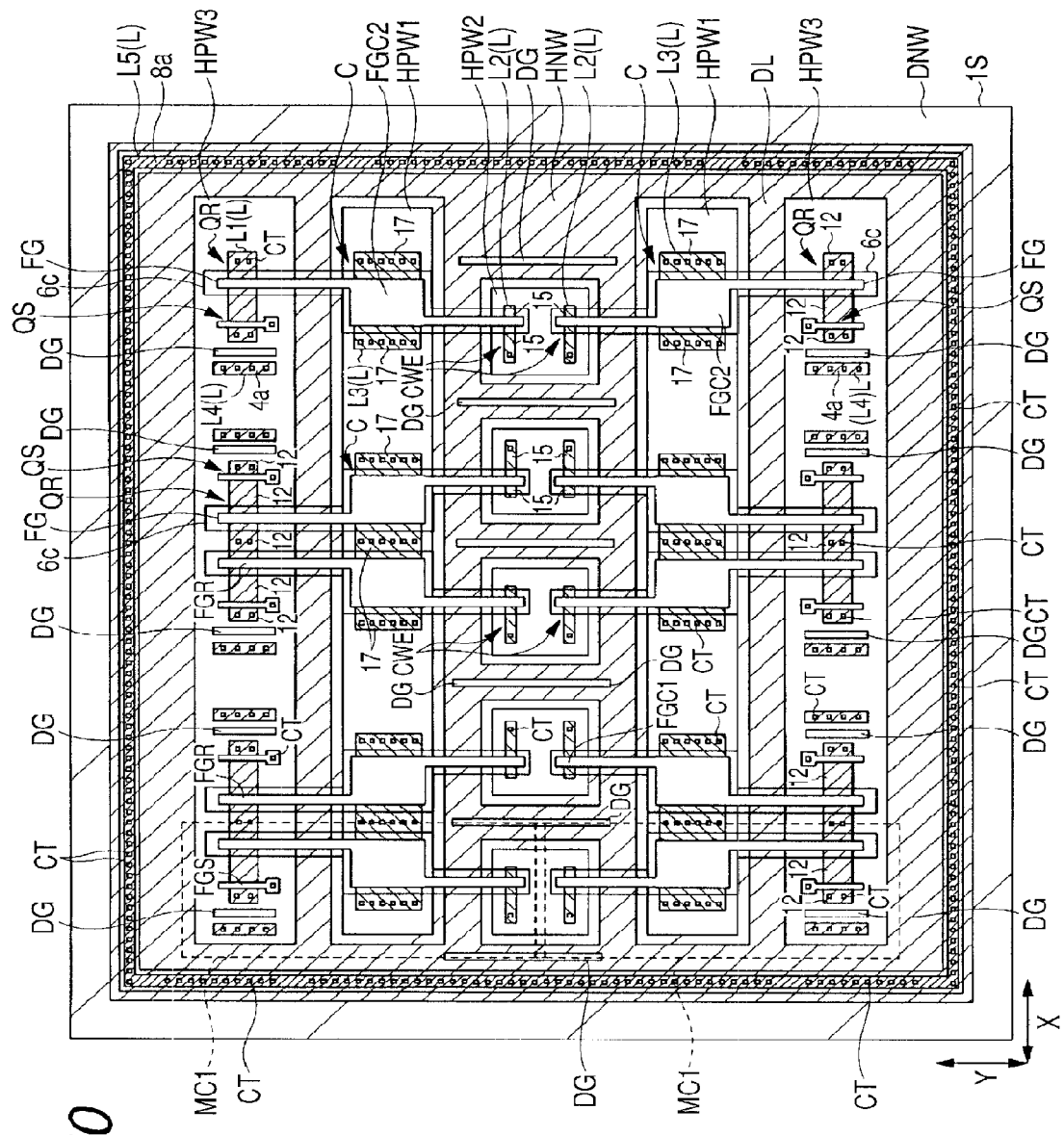
FIG. 50 is a plan view of a flash memory for a semiconductor device illustrative of a fifth embodiment of the present invention.
Figure 51:
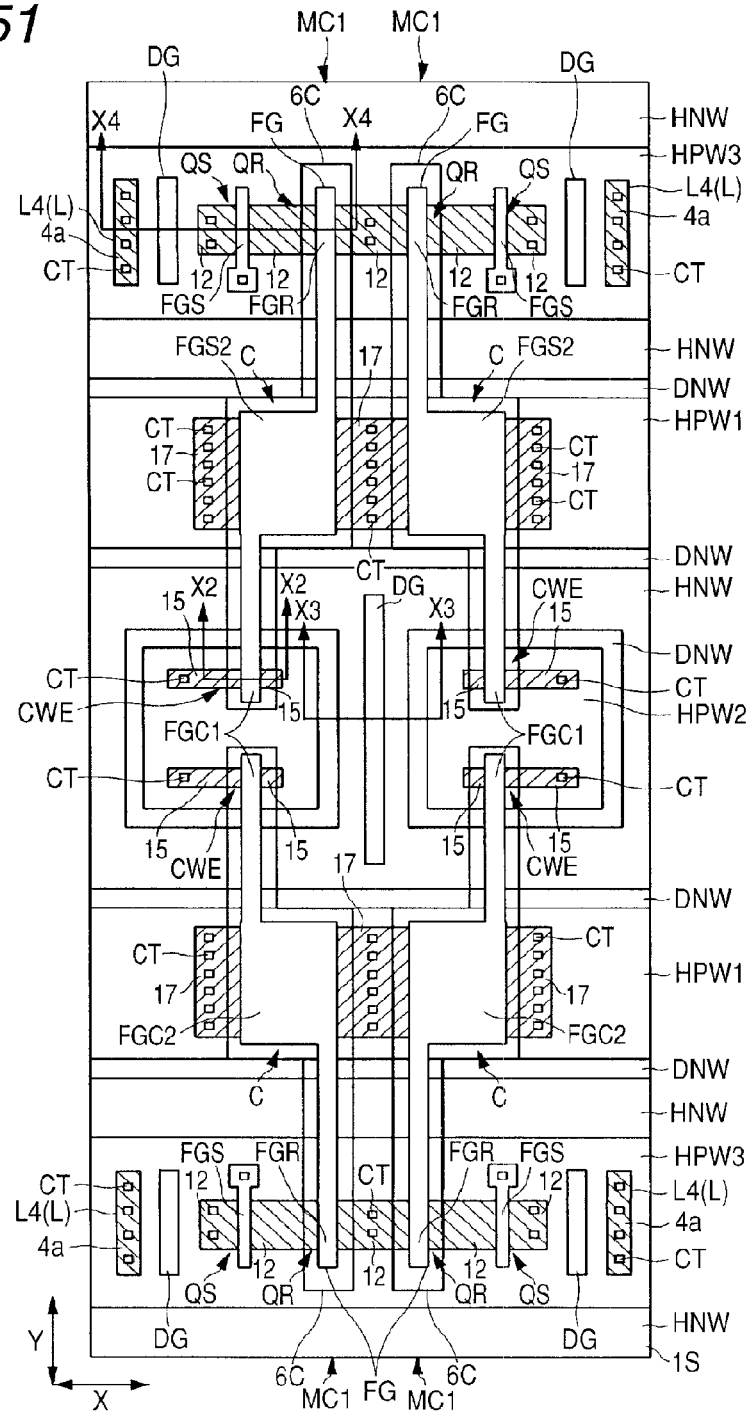
FIG. 51 is a fragmentary enlarged plan view of the flash memory shown in FIG. 50.
Figure 52:
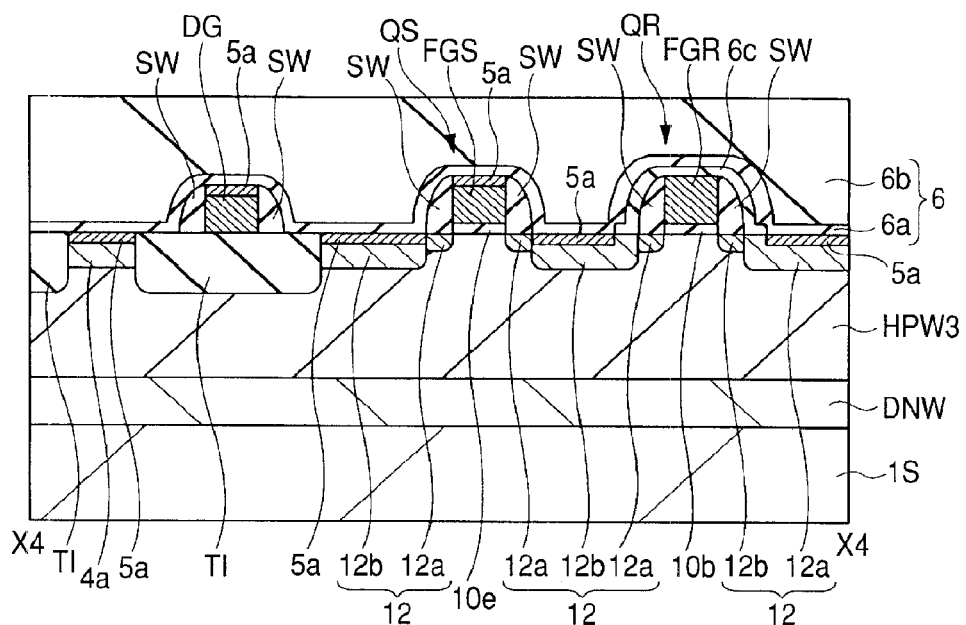
FIG. 52 is a cross-sectional view taken along line X4-X4 of FIG. 51.
Figure 53:
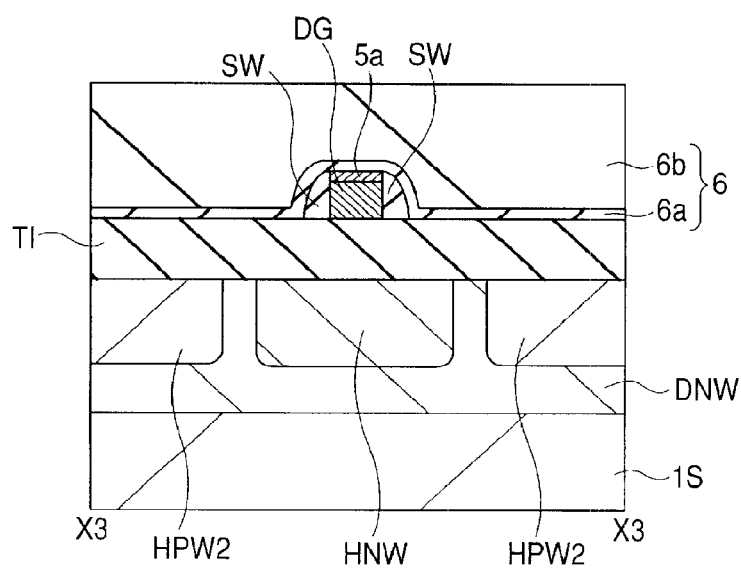
FIG. 53 is a cross-sectional view taken along line X3-X3 of FIG. 51.

FIG. 50 shows a plan view of a flash memory for a semiconductor device according to a fifth embodiment, FIG. 51 shows a fragmentary enlarged plan view of the flash memory shown in FIG. 50, FIG. 52 shows a cross-sectional view taken along line X4-X4 of FIG. 51, and FIG. 53 shows a cross-sectional view taken along line X3-X3 of FIG. 51, respectively. Incidentally, although FIGS. 50 and 51 are plan views, parts thereof are hatched to make it easy to see the drawings. A cross-sectional view taken along line X2-X2 of FIG. 51 is identical to FIG. 7.

In the fifth embodiment, dummy gates DG are disposed in their corresponding space areas (areas for forming isolation parts TI) located over a first main surface of a substrate 1S of a memory cell array MR or the like. The dummy gates DG are configured in consideration of the flatness of the upper surface of the insulating layer 6 and the layout of repetition of patterns and are patterns electrically uncoupled to other portions in particular.

Providing such dummy gates DG makes it possible to enhance the flatness of the upper surface of the insulating layer 6. Therefore, the accuracy of processing of wirings formed over the insulating layer 6 and contact holes CT defined in the insulating layer 6, for example can be enhanced.

The dummy gates DG are identical in configuration to the gate electrode FGS of each selection MIS•FETQS referred to above. A silicide layer $5a$ is formed over the upper surfaces of the dummy gates DG. Sidewalls SW are formed over their corresponding side surfaces of the dummy gates DG.

Such dummy gates DG are constituted of, for example, polycrystalline silicon and simultaneously formed upon the step of forming the floating gate electrodes FG, gate electrodes FGS and gate electrodes GLN1, GLN2, GLP1 and GLP2, etc. The silicide layers $5a$ lying over the dummy gates DG are also simultaneously formed upon a salicide step for forming the silicide layers $5a$ over the gate electrodes FGS and the like. Further, the sidewalls SW placed over the side surfaces of the dummy gates DG are also simultaneously formed upon forming the sidewalls SW over the sides surfaces of the gate electrodes FGS or the like. Thus, the number of process steps for manufacturing the semiconductor device does not increase even supposing that the dummy gates DG were provided.

Incidentally, a case in which the dummy gates DG are respectively disposed between active regions L2 and L4 and between the adjoining p-type wells HPW2 adjacent to each other as viewed in the second direction X is illustrated by way of example here. However, the present embodiment is not limited to it. The present embodiment is identical to the fourth embodiment in configuration other that it.

Sixth Preferred Embodiment

Figure 54:
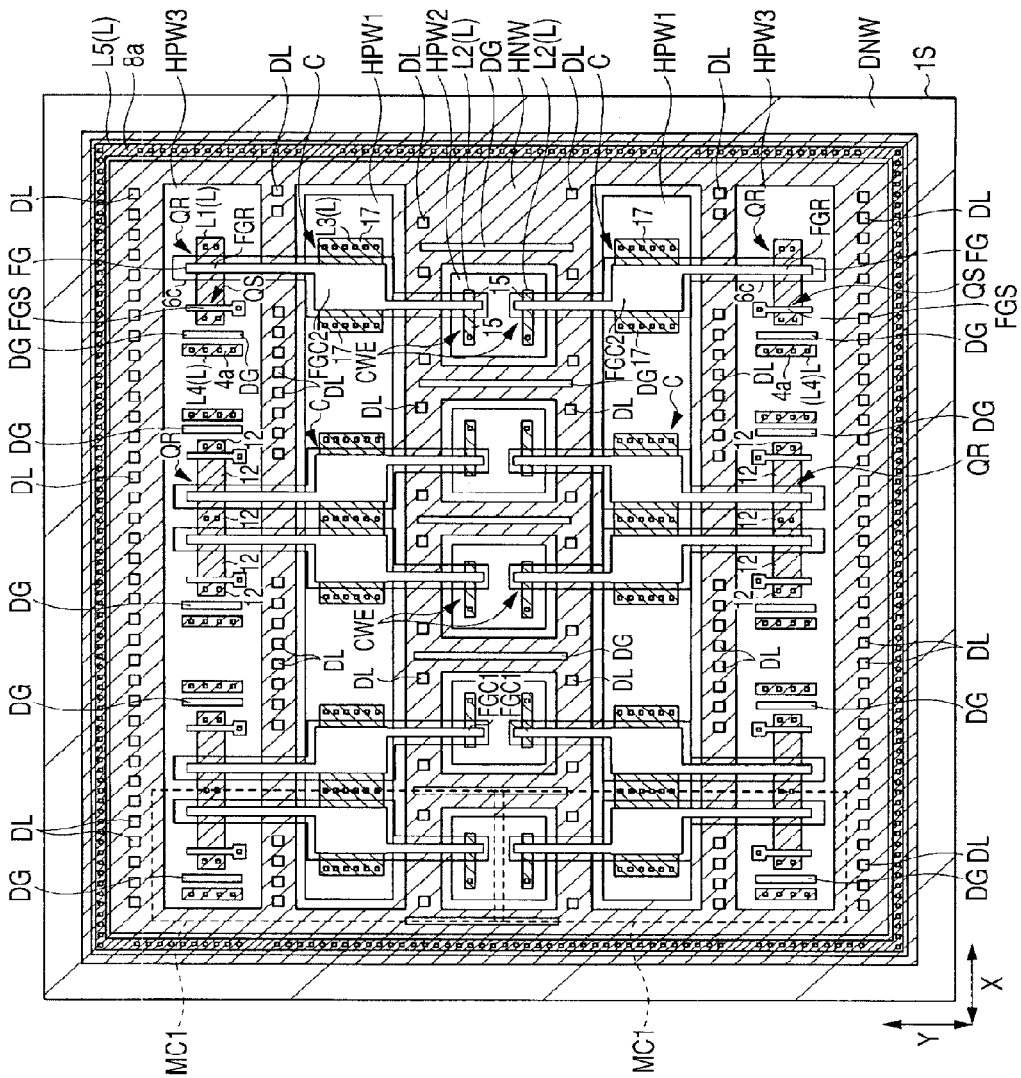
FIG. 54 is a plan view of a flash memory for a semiconductor device illustrative of a sixth embodiment of the present invention.
Figure 55:
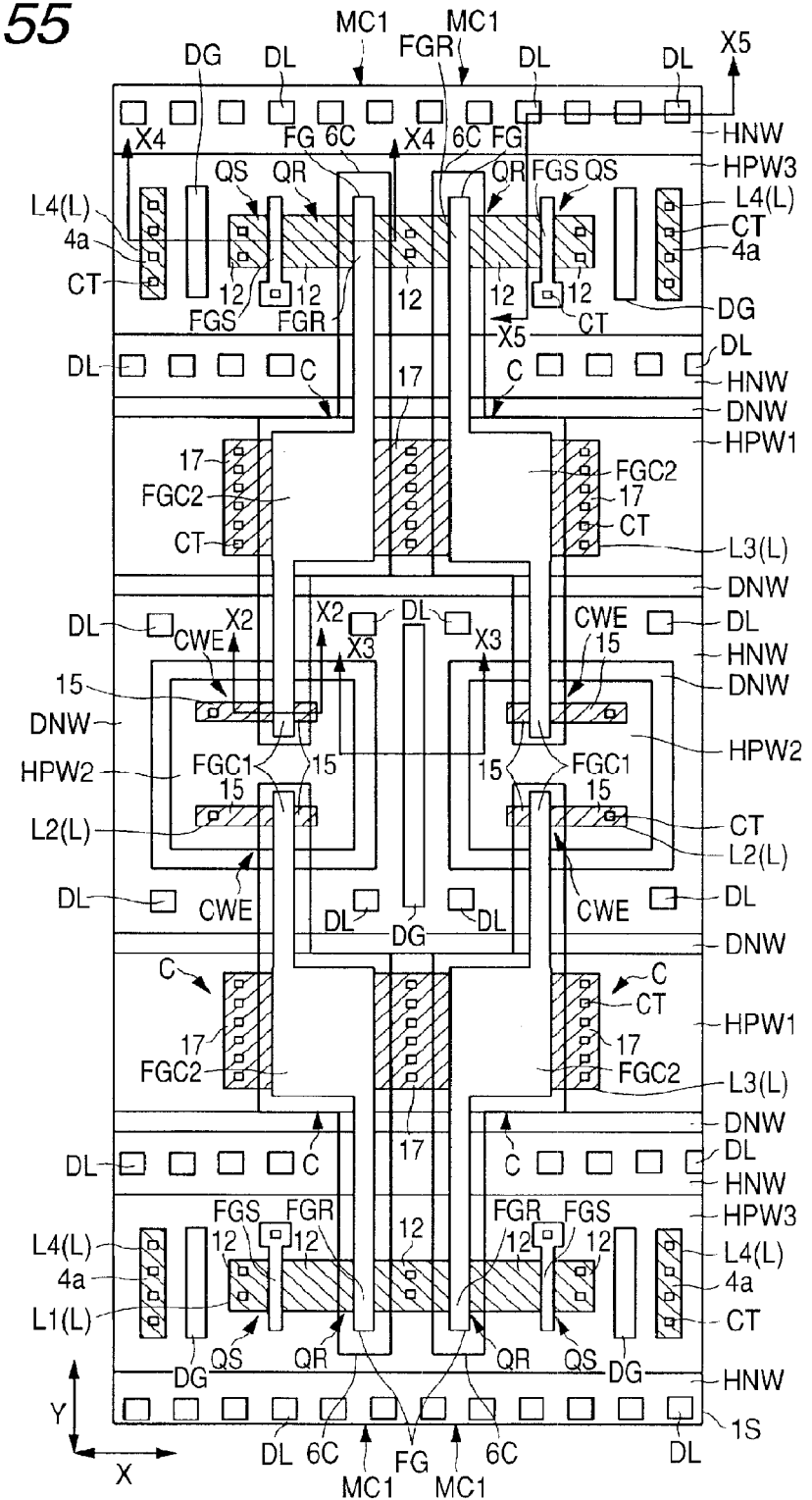
FIG. 55 is a fragmentary enlarged plan view of the flash memory shown in FIG. 54.
Figure 56:
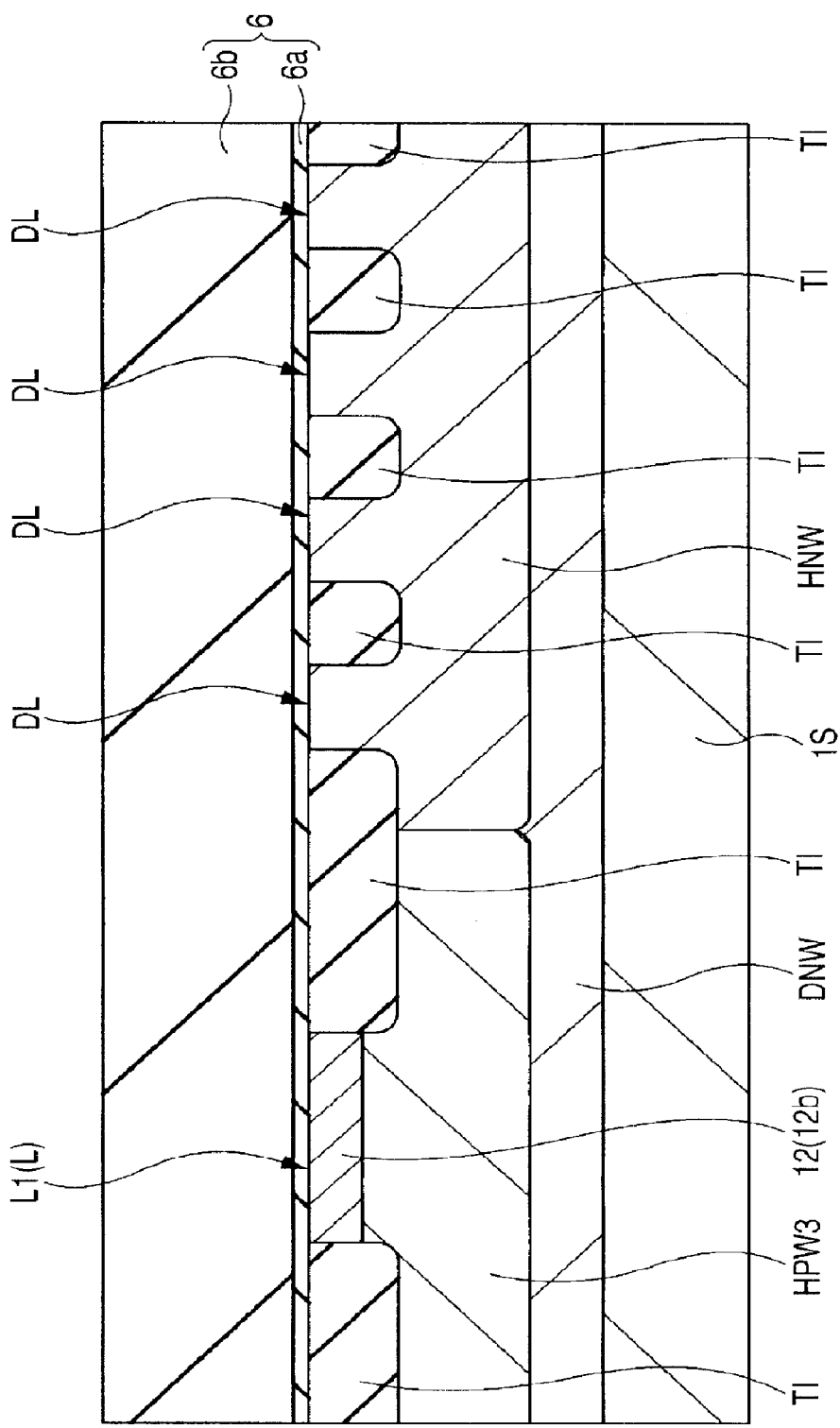
FIG. 56 is a cross-sectional view taken along line X5-X5 of FIG. 55.

FIG. 54 shows a plan view of a flash memory for a semiconductor device illustrative of a sixth embodiment, FIG. 55 shows a fragmentary enlarged plan view of the flash memory shown in FIG. 54, and FIG. 56 shows a cross-sectional view taken along line X5-X5 of FIG. 55, respectively. Incidentally, although FIGS. 54 and 55 are plan views, parts thereof are hatched to make it easy to see the drawings. Cross-sectional views taken along lines X2-X2, X3-X3 and X4-X4 of FIG. 55 are identical to those shown in FIGS. 7, 53 and 52 respectively.

In the sixth embodiment, dummy active regions DL are disposed in free or space areas (areas for forming isolation parts TI) lying over a first main surface of a substrate 1S of a memory cell array MR or the like. The dummy active regions DL are provided in consideration of flatness of the upper surface of an insulating layer 6 and are regions unformed with elements.

Providing such dummy active regions DL makes it possible to enhance the flatness of the upper surface of the insulating layer 6. Therefore, the accuracy of processing of wirings formed over the insulating layer 6 and contact holes CT defined in the insulating layer 6, for example can be enhanced.

The dummy active regions DL are identical to the active regions L. The dummy active regions DL are formed simultaneously with the active regions L. Thus, the number of process steps for manufacturing the semiconductor device does not increase even supposing that the dummy active regions DL were provided.

Incidentally, a case in which a plurality of the dummy active regions DL each shaped in the form of a square as viewed in a plane are disposed is illustrated by way of example here. However, the present embodiment is not limited to it. For instance, the plane shape of each dummy active region DL may be rectangular or made band-like. The present embodiment is identical to the fourth and fifth embodiments in configuration other that it.

Seventh Preferred Embodiment

A seventh embodiment will explain a case in which the memory cell arrays each described in the second embodiment are disposed in two stages along a first direction Y in a manner similar to the case described in the fourth embodiment. The seventh embodiment is identical to the second and fourth embodiments in configuration other that it.

Figure 57:
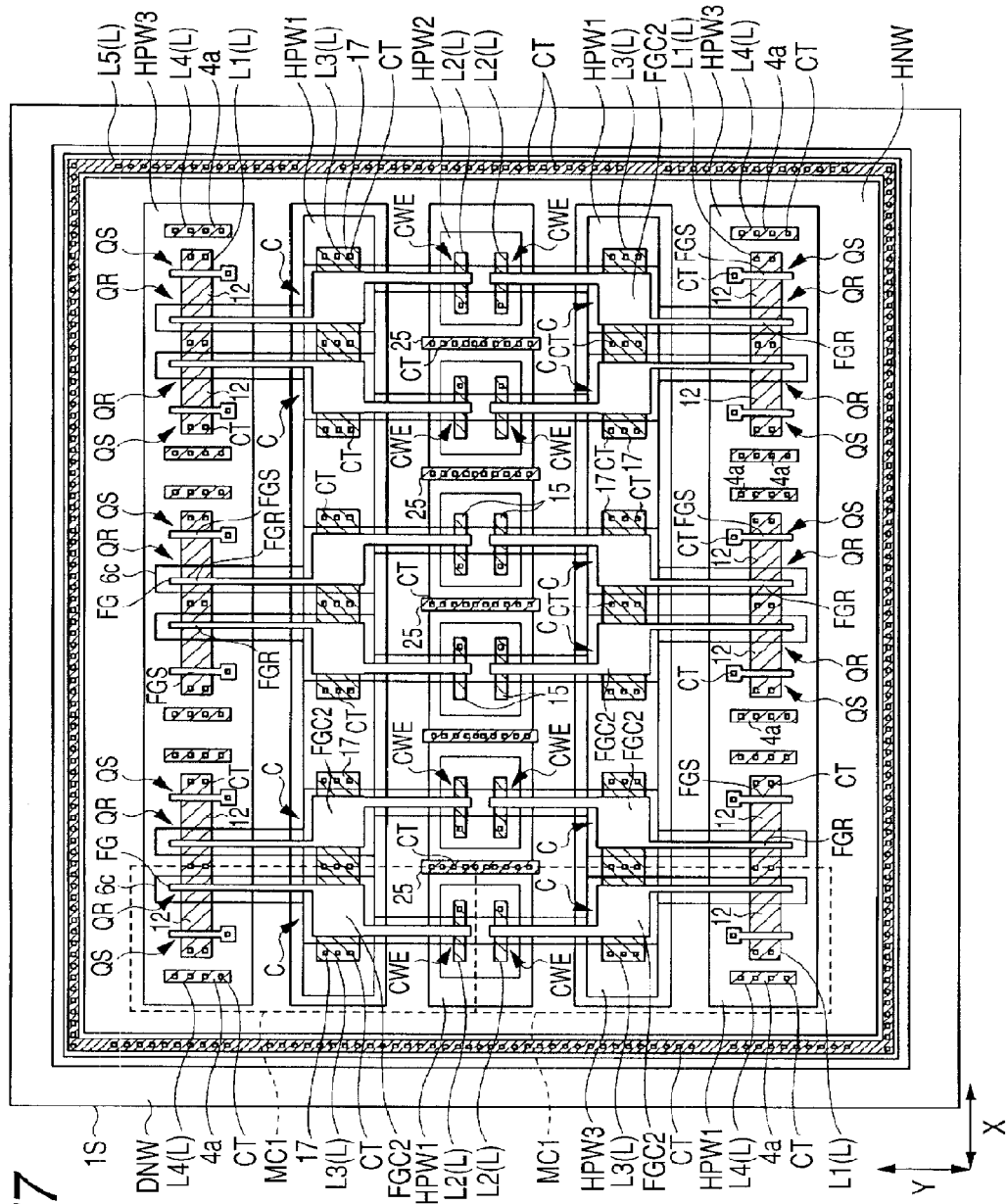
FIG. 57 is a plan view of a flash memory for a semiconductor device illustrative of a seventh embodiment of the present invention.
Figure 58:
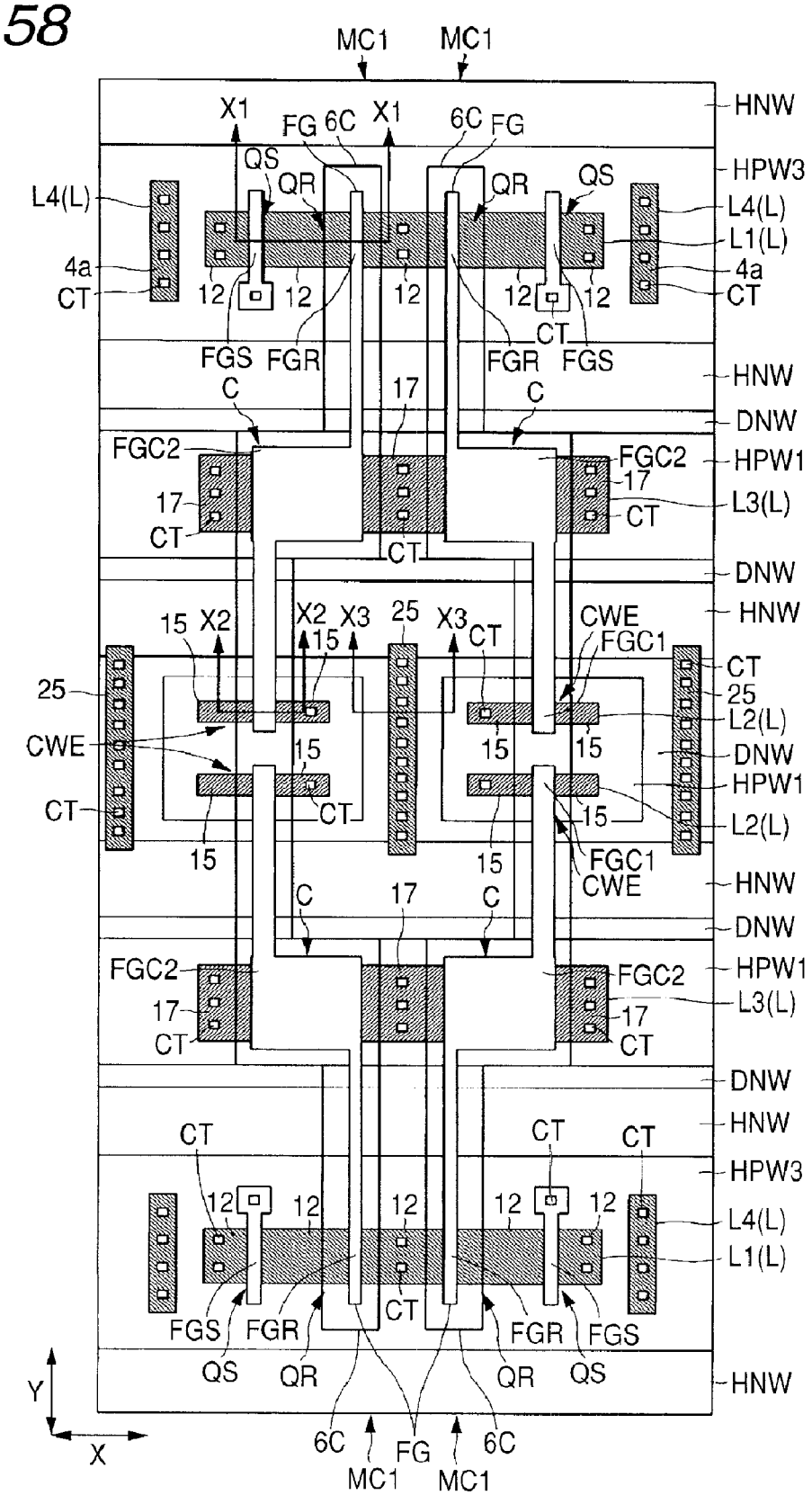
FIG. 58 is a fragmentary enlarged plan view of the flash memory shown in FIG. 57.

FIG. 57 shows a plan view of a flash memory for a semiconductor device illustrative of a seventh embodiment, and FIG. 58 shows a fragmentary enlarged plan view of the flash memory shown in FIG. 57, respectively. Incidentally, although FIGS. 57 and 58 are plan views, parts thereof are hatched to make it easy to see the drawings. Cross-sectional views taken along lines X1-X1, X2-X2 and X3-X3 of FIG. 58 are identical to those shown in FIGS. 22, 23 and 24 respectively.

In the seventh embodiment, memory cells MC1 located upward and downward (in a first direction Y) shown in FIGS. 57 and 58 are symmetrical with respect to each other (held in a mirror-inverted state) along the first direction Y in a manner similar to the fourth embodiment. Since charge injection/discharge sections CWE of the memory cells MC1 located upward and downward (in the first direction Y) can be made equal in potential in a manner similar to the fourth embodiment, a p-type well HPW2 at which the charge injection/discharge sections CWE of the upper and lower memory cells MC1 can be shared. Thus, since the adjoining space between the upper and lower memory cells MC1 can be closed up or reduced, the size in the first direction Y, of the memory cell array MR can be reduced or scaled down as compared with the case of FIG. 46 (cell height can be reduced).

In the seventh embodiment, the p-type wells HPW2 of the charge injection/discharge sections CWE adjacent to each other along a second direction X are separated from each other by an $n^+$-type semiconductor region ($n^+$-type diffusion layer) 25 formed between the adjoining p-type wells, within the memory cell array MR in a manner similar to the second embodiment. Thus, since the adjoining space between the p-type wells HPW2 and HPW2 adjacent to each other along the second direction X can be narrowed as compared with the case of the first embodiment, the size in the second direction X, of the memory cell array MR can be reduced.

Thus, in the seventh embodiment, the area of the memory cell array MR can be scaled down because both sizes in the first and second directions Y and X, of the memory cell array MR can be reduced. Further, the storage capacity of a memory can be increased.

While the invention made above by the present inventors has been described specifically on the basis of the preferred embodiments, the present invention is not limited to the embodiments referred to above. It is needless to say that various changes can be made thereto without the scope not departing from the gist thereof.

For example, the p-type wells PW may be formed within the p-type wells HPW1 and HPW2 of the capacitance sections C and the charge injection/discharge sections CWE. Thus, since the concentration of the p-type impurity at the substrate 1S's portions directly below the capacitive electrodes FGC1 and FGC2 can be made high, depletion of the substrate 1S' portions directly below the capacitive electrodes FGC1 and FGC2 can be suppressed or prevented upon data rewriting (write/erase). Therefore, the rate of rewriting of data can be made fast because the voltage applied to each of the capacitive insulating films 10c and 10d can be made high.

In this case, the p-type wells PW lying within the p-type wells HPW1 and HPW2 in the flash memory area are simultaneously formed upon forming the p-type wells PW in the forming area of each n channel type MIS•FETQLN2 at the low breakdown section in the LCD driver circuit area. Thus, the number of manufacturing process steps does not increase even supposing that the p-type wells PW were formed within the p-type wells HPW1 and HPW2.

Each of the wells for the capacitance section C, charge injection/discharge section CWE, data read MIS•FETQR and selection MIS•FETQS may be formed by the p-type semiconductor region PV of the p channel type MIS•FETQHP at the high breakdown section in the LCD driver circuit area. The p-type semiconductor regions PV for forming the wells for the capacitance section C, charge injection/discharge section CWE, data read MIS•FETQR and selection MIS•FETQS are simultaneously formed upon forming the p-type semiconductor region PV of each p channel type MIS•FETQHP at the high breakdown section in the LCD driver circuit area. Since, in this case, the lithography process (a series of processes such as resist application, exposure and development or the like, and a step for manufacturing a photomask used upon exposure) can be cut, the time required to fabricate the semiconductor device can be shortened. Further, the manufacturing cost of the semiconductor device can be reduced.

The p-type wells PW (or p-type wells HPW1 and HPW2) may be formed within the p-type semiconductor regions PV for forming the wells for the capacitance sections C and the charge injection/discharge sections CWE. Thus, since the concentration of the p-type impurity of each of the substrate 1S' portions directly below the capacitive electrodes FGC1 and FGC2 of the capacitance section C and the charge injection/discharge section CWE can be made high, the depletion of the substrate 1S' portions placed directly below the capacitive electrodes FGC1 and FGC2 at data rewriting (write/erase) can be suppressed or prevented. Therefore, since the voltage applied to each of the capacitive insulating films 10$c$ and 10$d$ can be made high, the rate of rewriting of data can be made fast.

In this case, the p-type wells PW (or p-type wells HPW1 and HPW2) lying within the p-type semiconductor regions PV of the capacitance section C and the charge injection/discharge section CWE are simultaneously formed upon forming the p-type wells PW (or p-type well HPW4 in the region for forming each n channel type MIS•FETQLN1 at the low breakdown section) in the region for forming each n channel type MIS•FETQLN2 at the low breakdown section in the LCD driver circuit area. Thus, the number of manufacturing process steps does not increase even supposing that the p-type wells PW (or p-type wells HPW1 and HPW2) were formed within the p-type semiconductor regions PV of the capacitance section C and the charge injection/discharge section CWE.

While the above description has principally been made of the case in which the invention made by the present inventors is applied to the fabrication method of the semiconductor device that belongs to the field of application reaching the background of the invention, the present invention is not limited to it. The present invention can be applied in various ways. The present invention can be applied even to, for example, a method of fabricating a micromachine. In this case, simple information about the micromachine can be stored by forming the flash memory in a semiconductor substrate formed with the micromachine.

The present invention can be applied to the manufacturing industry of a semiconductor device having a nonvolatile memory circuit section.

What is claimed is:

1. A semiconductor device having a plurality of nonvolatile memory cells, a high breakdown MISFET, and a low breakdown MISFET having a thinner gate insulating film than a gate insulating film of the high breakdown MISFET, each of the memory cells including a control gate and a floating gate formed over a semiconductor substrate, the semiconductor device comprising:

a capacitance section including first impurity regions as control gate regions formed in the semiconductor substrate and a first portion of the floating gate;

a data write/erase charge injection/discharge section including second impurity regions formed in the semiconductor substrate and a second portion of the floating gate; and a data read MISFET including third impurity regions formed in the semiconductor substrate and a third portion of the floating gate, wherein a plan area of the first portion of the floating gate is greater than respective plan areas of the second and third portions, wherein structures of the third impurity regions are same as structures of source and drain regions of the low breakdown MISFET, wherein each the source and drain regions of the low breakdown MISFET has a first region of a first conductivity type, a second region of the first conductivity type having a higher impurity concentration than the first region, and a third region of a second conductivity type opposite to the first conductivity type, and wherein the first, second and third regions are formed in a well region of the second conductivity type formed in the semiconductor substrate and having a lower impurity concentration than the third region.

2. A semiconductor device according to the claim 1,
wherein structures of the first and second impurity regions are different from structures of the third impurity regions.

3. A semiconductor device according to the claim 1,
wherein the first and second regions are of the second conductivity type.

4. A semiconductor device according to the claim 3,
wherein the first conductivity type is an n type, and wherein the second conductivity type is a p type.

5. A semiconductor device according to the claim 1, including a plurality of said data read MISFETs, each associated with a corresponding one of the memory cells,
wherein each of the memory cells further comprises a selection MISFET which is adjacent to the associated data read MISFET and which includes fourth impurity regions formed in the semiconductor substrate and a first gate electrode, and
wherein structures of the fourth impurity regions are the same as structures of source and drain regions of the low breakdown MISFET.

6. A semiconductor device according to the claim 5,
wherein structures of the first and second impurity regions are different from structures of the third and fourth impurity regions.

* * * * *